US011332861B2

(12) United States Patent
Black et al.

(10) Patent No.: US 11,332,861 B2
(45) Date of Patent: May 17, 2022

(54) METHODS FOR CHARACTERIZING NANOTUBE FORMULATIONS FOR NANOTUBE FABRICS WITH CONTROLLED SURFACE ROUGHNESS AND DEGREE OF RAFTING

(71) Applicant: ZEON Corporation, Tokyo (JP)

(72) Inventors: Jennifer Black, Woburn, MA (US); Joseph James McDermott, Watertown, MA (US); Rahul Sen, Lexington, MA (US); David A. Roberts, Woburn, MA (US); Billy Smith, Woburn, MA (US)

(73) Assignee: ZEON CORPORATION, Tokyo (JP)

( * ) Notice: Subject to any disclaimer, the term of this patent is extended or adjusted under 35 U.S.C. 154(b) by 30 days.

(21) Appl. No.: 16/413,731

(22) Filed: May 16, 2019

(65) Prior Publication Data

US 2020/0362491 A1 Nov. 19, 2020

(51) Int. Cl.
*D04H 1/42* (2012.01)
*B05D 1/00* (2006.01)
(Continued)

(52) U.S. Cl.
CPC ........... *D04H 1/4242* (2013.01); *B05D 1/005* (2013.01); *C01B 32/17* (2017.08); *C01B 32/174* (2017.08);
(Continued)

(58) Field of Classification Search
CPC ...... B05D 1/005; D04H 1/4242; B82Y 30/00; B82Y 40/00
(Continued)

(56) References Cited

U.S. PATENT DOCUMENTS 7,335,395 B2 2/2008 Ward et al.
7,365,632 B2 4/2008 Bertin et al.
(Continued)

FOREIGN PATENT DOCUMENTS

CN 102917977 A * 2/2013 ............... B05D 1/40

OTHER PUBLICATIONS

Goh et al. Surfactant dispersed multi-walled carbon nanotube/polyetherimide nanocomposite membrane. Solid State Sciences. 12 (2010) pp. 2155-2162. (Year: 2010).*
(Continued)

*Primary Examiner* — Cachet I Proctor
(74) *Attorney, Agent, or Firm* — Kenja IP Law PC

(57) ABSTRACT

Methods for characterizing a nanotube formulation with respect to one or more particular ionic species are disclosed. Within the methods of the present disclosure, this characterization provides control over the surface roughness (or smoothness) and the degree of rafting within a nanotube fabric formed from such a nanotube formulation. In one aspect, the present disclosure provides a nanotube formulation roughness curve (and methods for generating such a curve) that can be used to select a utilizable range of ionic species concentration levels that will provide a nanotube fabric with a desired surface roughness (or smoothness) and degree of rafting. In some aspects of the present disclosure, such a nanotube formulation roughness curve can be used adjust nanotube formulation prior to a nanotube formulation deposition process to provide nanotube fabrics that are relatively smooth with a low degree of rafting.

20 Claims, 48 Drawing Sheets

(51) Int. Cl.
  *B82Y 30/00*    (2011.01)
  *D04H 1/4242*   (2012.01)
  *G11C 13/02*    (2006.01)
  *C01B 32/174*   (2017.01)
  *C01B 32/17*    (2017.01)
  *B82Y 40/00*    (2011.01)

(52) U.S. Cl.
  CPC ............. *G11C 13/025* (2013.01); *B82Y 30/00* (2013.01); *B82Y 40/00* (2013.01); *D10B 2101/122* (2013.01); *D10B 2403/01* (2013.01)

(58) Field of Classification Search
  USPC ........................................................ 427/240
  See application file for complete search history.

(56) References Cited

U.S. PATENT DOCUMENTS

| | | | |
|---|---|---|---|
| 7,375,369 B2* | 5/2008 | Sen | C01B 32/17 257/40 |
| 7,666,382 B2 | 2/2010 | Ghenciu et al. | |
| 7,781,862 B2 | 8/2010 | Bertin et al. | |
| 7,927,992 B2 | 4/2011 | Ward et al. | |
| 8,217,490 B2 | 7/2012 | Bertin et al. | |
| 2007/0153353 A1* | 7/2007 | Gruner | H01L 29/0676 359/245 |
| 2010/0206811 A1* | 8/2010 | Ng | B01D 71/56 210/500.21 |
| 2013/0052449 A1* | 2/2013 | Sen | B82Y 30/00 428/221 |
| 2015/0086771 A1* | 3/2015 | Sen | D04H 1/732 428/221 |
| 2019/0292057 A1* | 9/2019 | McDermott | C01B 32/158 |

OTHER PUBLICATIONS

Aug. 4, 2020, International Search Report issued in the International Patent Application No. PCT/US2020/033031.

* cited by examiner

| Cation | | | | |
|---|---|---|---|---|
| NH₄ | TMA | TEA | Emim | |
| NH₄NO₃ | TMA NO₃ | TEA NO₃ | Emim NO₃ | NO₃ |
| NH₄HCO₃ | TMA HCO₃ | TEA HCO₃ | Emim HCO₃ | HCO₃ |
| NH₄ Ac | TMA Ac | TEA Ac | Emim Ac | Ac |
| NH₄ Fm | TMA Fm | TEA Fm | Emim Fm | Fm |
| | | | | Anion |

| Example # | CNT Formulation | Ionic Species | Ionic Species Concentration (mM) | RMS Fabric Roughness (nm) | Orientation Std. Div. | Relevant Figures |
|---|---|---|---|---|---|---|
| 1 | X | None | N/A | 1.72 | ~14° | 10A - 10B, 12A-12C |
| 2 | X | $NH_4NO_3$ | 0.75 | 2.36 | ~27° | 10A, 13A - 13C |
| 3 | X | $NH_4NO_3$ | 1.50 | 3.04 | ~25° | 10A, 14A - 14C |
| 4 | X | $NH_4NO_3$ | 7.50 | 4.10 | ~31° | 10A, 15A - 15C |
| 5 | X | TMA Fm | 0.75 | 1.95 | ~29° | 10B, 16A - 16C |
| 6 | X | TMA Fm | 1.50 | 2.22 | ~28° | 10B, 17A - 17C |
| 7 | X | TMA Fm | 7.50 | 2.61 | N/A | 10B, 18A - 18C |
| 8 | Y | None | N/A | 1.77 | ~25° | 10C - 10D, 19A - 19C |
| 9 | Y | $NH_4NO_3$ | 0.71 | 3.22 | ~28° | 10C, 20A - 20C |
| 10 | Y | $NH_4NO_3$ | 1.43 | 3.62 | ~28° | 10C, 21A - 21C |
| 11 | Y | $NH_4NO_3$ | 8.14 | 3.82 | ~28° | 10C, 22A - 22C |
| 12 | Y | TMA Fm | 0.75 | 2.33 | ~34° | 10D, 23A - 23C |
| 13 | Y | TMA Fm | 1.50 | 2.50 | ~30° | 10D, 24A - 24C |
| 14 | Y | TMA Fm | 7.50 | 2.78 | ~28° | 10D, 25A - 25C |

FIG. 9

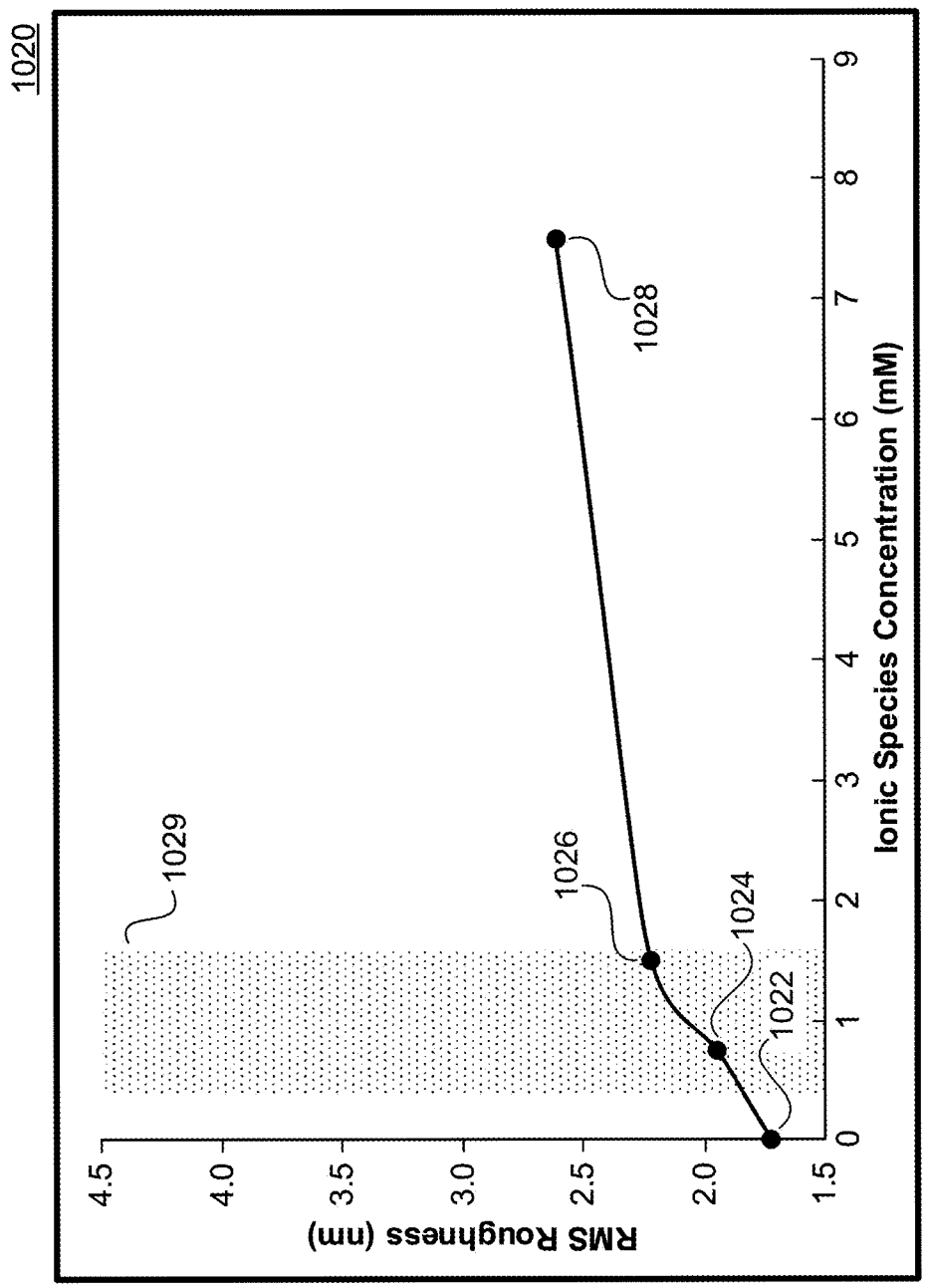

METHODS FOR CHARACTERIZING NANOTUBE FORMULATIONS FOR NANOTUBE FABRICS WITH CONTROLLED SURFACE ROUGHNESS AND DEGREE OF RAFTING

TECHNICAL FIELD

The present disclosure relates generally to nanotube fabric layers and films and, more specifically, to a method of controlling density, porosity and/or gap size within nanotube fabric layers and films.

CROSS-REFERENCE TO RELATED APPLICATIONS

This application is related to the following U.S. patents, which are assigned to the assignee of the present application, and are hereby incorporated by reference in their entirety:
  Methods of Nanotube Films and Articles (U.S. Pat. No. 6,835,591), filed Apr. 23, 2002;
  Methods of Using Pre-Formed Nanotubes to Make Carbon Nanotube Films, Layers, Fabrics, Ribbons, Elements, and Articles (U.S. Pat. No. 7,335,395), filed Jan. 13, 2003;
  Methods of Making Carbon Nanotube Films, Layers, Fabrics, Ribbons, Elements, and Articles (U.S. Pat. No. 7,566,478), filed Jan. 13, 2003;
  Devices Having Horizontally-Disposed Nanofabric Articles and Methods of Making the Same (U.S. Pat. No. 7,259,410), filed Feb. 11, 2004;
  Devices Having Vertically-Disposed Nanofabric Articles and Methods of Making Same (U.S. Pat. No. 6,924,538), filed Feb. 11, 2004;
  Spin-Coatable Liquid for Formation of High Purity Nanotube Films (U.S. Pat. No. 7,375,369), filed Jun. 3, 2004.
  High Purity Nanotube Fabrics and Films (U.S. Pat. No. 7,858,185), filed Jun. 3, 2004;
  Resistive Elements Using Carbon Nanotubes (U.S. Pat. No. 7,365,632), filed Sep. 20, 2005;
  Two-Terminal Nanotube Devices and Systems and Methods of Making Same (U.S. Pat. No. 7,781,862), filed Nov. 15, 2005;
  Aqueous Carbon Nanotube Applicator Liquids and Methods for Producing Applicator Liquids Thereof (U.S. Pat. No. 7,666,382), filed Dec. 15, 2005;
  Nonvolatile Nanotube Diodes and Nonvolatile Nanotube Blocks and Systems using Same and Methods of Making Same (U.S. Pat. No. 8,217,490), filed Aug. 8, 2007;
  Carbon Nanotubes for the Selective Transfer of Heat from Electronics (U.S. Pat. No. 7,927,992), filed Mar. 6, 2008;
  Anisotropic Nanotube Fabric Layers and Films and Methods of Forming Same (U.S. Pat. No. 8,937,575), filed Jul. 31, 2009;
  Nanotube Solution Treated with Molecular Additive, Nanotube Film Having Enhanced Adhesion Property, and Methods for Forming the Nanotube Solution and the Nanotube Film (U.S. Pat. No. 9,634,251), filed Mar. 9, 2009;
  Methods for Controlling Density, Porosity, and/or Gap Size within Nanotube Fabric Layers and Films (U.S. Pat. No. 9,617,151), filed Oct. 31, 2012;
  Nanotube Solutions With High Concentration And Low Contamination And Methods For Purifying Nanotube Solutions (U.S. Pat. No. 10,069,072), filed May 31, 2013; and
  Low Defect Nanotube Application Solutions and Fabrics and Methods for Making Same (U.S. Pat. No. 9,650,732), filed Apr. 30, 2014.

This application is related to the following patent application, which is assigned to the assignee of the application, and are hereby incorporated by reference in their entirety:
  Scalable Nanotube Fabrics and Methods for Making Same (U.S. patent application Ser. No. 14/033,158, now published as US2015-0086771), filed Sep. 20, 2013.

BACKGROUND

Any discussion of the related art throughout this specification should in no way be considered as an admission that such art is widely known or forms part of the common general knowledge in the field.

Nanotube fabric layers and films are used in a plurality of electronic structures, and devices. For example, U.S. Pat. No. 8,217,490 to Bertin et al., incorporated herein by reference in its entirety, teaches methods of using nanotube fabric layers to realize nonvolatile devices such as, but not limited to, block switches, programmable resistive elements, and programmable logic devices. U.S. Pat. No. 7,365,632 to Bertin et al., incorporated herein by reference, teaches the use of such fabric layers and films within the fabrication of thin film nanotube based resistors. U.S. Pat. No. 7,927,992 to Ward et al., incorporated herein by reference in its entirety, teaches the use of such nanotube fabrics and films to form heat transfer elements within electronic devices and systems.

Through a variety of previously known techniques (described in more detail within the incorporated references) nanotube elements can be rendered conducting, non-conducting, or semi-conducting before or after the formation of a nanotube fabric layer or film, allowing such nanotube fabric layers and films to serve a plurality of functions within an electronic device or system. Further, in some cases the electrical conductivity of a nanotube fabric layer or film can be adjusted between two or more non-volatile states as taught in U.S. Pat. No. 7,781,862 to Bertin et al., incorporated herein by reference in its entirety, allowing for such nanotube fabric layers and films to be used as memory or logic elements within an electronic system.

U.S. Pat. No. 7,335,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotube are suspended within an aerosol solution which is then dispersed over a substrate), and dip coating (wherein a plurality of nanotubes are suspended in a solution and a substrate element is lowered into the solution and then removed). Further, U.S. Pat. No. 7,375,369 to Sen et al., incorporated herein by reference in its entirety, and U.S. Pat. No. 7,666,382 to Ghenciu et al., incorporated herein by reference in its entirety, teach nanotube solutions well suited for forming a nanotube fabric layer over a substrate element via a spin coating process.

SUMMARY OF THE DISCLOSURE

The current disclosure relates to nanotube formulations and methods for characterizing a nanotube formulation with respect to one or more ionic species to provide a ionic species concentration level range (utilization range) indicative of a desired surface roughness and/or degree of rafting within a nanotube fabric formed from a nanotube formulation.

In particular, the present disclosure provides a method for characterizing a nanotube formulation. The method first comprises preparing a nanotube formulation, the nanotube formulation having at least one preselected parameter. The method next comprises selecting at least one ionic species and a plurality of test concentration levels for the at least one selected ionic species. The method next comprises generating a plurality of nanotube application solutions from the nanotube formulation, the nanotube application solutions including the at least one preselected parameter. The method next comprises adjusting the plurality of nanotube application solutions to form a plurality of adjusted nanotube application solutions, wherein each of the adjusted nanotube application solutions includes the selected ionic species at one of the test concentrations levels. The method next comprises depositing the plurality of adjusted nanotube application solutions to form a plurality of nanotube fabrics, each of the nanotube fabrics associated with one of the plurality of test concentration levels. The method next comprises measuring at least one of the surface roughness and the degree of rafting within each of the plurality of nanotube fabrics to realize at least one test measurement for each of the test concentration levels. The method next comprises using the test measurements and the test concentration levels to realize a nanotube formulation roughness curve.

According to one aspect of the present disclosure, the method further comprises defining a utilization range of concentration levels for the at least one selected ionic species.

Under another aspect of the present disclosure, a utilization range corresponds to at least one of a desired surface roughness and a desired degree of rafting formed with the characterized nanotube formulation.

Under another aspect of the present disclosure, the at least one preselected parameter includes at least one of nanotube length, nanotube length distribution, degree of nanotube straightness, nanotube wall type, nanotube chirality, and nanotube functionalization.

Under another aspect of the present disclosure, the at least one ionic species is one of ammonium salts, nitrate salts, ammonium nitrate salts, ammonium formate, ammonium acetate, ammonium carbonate, ammonium bicarbonate, ionic organic species, ionic polymers, and inorganic salts.

Under another aspect of the present disclosure, the at least one ionic species includes a cation component selected from the list consisting of ammonium, tetraalkylammoniums, acids of primary aliphatic amines, acids of secondary aliphatic amines, acids of tertiary aliphatic amines, acids of cyclic amines, cyclic aromatic quaternary amines, and phosphorus-based ions.

Under another aspect of the present disclosure, the at least one ionic species includes an anion component selected from the list consisting of soluble organic acid bases, simple soluble aliphatic carboxylic acids, complex organic acids, nitrate, and phosphate.

Other features and advantages of the present invention will become apparent from the following description of the invention which is provided below in relation to the accompanying drawings.

BRIEF DESCRIPTION OF THE DRAWINGS

FIG. 5 is a table of cations and anions which can be used to form a plurality of ionic species well-suited for use with the methods of the present disclosure.

FIG. 9 is a table summarizing the data and results presented in examples 1-14.

FIG. 10B is a nanotube formulation roughness curve according to the methods of the present disclosure corresponding to nanotube formulation "X" (as defined within the present disclosure) used with tetramethyl ammonium formate (TMA Fm) as an ionic species.

DETAILED DESCRIPTION

Figure 1A:
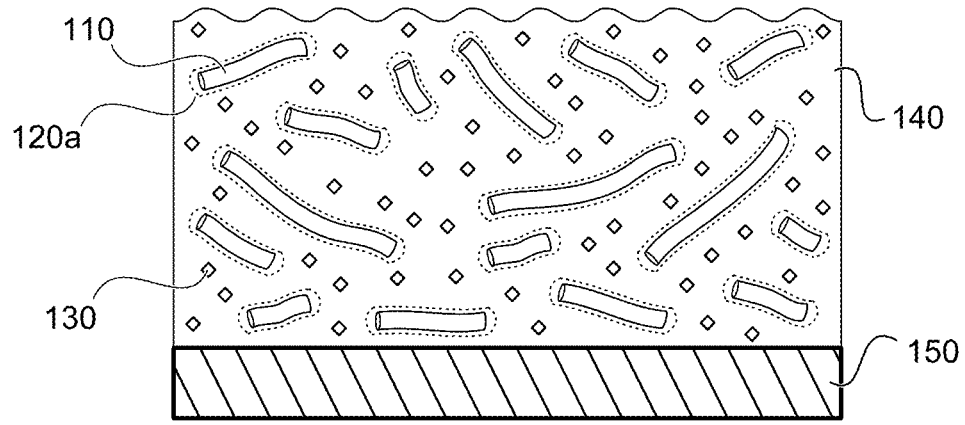
FIG. 1A is a diagram illustrating three steps within a nanotube deposition process using a nanotube formulation with a relatively high ionic species concentration level.
Figure 1A:
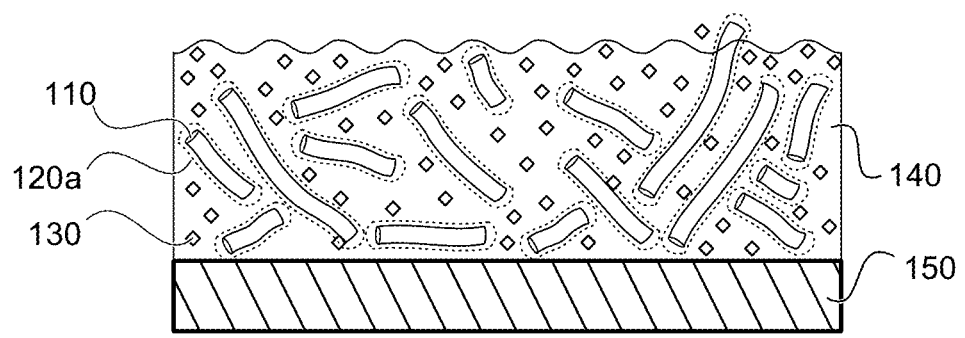
Figure 1A:
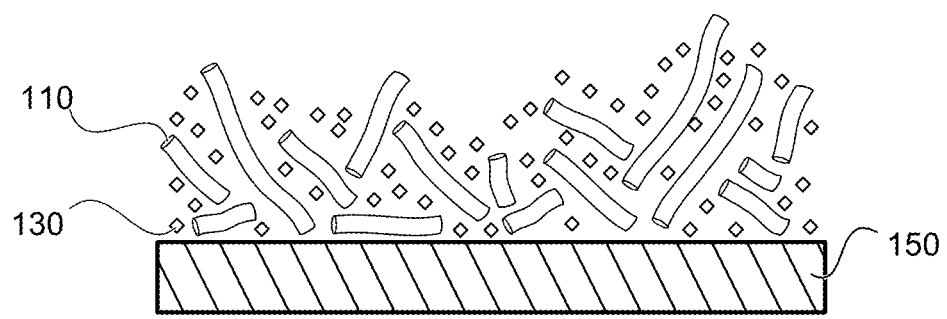

The present disclosure teaches methods for characterizing a nanotube formulation such as to provide control over at least one of the surface roughness (or smoothness) and degree of rafting within a nanotube fabric formed from that nanotube formulation. According to the methods of the present disclosure, fabric roughness—that is the planarity of the surface of a nanotube fabric—can be controlled or selected for by using preselected concentrations of a particular ionic species within a specific nanotube formulation used to form that nanotube fabric. As will be discussed in more detail below, highly rafted fabrics, in general, will tend to be smoother than fabrics with a very low degree or essentially no rafting. However, in certain applications, a highly rafted fabric can be undesirable. For example, highly rafted nanotube fabrics will tend to have higher switching voltages (that is, the voltage required to adjust the resistivity of a nanotube fabric from a first state to a second state). Highly rafted fabrics will also tend to be denser than fabrics with a low degree of rafting, requiring more individual nanotube elements for a given volume of fabric. As certain applications—for example, but not limited to, certain types of two-terminal nanotube switching elements—require smooth nanotube fabrics with a low degree of rafting, the present disclosure provides methods for characterizing a nanotube formulation for a given ionic species. According to the methods of the present disclosure, this characterization, in certain applications, provides a nanotube formulation roughness curve, which plots the expected roughness of a nanotube fabric formed with a given nanotube formulation against the concentration level of a given ionic species. As will be discussed in detail below with respect to FIG. 6 and illustrated within examples 1-14, such a nanotube formulation roughness curve can be used to select a utilization range of a specific ionic species concentration for a given nanotube formulation that will provide, for example, a relatively smooth nanotube fabric with a low degree of rafting. Methods and parameters for measuring and quantifying both the degree of rafting within a nanotube fabric and the degree of surface roughness (or smoothness) within a nanotube fabric will also be discussed below.

Within certain applications, the surface roughness of a nanotube fabric and the degree of rafting within a nanotube fabric can have an effect on the electrical and physical properties of the nanotube fabric or within a device employing the nanotube fabric. For example, within two terminal nanotube switching devices (discussed in detail within the incorporated references), the degree of rafting within the nanotube fabric used within a device can influence the switching voltage, resistance, and adjustable resistance range of that device. Further, the surface roughness of a nanotube fabric used within two terminal nanotube switching devices can also impact the uniformity of the distance between the top and bottom electrodes, which can, in certain embodiments, affect how the devices function and potentially limit the scalability of the devices. The surface roughness of a nanotube fabric can also significantly impact how other material layers applied over the nanotube fabric form, creating differences in both electrical and physical characteristics of devices using these nanotube fabrics. To this end, the methods of the present disclosure can, in certain aspects, be used to form engineered nanotube fabrics wherein the surface roughness as well as the degree of rafting can be reliably controlled by first characterizing a nanotube formulation and then using that characterization to adjust the nanotube formulation such that, when deposited, it forms a nanotube fabric with the a desired surface roughness and degree of rafting, as required by the needs of a particular application.

Within the present disclosure, the term "nanotube formulation" is used to describe nanotube application solutions—that is a plurality of nanotube elements suspended within a liquid medium capable of being deposited to form a nanotube fabric—with a selected set of parameters. Such parameters can include, but are not limited to, the type of nanotube or nanotubes used within the application solution, the nanotube wall type (e.g., single walled, double walled, or multiwalled), the type and degree of functionalization (or lack thereof) of the nanotube elements, the lengths and length distribution of the nanotube elements, the degree to which the nanotube elements are straight or kinked, the density of the nanotube elements within solution, the purity of the application solution (e.g., level of metallic impurities), the chirality of the nanotube elements, and the liquid medium used. As will be discussed in detail below according to the methods of the present disclosure, nanotube fabrics formed from two different nanotube formulations can exhibit different degrees of rafting and roughness for a given concentration of ionic species. That is to say, a given concentration of a specific ionic species in a first exemplary nanotube formulation may produce a smooth fabric with a significant degree of rafting while the same concentration of that ionic species in a second exemplary nanotube formulation (with different parameters than the first) may produce a rough fabric with a very low degree of rafting. As such, the present disclosure provides methods for determining a utilizable range for a selected ionic species within a particular nanotube formulation, with this utilizable range corresponding to a desired roughness/smoothness parameter range and degree of rafting range within a nanotube fabric as fits the needs of a selected application. It should be noted that such ranges are selected as best fits the needs of a particular application in which a nanotube fabric is used. For example, some applications might require a very rough fabric with a very low degree of rafting, while other application might require a relatively smooth fabric with a low degree of rafting. The present disclosure further provides methods for adjusting the concentration levels of an ionic species within a nanotube formulation into this utilizable range prior to forming a nanotube fabric such as to realize the desired properties within the fabric with respect to smoothness/roughness and the degree of rafting.

A fabric of nanotubes as referred to herein for the present disclosure includes a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity may be found on a larger scale, with regions of ordered nanotubes, in some cases, extended over substantially the entire fabric layer. Such larger scale positional regularity is of particular interest to the present disclosure.

The fabrics of nanotubes retain desirable physical properties of the nanotubes from which they are formed. For example, in some electrical applications, the fabric preferably has a sufficient amount of nanotubes in contact so that at least one ohmic (metallic) or semiconductive pathway exists from a given point within the fabric to another point within the fabric. Single walled nanotubes may typically have a diameter of about 1-3 nm, and multi walled nanotubes may typically have a diameter of about 3-30 nm. Nanotubes may have lengths ranging from about 0.2 microns to about 200 microns, for example. The nanotubes may curve and occasionally cross one another. Gaps in the fabric, i.e., between nanotubes either laterally or vertically, may exist. Such fabrics may include single-walled nanotubes, multi-walled nanotubes, or both.

The fabric may have small areas of discontinuity with no tubes present. The fabric may be prepared as a layer or as multiple fabric layers, one formed over another. The thickness of the fabric can be chosen as thin as substantially a monolayer of nanotubes or can be chosen much thicker, e.g., tens of nanometers to hundreds of microns in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example.

Other methods for generating such fabrics may involve using spin-coating techniques and spray-coating techniques with preformed nanotubes suspended in a suitable solvent, silk screen printing, gravure printing, and electrostatic spray coating. Nanoparticles of other materials can be mixed with suspensions of nanotubes in such solvents and deposited by spin coating and spray coating to form fabrics with nanoparticles dispersed among the nanotubes.

As described within U.S. Pat. No. 7,375,369 to Sen et al. and U.S. Pat. No. 7,666,382 to Ghenciu et al., both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element. In other cases, CVD growth of nanotubes on a material surface may be used to realize an unordered nanotube fabric layer.

Further, U.S. Pat. No. 9,617,151 to Sen et al., incorporated herein by reference in its entirety, teaches methods of adjusting certain parameters (for example, the nanotube density or the concentrations of certain ionic species) within nanotube application solutions to either promote or discourage rafting—that is, the tendency for nanotube elements to group together along their sidewalls and form dense, raft-like structures—within a nanotube fabric layer formed with such a solution. By increasing the incidence of rafting within nanotube fabric layers, the density of such fabric layers can be increased, reducing both the number and size of voids and gaps within such fabric layers.

It should be noted that nanotube elements used and referenced within the embodiments of the present disclosure may be single-walled nanotubes, multi-walled nanotubes, or mixtures thereof and may be of varying lengths. Further, the nanotubes may be conductive, semiconductive, or combinations thereof. Further, the nanotubes may be functionalized (for example, by oxidation with nitric acid resulting in alcohol, aldehydic, ketonic, or carboxylic moieties attached to the nanotubes), or they may be non-functionalized.

It should be noted that the methods of the present disclosure are well suited for arranging functionalized nanotube elements within a nanotube fabric layer. Nanotube elements may be functionalized for a plurality of reasons. For example, certain moieties may be formed on the sidewalls of nanotube elements to add in the dispersion of those elements within an application solution. In another example, certain moieties formed on the sidewalls of nanotube elements can aid in the efficient formation of a nanotube fabric. In a further example, nanotube elements can be functionalized with certain moieties such as to electrically insulate the sidewalls of the nanotube elements. Nanotube elements can be functionalized by attaching organic, silica, or metallic moieties (or some combination thereof) to the sidewalls of the nanotube elements. Such moieties can interact with nanotube elements covalently or remain affixed through $\pi$-$\pi$ bonding.

Carbon nanotube (CNT) raw materials normally come in dry powder form. In order to integrate the manufacturing of nanotube devices with existing semiconductor facilities, it is often necessary to prepare a spin- or spray-coatable nanotube solution or dispersion before use. Accordingly, the nanotube powder has to be suspended, dispersed, solvated, or mixed in a liquid medium or solvent, so as to form a nanotube solution or dispersion. In some cases, this liquid medium could be water (including, but not limited to, distilled water or deionized water). In other cases, this liquid medium could be a non-aqueous solvent. The nanotube solution formed directly from CNT raw materials may be referred to as a "pristine" nanotube solution. In this disclosure, the term "nanotube solution," "nanotube suspension," and "nanotube dispersion" may be used interchangeably to refer to the same thing. The nanotube solution may be an aqueous or non-aqueous solution, and the solvent may be water or an organic/inorganic liquid. In one embodiment, the nanotube solution is an aqueous solution and the solvent is water.

To fabricate memory and/or logic devices in an industrial scale, there is a need to develop a CMOS-grade formulation of nanotube dispersions. The CMOS-grade formulation may require that the nanotube dispersions be of ultra-high purity, that is, substantially free from surfactants, trace metals, and/or other additives. In some cases, substantially free may refer to a concentration of less than or equal to 1 part-per-billion (ppb). Accordingly, extensive purification processes may be performed to the nanotube solution. In some embodiments, the purification processes may include one or more of a cross-flow filtration (CFF) process, a vacuum filtration process, sonication, centrifugation, treatments of certain chemicals, and/or any combinations thereof. Exemplary methods for purifying nanotube solutions have been disclosed in U.S. Pat. No. 10,069,072 to Roberts et al., the contents of which are incorporated herein by reference in their entirety.

Figure 1B:
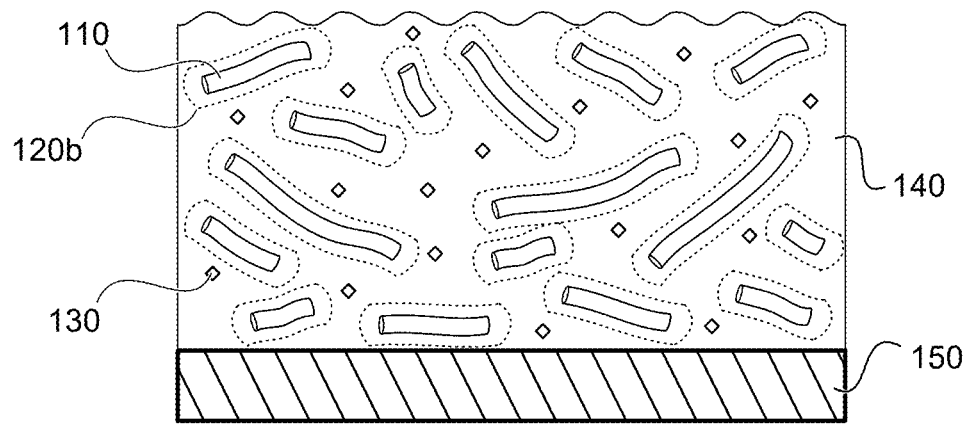
FIG. 1B is a diagram illustrating three steps within a nanotube deposition process using a nanotube formulation with a relatively low ionic species concentration level.
Figure 1B:
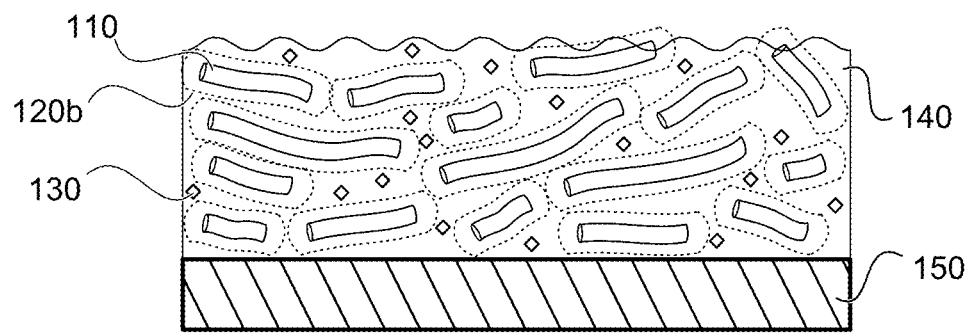
Figure 1B:
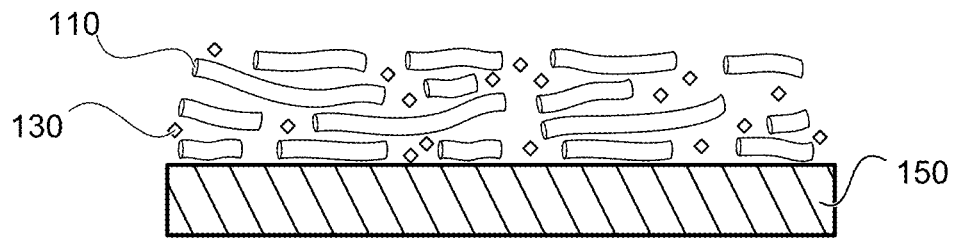

FIGS. 1A and 1B each illustrate three steps in an exemplary nanotube fabric deposition operation (101-103 and 104-106, respectively) wherein an exemplary nanotube formulation is being deposited over a material layer 150 to form a nanotube fabric. Within both exemplary operations of FIGS. 1A and 1B, the nanotube formulation being deposited includes nanotube elements 110 and ionic species elements 130 suspended in liquid medium 140. It should be noted that the nanotube formulation used in the exemplary operation of FIG. 1A is intended to be the same nanotube formulation used in exemplary operation of FIG. 1B, however the nanotube formulation within the exemplary operation of FIG. 1A has been adjusted to have a significantly higher concentration level of ionic species elements 130 as compared with the concentration level of ionic species elements 130 in the nanotube formulation within the exemplary operation of FIG. 1B.

It should be noted that exemplary nanotube deposition operations detailed in FIGS. 1A and 1B are intended as simplified functional examples used to illustrate the methods of the present disclosure. For clarity, the relative shapes, sizes, positions, and quantities of nanotube elements 110 and ionic species elements 130 have been greatly simplified for ease of explanation purposes. That is, operations detailed in FIGS. 1A and 1B are intended only to be used to illustrate a relevant mechanism of nanotube fabric formation with respect to ionic species concentration levels within a nanotube formulation. As such, no realistic values for nanotube size or type, actual concentration levels of either nanotube elements or ionic species, or the type of ionic species is intended or should be inferred.

Looking now to first process step 101 of FIG. 1A, a nanotube formulation has been deposited over material layer 150. This deposition process could be a spin coating operation, for example, as described above with respect to U.S. Pat. No. 7,335,395, but the methods of the present disclosure are not limited in this regard. After initial deposition of the nanotube formulation, a significant volume of liquid medium 140 remains present such that nanotube elements 110 remain suspended in solution with freedom to move with respect to each other.

Each nanotube element 110 within process steps 101-103 is surrounded by a dashed line 120a, which indicates the repulsion distance of each nanotube element 110 with respect to other nanotube elements within the nanotube formulation. According to the methods of the present disclosure, within certain applications the concentration level of an ionic species (represented in FIGS. 1A and 1B as ionic species elements 130) within a nanotube formulation directly affects this repulsion distance 120a in FIG. 1A, as well as repulsion distance 120b as detailed in FIG. 1B (discussed further below). Functional groups on the nanotube elements provide an electrostatic repulsion force, which can, in certain applications, keep nanotube elements within solution from coming close together. Without wishing to be bound by theory, the present disclosure submits that, in certain applications, a relatively high concentration level of an ionic species within a nanotube formulation will tend to significantly limit repulsion distance 120a around nanotube elements 110. Within such applications, ionic species within the solution will screen the functional groups on the nanotube elements from each other, significantly limiting the effective repulsion distance (represented by dashed lines 120a and 120b). Similarly, as detailed in process steps 104-106 of FIG. 1B, a relatively low concentration level of ionic species within a nanotube formulation will tend to result in a relatively large repulsion distance 120b around nanotube elements 110. As will be described in detail below, the methods of the present disclosure manage this repulsion distance (120a and 120b, in FIGS. 1A and 1B, respectively) by adjusting the concentration level of ionic species in a nanotube formulation into an utilizable range, to realize nanotube fabrics with a desired surface roughness and a desired degree of rafting. Further, it should be noted that in certain applications the type of ionic species used within a nanotube formulation as well as the way an ionic species crystalizes will affect the roughness of a nanotube fabric. Ionic species that form larger crystals (130 in FIGS. 1A and 1B), for example, will have a greater impact on how nanotube elements compact on a substrate surface as compared with ionic species that from smaller crystals.

Looking now to second process step 102, an intermediate step of the exemplary nanotube fabric deposition process of FIG. 1A is shown. Within process step 102, a significant volume of liquid medium 140 has been removed (via, for example, but not limited to, a spin coating operation). As a result of this decreased volume, nanotube elements 110 are forced closer together. However, due to the significantly limited repulsion distance 120a present in the exemplary operation of FIG. 1A, the nanotube elements are able to move close together and will tend to fit tightly together in a relatively irregular, haphazard arrangement as their freedom of movement is reduced due to the decreased volume of the liquid medium 140.

It should be noted that within both exemplary processes detailed in FIGS. 1A and 1B, the concentration level of ionic species within each nanotube formulation increases between the first and second process steps (101 and 102, respectively, for FIG. 1A, and 104 and 105, respectively, for FIG. 1B). While not shown in FIGS. 1A and 1B for sake of clarity, within certain applications, this increase in ionic species concentration can significantly reduce the repulsion distance (120a and 120b) of the nanotube elements within the partially dried nanotube formulation. As such, in these certain applications, there exists a temporal component to the fabric deposition process with respect to the degree of rafting within and the smoothness/roughness of a nanotube fabric formed from that process. Typically, within such a drying process (as is shown in FIGS. 1A and 1B), once nanotube elements become organized (as shown in process steps 102 and 105), they will tend to stay organized as the remaining liquid medium is removed. As such, according to the methods of the present disclosure, it should be noted that in certain applications, the method and speed at which a nanotube formulation is deposited over a material layer and dried can have an effect on the surface roughness of a nanotube fabric being formed.

Looking to final process step 103 of FIG. 1A, substantially all of liquid medium 140 has been removed and nanotube elements 110 have been formed into a nanotube fabric over the surface of material layer 150. As described above, due to the low repulsion distance 120a caused by the high concentration of ionic species 130 within the nanotube formulation, nanotube elements 110 are able to fit together tightly in an irregular arrangement. This irregular, haphazard arrangement results in the surface of this nanotube fabric being significantly rough, as is detailed within process step 103.

Looking now to first process step 104 of FIG. 1B, a nanotube formulation has again been deposited over material layer 150. It should be noted that number, size, and portion of nanotube elements 110 in first process step 104 of FIG. 1B are identical to those shown in first process step 101 of FIG. 1A. The difference between the exemplary operations of FIGS. 1A (process steps 101-103) and 1B (process steps 104-106) is that the nanotube formulation within the exemplary operation of FIG. 1B has a significantly lower concentration of ionic species elements 130, as compared with the nanotube formulation of FIG. 1A. As a result, the repulsion distance 120b around nanotube elements 110 in FIG. 1B is significantly greater than the repulsion distance 120a within the exemplary operation of FIG. 1A. As is detailed within process steps 105 and 106 (and described in more detail below), this increased repulsion distance 120b results in nanotube elements 110 forming into a relatively regular and organized arrangement, resulting in a smoother nanotube fabric as compared with the fabric formed by the exemplary operation of FIG. 1A.

Looking now to second process step 105 of FIG. 1B, a significant volume of liquid medium 140 has been removed resulting an intermediate structure wherein nanotube elements 110 are forced closer together due to the reduced volume, similar to process step 102 of FIG. 1A. Unlike within process step 102 of FIG. 1A, however, the increased repulsion distance 120b limits the movement of the nanotube elements 110 and prevents them from forming into a tight arrangement (as happen in process step 102), forcing them into a more organized arrangement.

Looking now to final process step 106 of FIG. 1B, substantially all of liquid medium 140 has been removed and nanotube elements 110 have been formed into a nanotube fabric over the surface of material layer 150 (similar to process step 103 of FIG. 1A). As described above, however, due to the significantly large repulsion distance 120b caused by the relatively low concentration of ionic species 130 within the nanotube formulation, nanotube elements 110 are kept further apart during the fabric formation process and, as a result, rendered into a more organized and regular arrangement. This organized, regular arrangement results in the surface of the nanotube fabric formed by the exemplary process of FIG. 1B being significantly smoother that the fabric resulting from the exemplary process of FIG. 1A, as is detailed within process step 103.

Figure 2A:
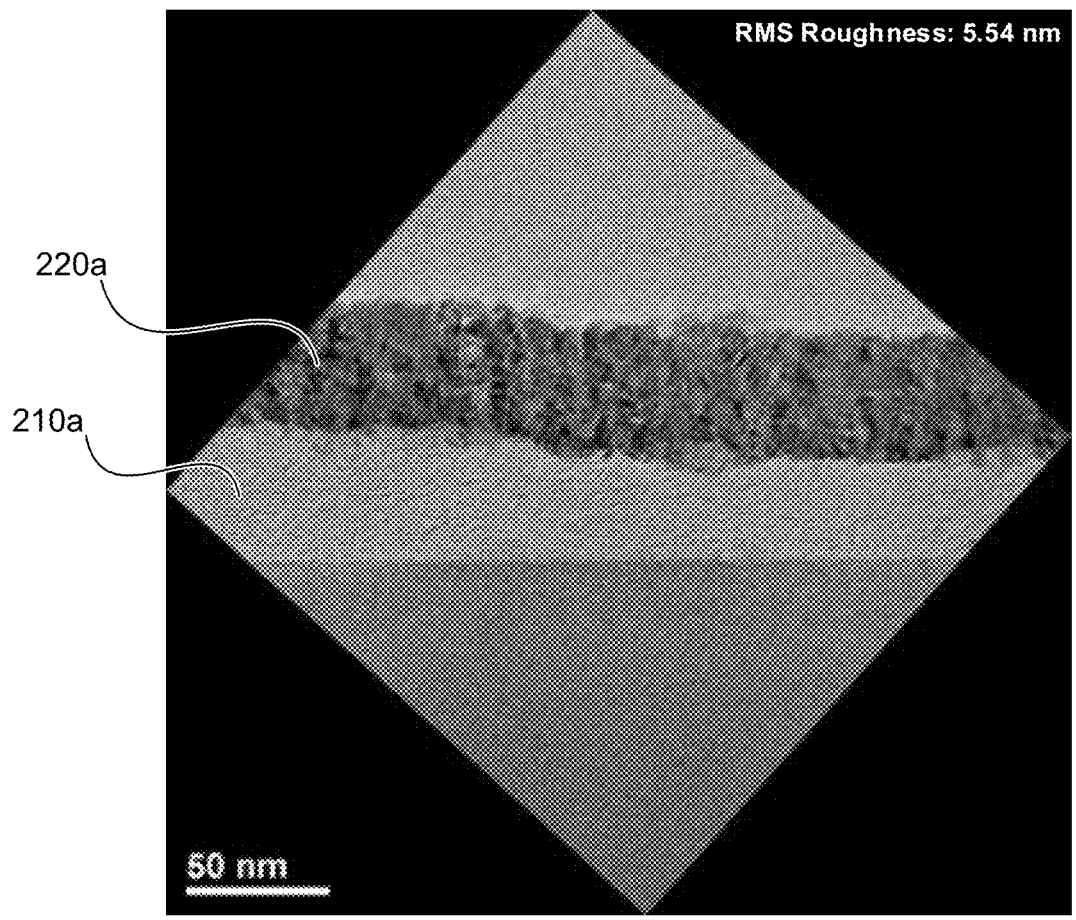
FIG. 2A is an TEM image of a cross-section of a nanotube fabric with a relatively high surface roughness.
Figure 2B:
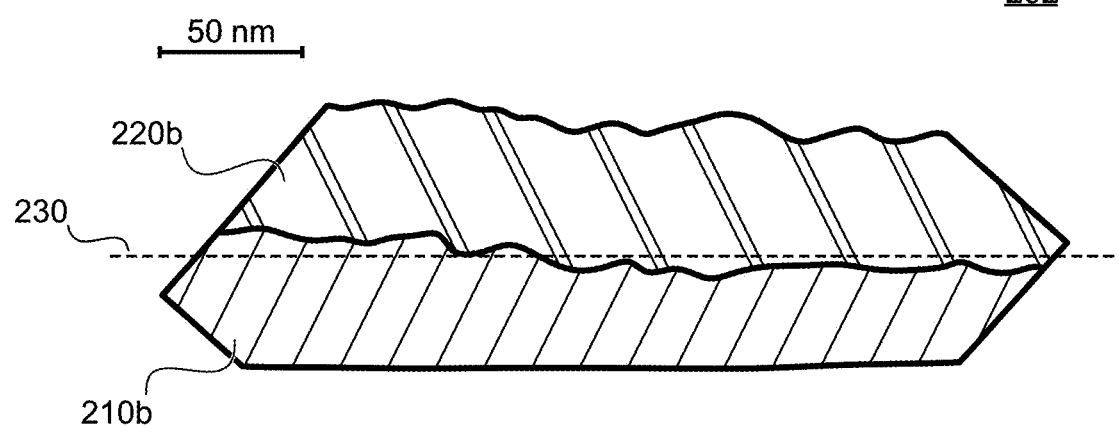
FIG. 2B is a line drawing of the TEM image of FIG. 2A.

FIGS. 2A and 2B are a TEM image and a line drawing, respectively, of a cross-section of a nanotube fabric, formed according to the methods of the present disclosure, with a relatively high surface roughness. This relatively rough nanotube fabric (210a in FIG. 2A and 210b in FIG. 2B) is analogous to the nanotube fabric shown in process step 103 of FIG. 1A and has been shown here to detail an example of a nanotube fabric with a relatively rough surface.

Looking to FIG. 2A, nanotube fabric 210a is formed over a substrate material layer from a nanotube formulation with a relatively high concentration level of ionic species (methods used to determine both high and low concentration levels for a given ionic species within a particular nanotube formulation will be discussed in detail below with respect to FIG. 6 and shown within examples 1-14). A conductive layer 220a is then formed over nanotube fabric 210a. FIG. 2B illustrates both of these material layers with a line drawing such that the surfaces of both material layers can be more easily seen. Within FIG. 2B, nanotube fabric layer 210b represents nanotube fabric layer 210a shown in the TEM image of FIG. 2A, and, similarly, conductive layer 220b represents conductive layer 220a shown in the TEM image of FIG. 2A. Horizontal surface line 230 is included in the line drawing of FIG. 2B to provide a reference for the relative surface roughness of nanotube fabric 210a/210b. As can be seen in FIG. 2B, the actual surface of nanotube fabric 210b varies significantly above and below horizontal surface line 230. Further, the RMS roughness of nanotube fabric 210a has been calculated to be 5.54 nm by analyzing an AFM image of the same fabric using methods that will be described in detail with respect to examples 1-14 and FIG. 11 below.

Figure 3A:
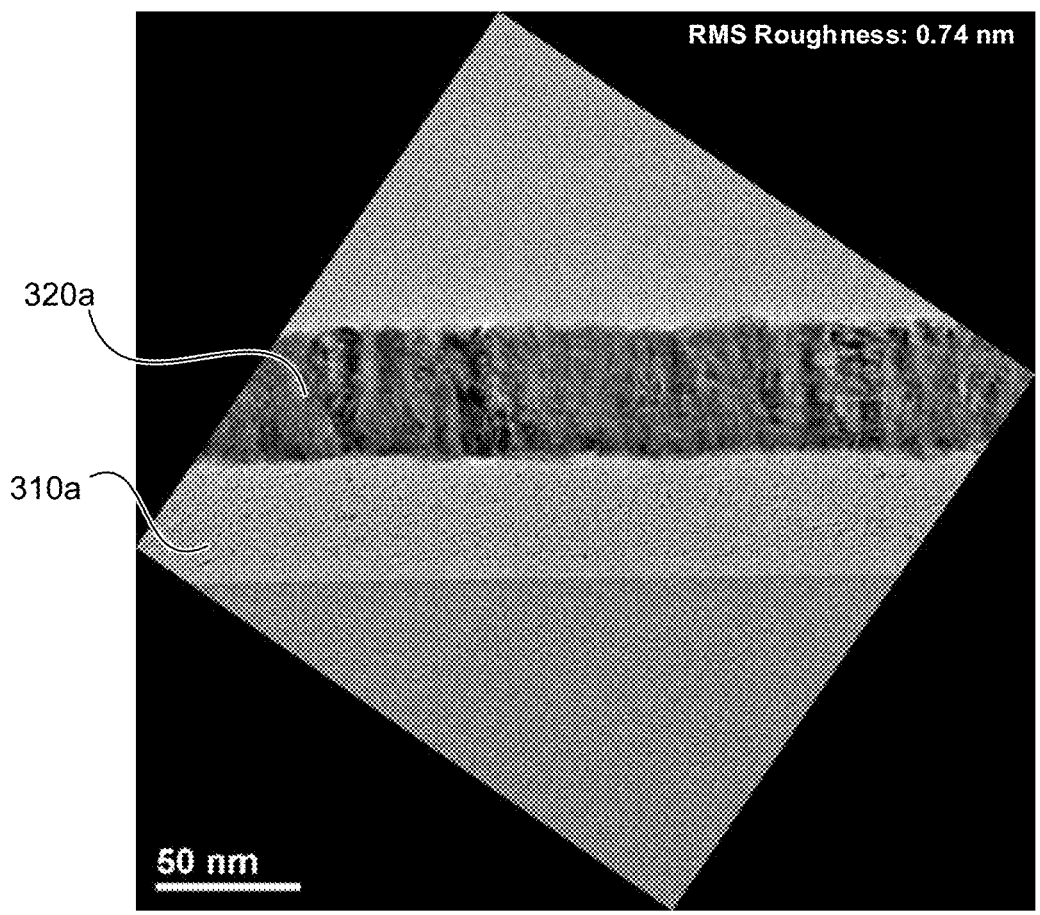
FIG. 3A is an TEM image of a cross-section of a nanotube fabric with a relatively low surface roughness.
Figure 3B:
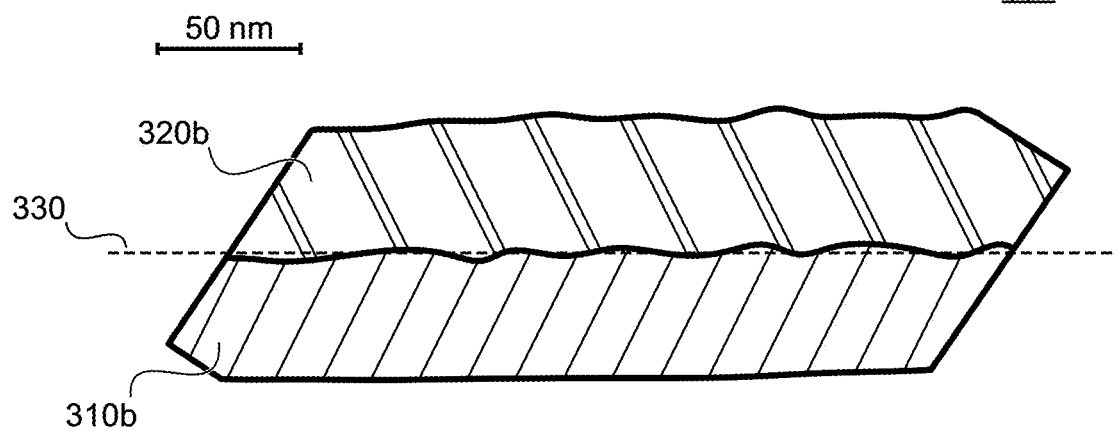
FIG. 3B is a line drawing of the TEM image of FIG. 3A.

FIGS. 3A and 3B are a TEM image and a line drawing, respectively, of a cross-section of a nanotube fabric, formed according to the methods of the present disclosure, with a relatively low surface roughness. This relatively smooth nanotube fabric (310a in FIG. 3A and 310b in FIG. 3B) is analogous to the nanotube fabric shown in process step 106 of FIG. 1B and has been shown here to detail an example of a nanotube fabric with a relatively smooth surface.

Looking to FIG. 3A, nanotube fabric 310a is formed over a substrate material layer from a nanotube formulation with a relatively low concentration level of ionic species (methods used to determine both high and low concentration levels for a given ionic species within a particular nanotube formulation will be discussed in detail below with respect to FIG. 6 and then shown within examples 1-14). A conductive layer 320a is then formed over nanotube fabric 310a. FIG. 3B illustrates both of these material layers with a line drawing such that the surfaces of both material layers can be more easily seen. Within FIG. 3B, nanotube fabric layer 310b represents nanotube fabric layer 310a shown in the TEM image of FIG. 3A, and, similarly, conductive layer 320b represents conductive layer 320a shown in the TEM image of FIG. 3A. Horizontal surface line 330 is included in the line drawing of FIG. 3B to provide a reference for the relative surface roughness of nanotube fabric 310a/310b. As can be seen in FIG. 3B, the actual surface of nanotube fabric 310b does not vary significantly above or below horizontal surface line 330, especially as compared to FIG. 2B. Further, the RMS roughness of nanotube fabric 310a has been calculated to be 0.74 nm by analyzing an AFM image of the same fabric using methods that will be described in detail with respect to examples 1-14 and FIG. 11 below and is significantly less than the roughness calculated for the nanotube fabric 210a of FIG. 2A.

As described above, the parameters of a particular nanotube formulation can greatly affect the concentration levels of a given ionic species required to promote or discourage rafting within a nanotube fabric formed from that formulation and also the surface roughness of that fabric. That is to say, as will be shown in detail below, a particular nanotube formulation, as defined by the present disclosure, and a given ionic species will be associated with a specific nanotube formulation roughness curve, that curve defined by the different parameters of the nanotube formulation itself. One of the significant parameters of a nanotube formulation that can significantly affect the shape of a nanotube formulation roughness curve is the type of nanotube used in the formulation. To this end, FIGS. 4A-4F are TEM images providing examples of the different types of nanotubes used within the examples of the present disclosure.

Figure 4A:
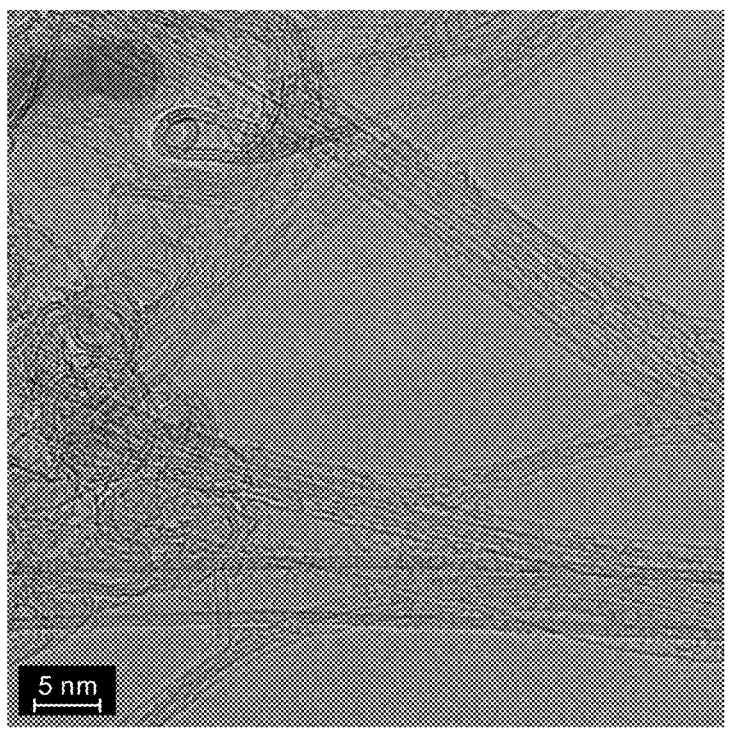
FIGS. 4A and 4B are first and second TEM images, respectively, of a first exemplary type of nanotube.
Figure 4B:
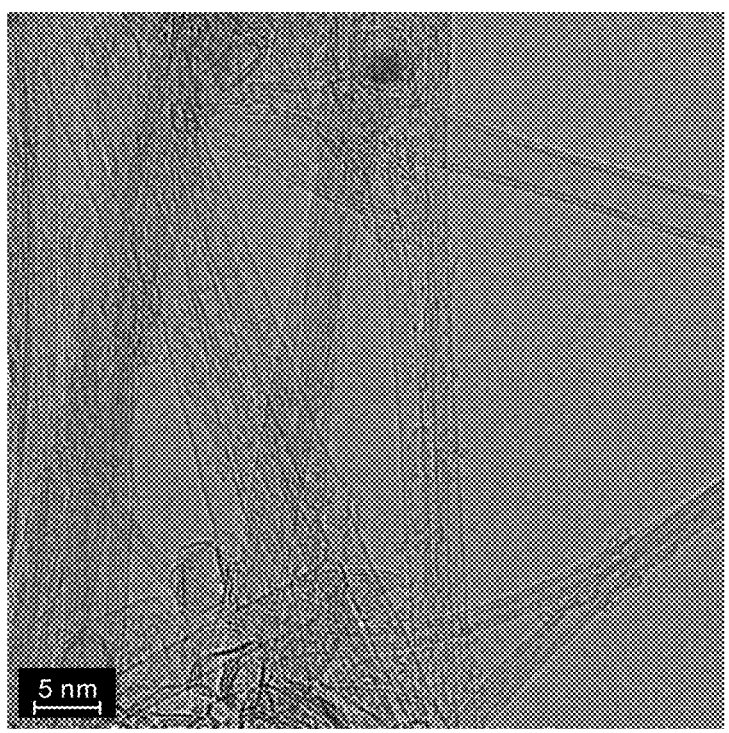

Looking to FIGS. 4A and 4B, a first exemplary type of nanotube is shown in SEM images 401 and 402, respectively. The nanotubes shown in FIGS. 4A and 4B are predominately double-walled carbon nanotubes, that are relatively long and straight (that is, have few bends, kinks or curves). This first exemplary type of nanotube had a median length of 290 nm and a 95th percentile length of 810 nm.

Figure 4C:
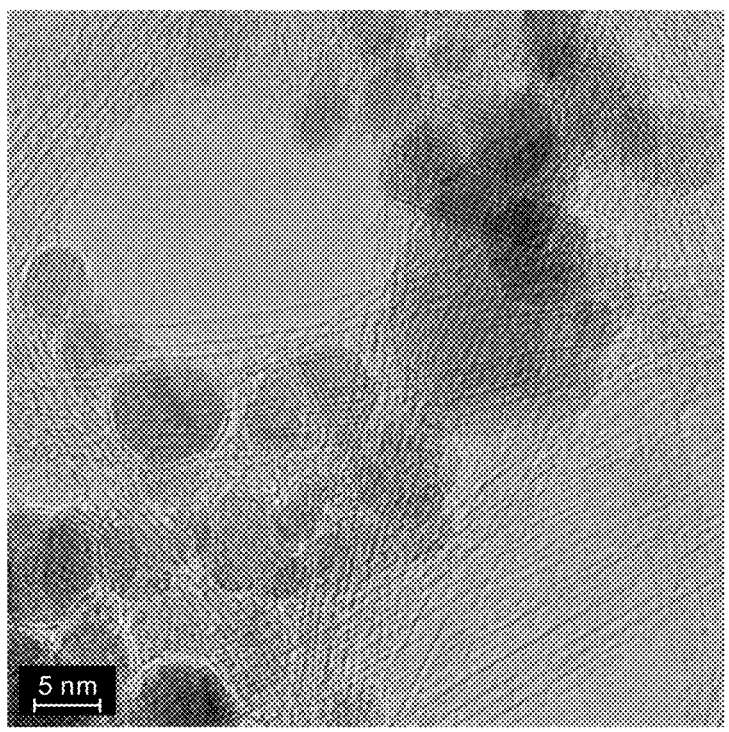
FIGS. 4C and 4D are first and second TEM images, respectively, of a second exemplary type of nanotube.
Figure 4D:
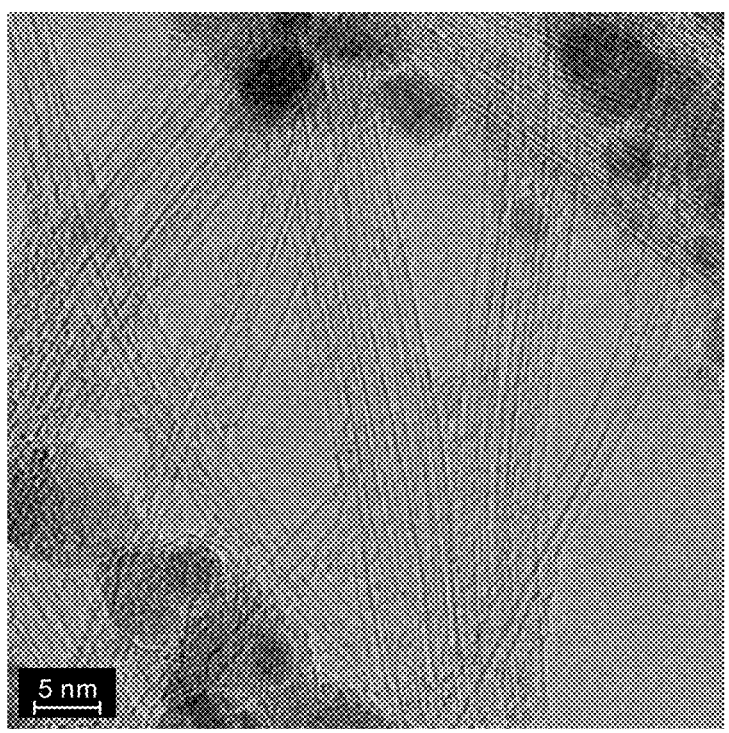

Looking now to FIGS. 4C and 4D, a second exemplary type of nanotube is shown in SEM images 403 and 404, respectively. This second exemplary type of nanotube is used within nanotube formulation "X" as described within examples 1-7, discussed in detail below. The nanotubes shown in FIGS. 4C and 4D are predominately singled-walled carbon nanotubes that are significantly shorter that the first exemplary nanotube type (FIGS. 4A and 4B) but longer than the third exemplary nanotube type (FIGS. 4E and 4F, discussed below) and straight (that is, have few bends, kinks or curves). This second exemplary type of nanotube had a median length of 187 nm and a 95th percentile length of 494 nm. As described within the discussion of examples 1-7, nanotubes of this type were functionalized and purified (via methods described within the discussion of FIG. 7A below) and formed into nanotube formulations. Formulations using this type of nanotube were then tested with ammonium nitrate salt ($NH_4NO_3$) in examples 2-4 to realize nanotube formulation roughness curve 1010 in FIG. 10A and tetramethyl ammonium formate (TMA Fm) in examples 5-7 to realize nanotube formulation roughness curve 1020 in FIG. 10B. The results of these curves (1010 and 1020) will be described in detail within the discussion of FIGS. 10A and 10B below.

Figure 4E:
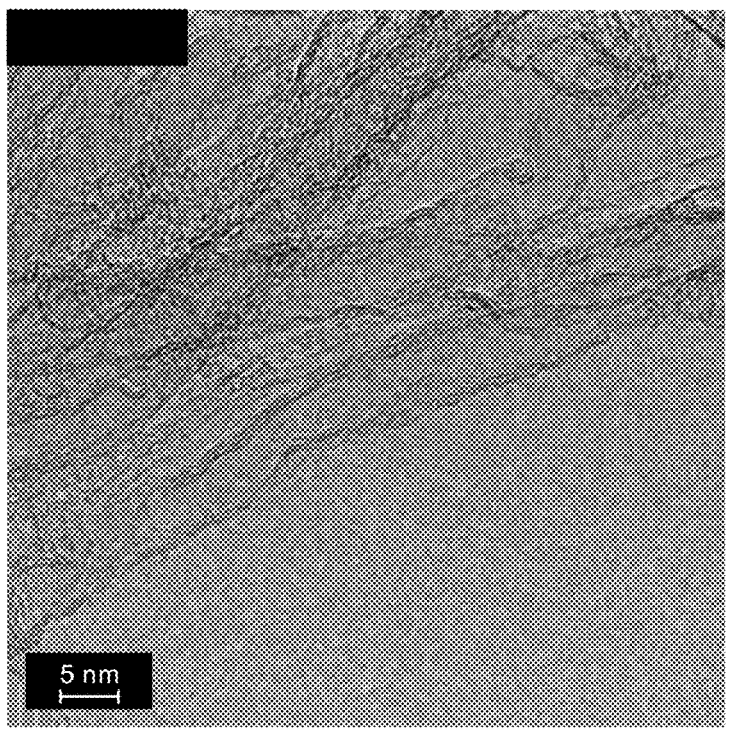
FIGS. 4E and 4F are first and second TEM images, respectively, of a third exemplary type of nanotube.
Figure 4F:
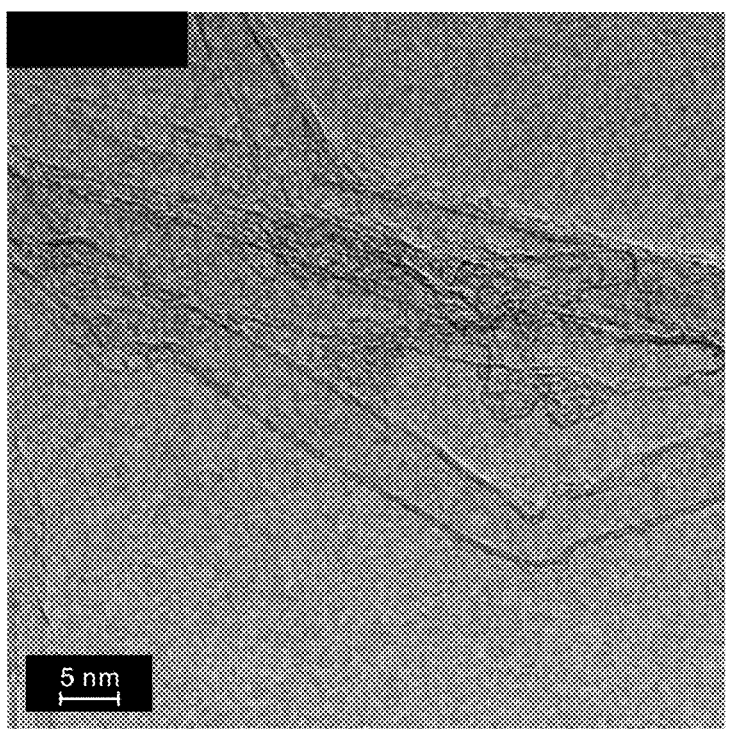

Looking now to FIGS. 4E and 4F, a third exemplary type of nanotube is shown in SEM images 405 and 406, respectively. This third exemplary type of nanotube is used within nanotube formulation "Y" as described within examples 8-14, discussed in detail below. The nanotubes shown in FIGS. 4E and 4F are predominately multi-walled carbon nanotubes, each of which has a plurality of kinks and bends, and are significantly short as compared to the first and second exemplary type of nanotubes shown in FIGS. 4A and 4B and FIGS. 4C and 4D, respectively. This second exemplary type of nanotube had a median length of 132 nm and a 95th percentile length of 260 nm. As described within the discussion of examples 8-14, nanotubes of this type were functionalized and purified (via methods described within the discussion of FIG. 7A below) and formed into nanotube formulations. Formulations using this type of nanotube were then tested with ammonium nitrate salt ($NH_4NO_3$) in examples 9-11 to realize nanotube formulation roughness curve 1030 in FIG. 10C and tetramethyl ammonium formate (TMA Fm) in examples 12-14 to realize nanotube formulation roughness curve 1040 in FIG. 10D. The results of these curves (1030 and 1040) will be described in detail within the discussion of FIGS. 10C and 10D below.

Ionic species, as defined by the present disclosure, can include, but are not limited to, ammonium salts, nitrate salts, ammonium nitrate salts, ammonium formate, ammonium acetate, ammonium carbonate, ammonium bicarbonate, ionic organic species, ionic polymers, and inorganic salts. Further, cations well suited for use with the methods of the present disclosure include, but are not limited to: ammonium; all quaternary ammonium functionalities (e.g., tetraalkylammoniums such as, but not limited to, tetramethylammonium, tetraethylammonium, tetrapropylammonium, and dimethyldiethylammonium); acids of all primary, secondary, and tertiary aliphatic amines; acids of cyclic amines (such as, but not limited to, piperidinium and pyrrolidinium); Cyclic, aromatic quartenary amines (such as, but not limited to, imidazolium and pyridinium); and short chain alkyl phosphonium ions. Further, anions well suited for use with the methods of the present disclosure include, but are not limited to: bases of all soluble organic acids containing only nitrogen (N), oxygen, carbon (C), and hydrogen (H); simple soluble aliphatic carboxylic acids (such as, but not limited to, carbonate, formate, acetate, and proprionate); non-zwitterionic complex organic acids (such as, but not limited to, aromatic acids such as benzoate); nitrate; and phosphate. For certain applications wherein electronic fabrication cleanroom standards are not required (for example, but not limited to, nanotube fabrics used for material coatings), inorganic ionic species can be used with the methods of the present disclosures. Such nonvalent inorganic ionic species include, but are not limited to, cations of sodium, calcium, potassium, and magnesium and anions of chloride, bromide, sulfate, nitrate, and carbonate.

To this end, FIG. 5 provides a table 500 of cations and anions which can be used to form a plurality of ionic species well-suited for use with the methods of the present disclosure. It should be noted that this table is intended to provide a list of exemplary ionic species and the methods of the present disclosure should not be limited to this list. As described by the present disclosure, each of these ionic species can result in a different nanotube formulation roughness curve for a given nanotube formulation. As such, the present disclosure provides methods for characterizing nanotube formulations to generate nanotube formulation roughness curves (as described within the discussion of FIG. 8 below) for a specific ionic species used within a specific nanotube formulation. As has been described above and will be shown within examples 1-14, the generation of a nanotube formulation roughness curve for a given nanotube formulation and ionic species allows for control (via adjustment of the ionic species concentration level) of the surface roughness of a nanotube fabric and the degree of rafting within a nanotube fabric.

Figure 6:
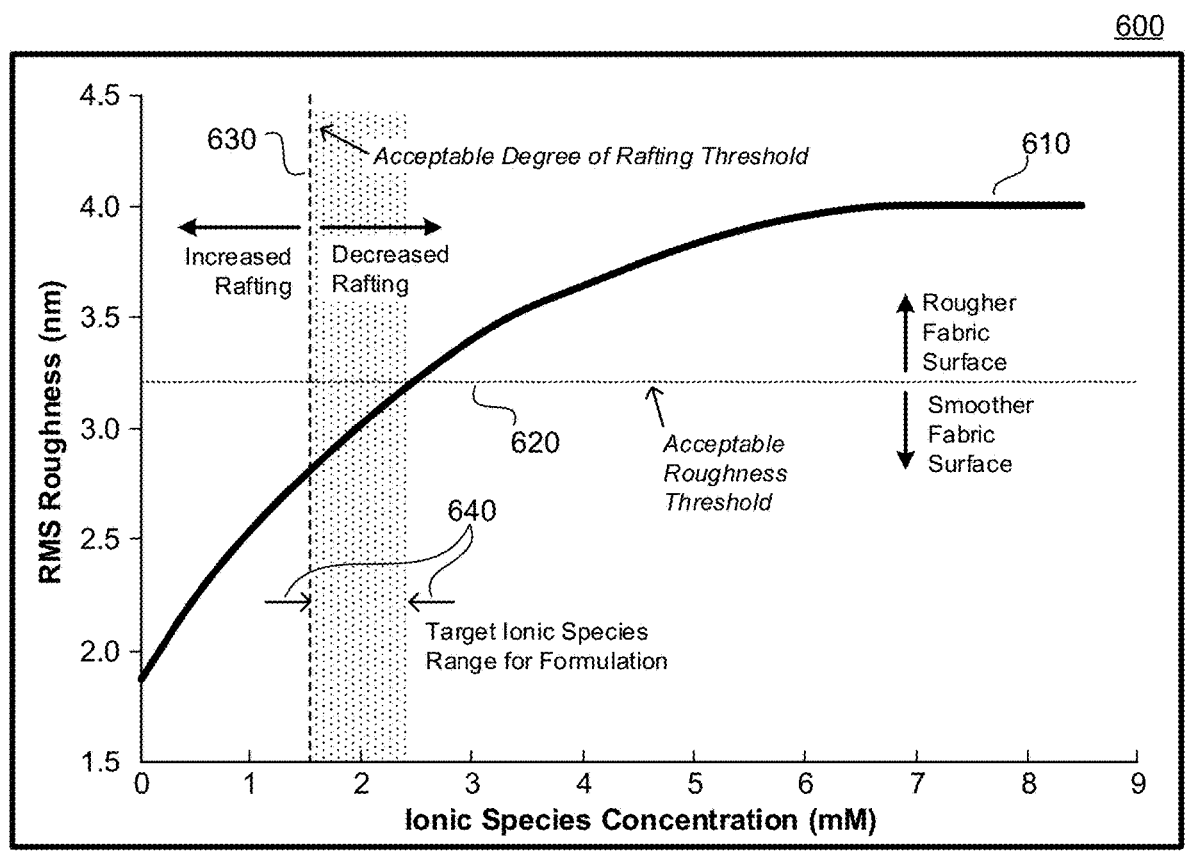
FIG. 6 is a labeled example of a nanotube formulation roughness curve.

FIG. 6 is a labeled example of a nanotube formulation roughness curve 600 intended to illustrate how such a curve can be used to adjust the ionic species concentration of a nanotube formulation to produce a nanotube fabric with a desired surface roughness and degree of rafting. It should be noted that the exemplary nanotube formulation roughness curve 600 of FIG. 6 as well as nanotube formulation roughness curves detailed in the discussions of examples 1-14 (FIGS. 10A-10D) are targeted at providing relatively smooth nanotube fabrics with a low degree of rafting. However, the methods of the present disclosure are not limited in this regard. As will be described below, the selection of utilizable range within a nanotube formulation roughness curve will be dependent on the needs and requirements of a specific application. For example, certain applications might require a highly rafted fabric. Other applications might require a very rough fabric. As will be shown below, the requirements of a specific application are used to set threshold values, which are then used to define a utilizable range 640 within a nanotube formulation roughness curve. This utilizable range 640 then provides a target ionic species concentration level zone on the curve indicative of concentration values that will provide a nanotube fabric that meets the given requirements.

Looking now to FIG. 6, curve 600 plots the concentration of the selected ionic species in millimoles (mM) on the x-axis and the RMS roughness value in nanometers (nm) of a nanotube fabric formed with a nanotube formulation at a given concentration on the y-axis. In practice, such a nanotube formulation roughness curve is generated experimentally by forming a plurality of identical nanotube formulations, adjusting the ionic species concentration level in each of these nanotube formulations to a different value, forming a nanotube fabric with each of the differently adjusted nanotube formulations, and then measuring the RMS roughness of and degree of rafting within each of the resulting nanotube fabrics. This method of generating a nanotube formulation roughness curve for a given nanotube formulation and ionic species is detailed in FIG. 8 and described in more detail in the discussion of that figure below. The nanotube formulation roughness curves of FIGS. 10A-10D (1010, 1020, 1030, and 1040), which plot the results of examples 1-14 to realize four different nanotube formulation roughness curves, were each created using four data points realized experimentally in this manner. However, the methods of the present disclosure are not limited in this regard. Indeed, any number of data points can be used to produce a nanotube formulation roughness curve, including, but not limited to, 2, 3, 4, 5, 10, 15, 20, 50, or 100. This is to say, the number of data points generated and used to create a nanotube formulation roughness curve is only limited by the specific needs of an application.

Looking back now to FIG. 6, curve 610 is imagined to be plotted through a number of experimentally obtained data points. As curve 610 is intended as an illustrative example, no actual data was used to generate this curve. However, the nanotube formulation roughness curves of FIGS. 10A-10D provide curves generated through real experimentally obtained data. A horizontal line 1020 is drawn through curve 1010 and is indicative of the acceptable roughness threshold for a selected application. As indicated by the arrows on the plot, any points on the curve above this line 620 will have a surface roughness greater than this selected threshold, and any point on the curve below this line with have a roughness lower than this threshold. Similarly, a vertical line 630 is drawn through curve 610 and is indicative of the acceptable degree of rafting threshold for a selected application. As indicated by the arrows on the plot, any points to the left of this line 630 will have a degree of rafting higher than this threshold, and any points to the right of this line 630 will have a degree of rafting lower than this threshold. The points on the curve 610 that cross these two threshold lines (620 and 630) define a utilizable range 640 within the nanotube formulation roughness curve 600. By adjusting an ionic species concentration level within a nanotube formulation to within this utilizable range 640, nanotube fabrics can be formed with the surface roughness and degree of rafted required for a selected application.

As is detailed within exemplary nanotube formulation curve 600, lower concentrations of ionic species within a nanotube formulation generally tend to result in nanotube fabrics with smoother surfaces and a higher degree of rafting, while higher concentrations of ionic species within a nanotube formulation generally tend to result in nanotube fabrics with rougher surfaces and a low degree of rafting. Within certain applications (for example, but not limited to, two-terminal nanotube switching devices, as described in U.S. Pat. No. 7,781,862 described above), it can be advantageous to use nanotube fabrics that are both relatively smooth and exhibit a low degree of rafting. The exemplary utilizable range 640 of nanotube formulation roughness curve 600 is selected to meet such a design requirement. However, as described above, the methods of the present disclosure are not limited in this regard. Indeed, in certain applications, wherein, for example, a very rough fabric is required, utilization zone 640 could be drawn to define points on curve 610 which fell above horizontal line 620.

It should also be noted, that in certain applications a nanotube formulation roughness curve can be calculated once for a given nanotube formulation and ionic species combination, and then reused for operations using nanotube formulations with the same parameters. For example, within a large scale manufacturing operation wherein the parameters of a nanotube formulation could be reliably controlled and the methods for depositing that nanotube formulation also well-known and controlled, a nanotube formulation roughness curve could be produced experimentally a single time on an initial nanotube formulation, and then the resulting utilization range used on all subsequent builds of nanotube formulations with matching parameters used within the process. In this way, the methods of the present disclosure can be used to provide design parameters for a large scale manufacturing process that includes the large scale production of nanotube fabrics with a controlled and repeatable surface roughness and degree of rafting characteristics.

Figure 7A:
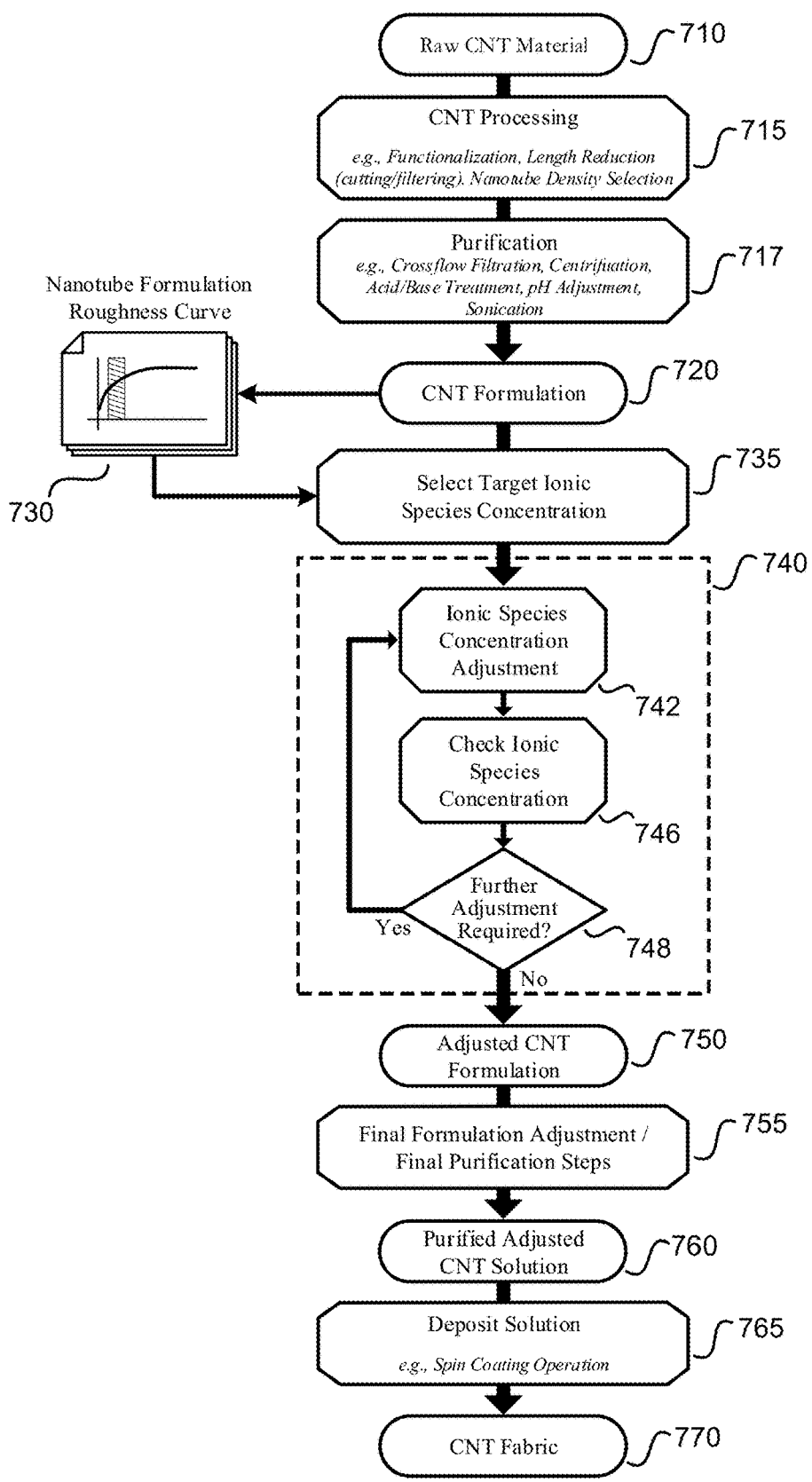
FIG. 7A is a flow chart detailing a method for producing a carbon nanotube (CNT) fabric with a preselected surface roughness and degree of rafting according to the methods of the present disclosure.

FIG. 7A is a flow chart detailing a method 701 for producing a carbon nanotube (CNT) fabric with a preselected surface roughness and degree of rafting according to the methods of the present disclosure. The method begins with process step 710 wherein Raw CNT Material is selected. As described above with respect to FIGS. 4A-4F, different types of nanotubes (for example, but not limited to, single walled, double walled, multiwalled, long, short, straight, kinked, metallic, semiconducting, and mixtures thereof) are selected as best befits the needs of a particular application. Within first process step 710, the type or types of nanotube required is selected and produced in the required quantity.

In next process step 715, the selected Raw CNT Material 710 is processed and suspended in a liquid medium to form an initial nanotube application solution. Carbon nanotube (CNT) raw materials normally come in come in a solid non-solubilized form. They do not readily form stable, non-precipitating suspensions in typical solvating media, such as water, alcohols, esters, and ethers. In order to integrate the manufacturing of nanotube devices with existing semiconductor facilities, it is often necessary to prepare a spin- or spray-coatable nanotube solution or dispersion before use. For example, a nanotube powder has to be suspended, dispersed, solvated, or mixed in a liquid medium or solvent, so as to form a nanotube solution or dispersion. In some cases, this liquid medium could be water (including, but not limited to, distilled water or deionized water). In other cases, this liquid medium could be a non-aqueous solvent, such as, but not limited to, ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma-butyrolactone, benzyl benzoate, salicylaldehyde, tetramethyl ammonium hydroxide, and esters of alpha-hydroxy carboxylic acids. In other embodiments, the liquid medium may contain or be predominantly a non-halogenated solvent. To this end, CNT Processing step 715 can include, but is not limited to, functionalizing of the nanotube elements, selecting the nanotube density of the application solution (via, for example, cutting of the nanotube elements and/or filtering operations), selecting the length distribution of the nanotube elements, and adjusting the pH level within the solution. Examples of such nanotube processing operations can be found in U.S. Pat. No. 9,634,251 and U.S. patent application Ser. No. 14/033,158 (now published as US2015/0086771), both of which are hereby included by reference in their entirety.

In a next processing step 717, the initial nanotube application solution is purified using one or more purification steps to realize Carbon Nanotube (CNT) Formulation 720. Purification process step 717 can include one or more purification operation such as, but not limited to, a cross-flow filtration (CFF) process, a vacuum filtration process, sonication, a depth filter process, centrifugation, treatments of certain chemicals, and/or any combinations thereof. Dependent on the needs of a particular application, such purification processes can be effective in producing highly pure nanotube formulations—that is, formulations substantially free of surfactants, metallic impurities, other additives etc. Methods for purifying nanotube application solutions are described in U.S. Pat. Nos. 9,650,732 and 10,069,072, both of which are hereby included by reference in their entirety.

It should be noted that CNT Processing step 715 and Purification step 717 can be, in certain applications, be performed together, simultaneously, or have steps interspersed. That is, within such applications raw CNT materials 710 may first go through a processing step (a functionalization step, for example), then go through a purification step (acid treatment, for example), then go through a second process step (length adjustment, for example), followed by a second purification step (a cross-flow filtration process, for example). Additionally, some treatments to an initial CNT application solution can serve as both a CNT Processing step 715 and a Purification step 717 (acid treatment or filtering, for example). As such, while FIG. 7A depicts these two process steps (715 and 717) as being performed separately and in a sequence, this is done solely for ease of explanation and the methods of the present disclosure should not be limited in this regard. Indeed, as discussed above, the processing of raw CNT materials and the purification of those materials can be performed within a plurality of individual process steps performed in any order or even simultaneously.

Further, in certain applications, volumes of ionic species material can be introduced to the initial application solution during CNT Processing process step 715 and Purification process step 717. Within such applications, CNT Formulation 720 includes non-zero concentration levels of one or more ionic species immediately subsequent to process steps 715 and 717. In some applications, this "preloaded" ionic species material is introduced into the initial application solution as part of the ionic species concentration level adjustment process (introducing a desired ionic species at an initial concentration level, for example). In other applications, the introduction of ionic species material at this point in the process (process steps 715 and 717) will simply be an effect of the processing or purification processes used. In either case, as described below, the methods of the present disclosure are well suited to either adjust the concentration level of the preloaded ionic species to a desired target level (in the case wherein the preloaded ionic species is of a desired type for a given application) or remove the preloaded ionic species and replace it with a different ionic species type (in the case wherein the preloaded ionic species is of an undesired type for a given application).

Within the next several process steps the ionic species concentration level of CNT Formulation 720 is adjusted according to the methods of the present disclosure such that the ionic species concentration level falls within the utilization range as required by the specific needs of the application in which the nanotube fabric being formed will be used. The adjustment process first starts by either generating Nanotube Formulation Roughness curve 730 for CNT Formulation 720 or by using such a curve that has been previously generated for CNT Formulation 720 (as described above). Within process step 735, the utilization range obtained from Nanotube Formulation Roughness Curve 730 is used to select a target ionic species concentration level. Within sub-method 740, the ionic species concentration level of CNT Formulation 720 is adjusted (using one or more cycles) to this target value to realize Adjusted CNT Formulation 750.

Sub-method 740 includes a plurality of process steps, which—dependent on the needs of a particular application—can be repeated multiple times. In some applications, a first ionic species type is removed (all or in part) from CNT Formulation 720 in a first operation, then a second ionic species type is added in a second operation such that the second ionic species type is present in Adjusted CNT Formulation 750 at the target concentration. In other applications, CNT Formulation 720 is substantially devoid of ionic species (having an ionic species concentration of essentially zero) immediately subsequent to CNT Processing step 715 and Purification steps 717, and sub-method 740 used (in a single iteration or within multiple iterations) to add in a selected ionic species to the target concentration level. In still other applications, CNT Formulation 720 will have the desired ionic species present at some initial concentration level immediately subsequent to CNT Processing step 715 and Purification steps 717, and sub-method 740 used (within a single iteration or within multiple iterations) to either raise or lower this initial concentration level to the target concentration level.

Sub-method 740 first includes process step 742 wherein the concentration level of ionic species within the CNT Formulation 720 is adjusted. Process step 746 then determines the new concentration level of ionic species present in the nanotube formulation subsequent to this adjustment process. Finally, process step 748 determines if further adjustment of the ionic species concentration level is required. If more adjustment is needed, sub-method 740 begins again with process step 742. This loop continues until the selected ionic species with CNT Formulation 720 has a concentration level within an acceptable range of the target concentration level, at which point CNT formulation 720 has been sufficiently adjusted to realize Adjusted CNT Formulation 750. Methods for adjusting the ionic species concentration level (that is, process step 742) are described within the discussions of FIGS. 7B-7D below and include, but are not limited to, cross-flow filtration processes, ion exchange processes, dialysis, and chemical treatment.

In a next process step 755, adjusted CNT formulation 755 is processed through one or more final formulation adjustment steps (such as, but not limited to, the addition of surfactants or molecular additives as described in U.S. Pat. No. 9,634,251) and final purification steps to realize Purified Adjusted CNT Solution 760. In next process step 765, Purified Adjusted CNT Solution 760 is deposited (via, for example, but not limited to, a spin coating operation) to form CNT Fabric 770. As Purified Adjusted CNT Solution 760 has an ionic species concentration level corresponding to a selected surface roughness parameter and/or a selected degree of rafting, CNT Fabric 770 will exhibit these properties. In this way, the present disclosure provides a method for forming a nanotube fabric with a selected surface roughness and degree of rafting.

Figure 7B:
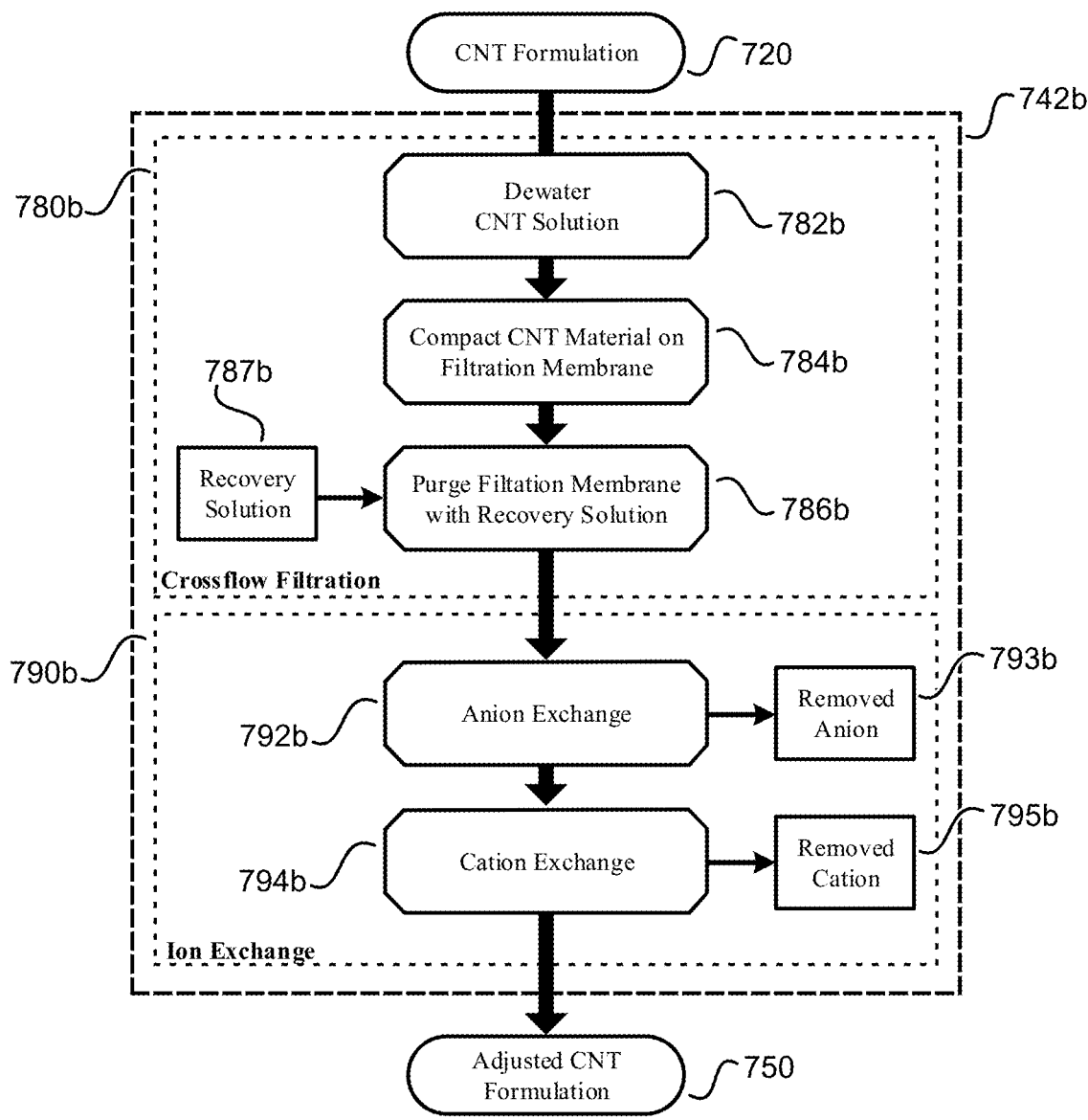
FIG. 7B is a flow chart depicting a first exemplary ionic species adjustment process according to the methods of the present disclosure, which is imagined to be designed to reduce the ionic species concentration level of a CNT formulation to a very low or substantially zero value.

FIG. 7B is a flow chart 702 depicting a first exemplary Ionic Species Adjustment Process 742b according to the methods of the present disclosure, which is imagined to be designed to reduce the ionic species concentration level of CNT Formulation 720 to a very low or substantially zero value. First exemplary Ionic Species Adjustment Process 742b is intended to be an expanded and more detailed version of process step 742 in FIG. 7A (as are second and third exemplary Ionic Species Adjustment Processes 742c within FIG. 7C and 742d within FIG. 7D, respectively, discussed further below), which takes CNT Formulation 720 and adjusts the ionic species concentration level within that formulation to realize Adjusted CNT Formulation 750, as described above with respect to FIG. 7A.

First exemplary Ionic Species Adjustment Process 742b is comprised of two sub-processes: a Crossflow Filtration sub-process 780b and an Ion Exchange sub-process 790b. Crossflow Filtration process 780b is first used to remove a significant volume of ionic species from CNT Formulation 720. Then, Ion Exchange sub-process 790b is used to further reduce the concentration level of the remaining ionic species within the nanotube formulation (as described within the discussion of FIG. 7A above). In this way, the concentration of ionic species present within CNT Formulation 720 is adjusted to a very low or substantially zero level.

It should be noted that within FIG. 7B, Crossflow Filtration sub-process 780b and Ion Exchange sub-process 790b are depicted, for ease of explanation, as each being performed only a single time. However, as described above within the discussion of FIG. 7A, the methods of the present disclosure are not limited in this regard. Indeed, in some applications Crossflow Filtration sub-process 780b could be performed multiple times prior to the start of Ion Exchange sub-process 790b. Similarly, Ion Exchange sub-process 790b could also be, within certain applications, performed multiple times subsequent to the conclusion of one or more Crossflow Filtration sub-process 780b iterations. Further, the entire Ionic Species Adjustment process 742b could be, within certain applications, looped and performed multiple times (as is depicted in FIG. 7A) to achieve a desired ionic species concentration level.

As depicted in FIG. 7B, Crossflow Filtration sub-process 780b is comprised of a plurality of sub-process steps. CNT Formulation 720 is first dewatered in sub-process step 782b such that the CNT material within the formulation is compacted onto a filtration membrane in process step 784b. In this way, a significant volume—or in some cases, substantially all—of any ionic species material present within CNT Formulation 720 is separated from the CNT material, as the ionic species material passes through the filter membrane while the CNT material is compacted onto the filter membrane. In a next sub-process step 786b, the filtration membrane is purged with Recovery Solution 787b. As Crossflow Filtration sub-process 780b is intended to reduce the concentration level of ionic species within CNT Formulation 720, Recovery Solution 787b is selected to be a low-salt containing material, such as, but not limited to, deionized water. In this way, the compacted CNT material is recovered back into a formulation with a significantly lower ionic species concentration as compared to CNT formulation 720. As described above, Crossflow Filtration sub-process 780b can be performed a single time, as is depicted in FIG. 7B, or repeated once or more to further reduce the ionic species concentration level present in CNT Formulation 720.

Looking now to Ion Exchange sub-process 790b, the ionic species concentration level of CNT Formulation 720 is further reduced subsequent to the concentration reduction performed by Crossflow Filtration sub-process 780b. Within certain applications, Ion Exchange sub-process 790b comprises a series of individual ion exchange steps, each of which flow CNT Formulation 720 through a resin column containing a specific type of ion exchange resin. These ion exchange steps can target the removal of a specific ion (for example, but not limited to, $FE^{2+}$ or $CA^{2+}$) or a broad category of ions (for example, but not limited to, all anions or all cations). In certain applications, a mixed bed ion exchange can also be used to remove both anions and cations within a single process step.

As first exemplary Ionic Species Adjustment process 742b is imagined to be focused on reducing ionic species concentration levels, it is imagined that Anion Exchange sub-process step 792b first removes substantially all anions present within the formulation using, for example, an $OH^-$ charged column. Subsequently, Cation Exchange sub-process step 794b then removes substantially all cations present within the formulation using, for example, a $H^+$ charged column. As described above, Ion Exchange sub-process 790b can be performed a single time, as is depicted in FIG. 7B, or repeated once or more to further reduce the ionic species concentration level present in CNT Formulation 720. Further, while FIG. 7B depicts Anion Exchange sub-process step 792b being performed prior to Cation Exchange sub-process step 794b, the methods of the present disclosure are not limited in this regard. Indeed, as described above, in certain applications Cation Exchange sub-process step 794b could be performed prior to Anion Exchange sub-process step 792b. Further, in certain applications both the cation exchange and anion exchange sub-process steps could be performed together using a mixed bed ion exchange process.

In this way, a significant volume (or in some cases, substantially all) of ionic species present in CNT Formulation 720 can be removed using a combination of Crossflow Filtration sub-process 780b and Ion Exchange sub-process 790b, resulting in Adjusted CNT Formulation 750, which, within this particular ionic species adjustment process example 702, has a very low (or substantially zero) concentration level of ionic species.

It should be noted that while first exemplary Ionic Species Adjustment Process 742b is depicted as first using a Crossflow Filtration sub-process 780b followed by a subsequent Ion Exchange sub-process 790b, the methods of the present disclosure are not limited in this regard. Indeed, in certain applications an ionic species adjustment process targeted at reducing ionic species concentration within a CNT formulation could include only Crossflow Filtration sub-process step 780b (performed once or multiple times) or only Ion Exchange sub-process step 790b (performed once or multiple times). Further, within certain applications such an ionic species adjustment process could perform Ion Exchange sub-process 790b (performed once or multiple times) prior to Crossflow Filtration sub-process step 780b (performed once or multiple times).

Figure 7C:
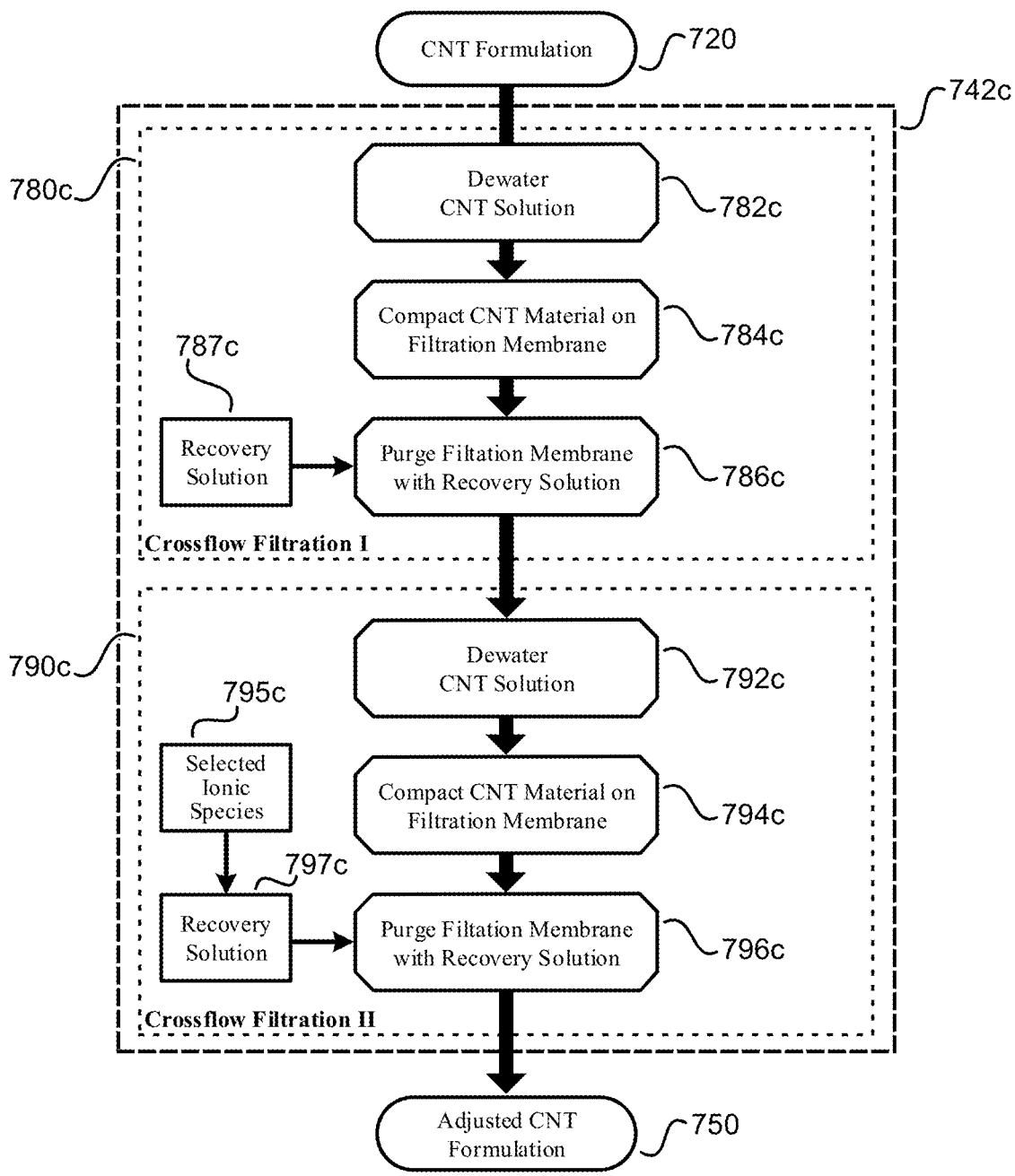
FIG. 7C is a flow chart depicting a second exemplary ionic species adjustment process according to the methods of the present disclosure, which is imagined to be designed to substantially remove a first type of ionic species from a CNT formulation and replace it with a second type of ionic species at a selected concentration level.

FIG. 7C is a flow chart 703 depicting a second exemplary Ionic Species Adjustment Process 742c according to the methods of the present disclosure, which is imagined to be designed to substantially remove a first type of ionic species from CNT Formulation 720 and replace it with a second type of ionic species at a selected concentration level. Second exemplary Ionic Species Adjustment Process 742c is intended to be an expanded and more detailed version of process step 742 in FIG. 7A (as are first and third exemplary Ionic Species Adjustment Processes 742b within FIG. 7B and 742d within FIG. 7D, respectively), which takes CNT Formulation 720 and adjusts the ionic species concentration level within that formulation to realize Adjusted CNT Formulation 750, as described above with respect to FIG. 7A.

Second exemplary Ionic Species Adjustment Process 742c is comprised of two sub-processes: a first Crossflow Filtration sub-process 780c ("Crossflow Filtration I") and a second Crossflow Filtration sub-process 790c ("Crossflow Filtration II"). First Crossflow Filtration sub-process 780c is first used to remove a significant volume of a first ionic species from CNT Formulation 720. This first ionic species is imagined to be present with CNT Formulation 720 subsequent to CNT Processing 715 and Purification 717 steps of FIG. 7A and to be undesired within Adjusted CNT Formulation 750. Then, second Crossflow Filtration sub-process 790b is used to introduce a second ionic species type into CNT Formulation 720 at the target concentration level (as determined in process step 735 in FIG. 7A). In this way, the concentration level of an undesired ionic species is significantly lowered (or, in certain applications, made essentially zero) within CNT Formulation 720 and a desired ionic species is introduced into CNT Formulation 720 and adjusted to the preselected target level (as determined in process step 735 in FIG. 7A).

It should be noted that within FIG. 7C, both first Crossflow Filtration sub-process 780c and second Crossflow Filtration sub-process 790c are depicted, for ease of explanation, as each being performed only a single time. However, as described above within the discussion of FIG. 7A, the methods of the present disclosure are not limited in this regard. Indeed, in some applications first Crossflow Filtration sub-process 780c could be performed multiple times prior to the start of second Crossflow Filtration sub-process 790c. Similarly, second Crossflow Filtration sub-process 790c could also be, within certain applications, performed multiple times subsequent to the conclusion of one or more first Crossflow Filtration sub-process 780c iterations.

As depicted in FIG. 7C, first Crossflow Filtration sub-process 780c is comprised of a plurality of sub-process steps. CNT Formulation 720 is first dewatered in sub-process step 782c such that the CNT material within the formulation is compacted onto a filtration membrane in process step 784c. In this way, a significant volume—or in some cases, substantially all—of any ionic species material present within CNT Formulation 720 is separated from the CNT material, as the ionic species material passes through the filter membrane while the CNT material is compacted onto the filter membrane. In a next sub-process step 786c, the filtration membrane is purged with Recovery Solution 787c. As first Crossflow Filtration sub-process 780c is intended to reduce the concentration level of ionic species within CNT Formulation 720, Recovery Solution 787c is selected to be a low-salt containing material, such as, but not limited to, deionized water. In this way, the compacted CNT material is recovered back into a formulation with a significantly lower ionic species concentration as compared to CNT formulation 720. As described above, first Crossflow Filtration sub-process 780c can be performed a single time, as is depicted in FIG. 7C, or repeated once or more to further reduce the ionic species concentration level present in CNT Formulation 720.

Second Crossflow Filtration sub-process 790c is comprised of a plurality of sub-process steps, similar to those discussed above with respect to first Crossflow Filtration sub-process 780c. Subsequent to processing through first Crossflow Filtration sub-process 780c, CNT Formulation 720 (at list point exhibiting a very low or zero ionic species concentration level) is again dewatered in sub-process step 792c such that the CNT material within the formulation is compacted onto a filtration membrane in process step 794c. In a next sub-process step 796c, the filtration membrane is purged with Recovery Solution 797c. As second Crossflow Filtration sub-process 790c is intended to introduce a desired ionic species at the target ionic species concentration level (as determined within process step 735 of FIG. 7A) into CNT Formulation 720, Recovery Solution 797c is preloaded with a selected volume of the Selected Ionic Species 795c prior to process step 796c. In this way, the compacted CNT material is recovered back into a formulation with along with a volume of ionic species selected to provide the target concentration level within the formulation. As described above, second Crossflow Filtration sub-process 790c can be performed a single time, as is depicted in FIG. 7C, or repeated once or more to further reduce the ionic species concentration level present in CNT Formulation 720.

In this way, a significant volume (or in, some cases, substantially all) of an undesired ionic species present in CNT Formulation 720 can be removed and a desired ionic species added at a selected concentration level using a combination of Crossflow Filtration sub-processes (780c and 790c), resulting in Adjusted CNT Formulation 750, which, within this particular ionic species adjustment process example 703, has a concentration level of desired ionic species set at a desired target level (as determined by process step 735 in FIG. 7A).

It should be noted that while second exemplary Ionic Species Adjustment Process 742c is depicted as using two separate Crossflow Filtration sub-processes (first Crossflow Filtration sub-process 780c followed by a second Crossflow Filtration sub-process 790c), the methods of the present disclosure are not limited in this regard. Indeed, in certain applications the removal of a first undesired ionic species and the introduction of a second desired ionic species into a CNT formulation could be performed within a single crossflow filtration process. In such an operation, sub-process steps analogous to process step 782c and 784c (dewatering of the CNT formulation and compacting of the CNT material onto a filter membrane) could be used to first remove an undesired ionic species from the system, and then sub-process steps analogous to 795c, 797c, and 796c (purging the filter membrane with a recovery solution preloaded with a selected volume of a second desired ionic species) could be used to introduce a desired ionic species into the system immediately subsequent to removing the first undesired ionic species. The depiction of these two sub-process steps as separate Crossflow Filtration sub-processes (780c and 790c) in FIG. 7C is done purely for ease of explanation, and the present disclosure should not be limited in this regard.

Figure 7D:
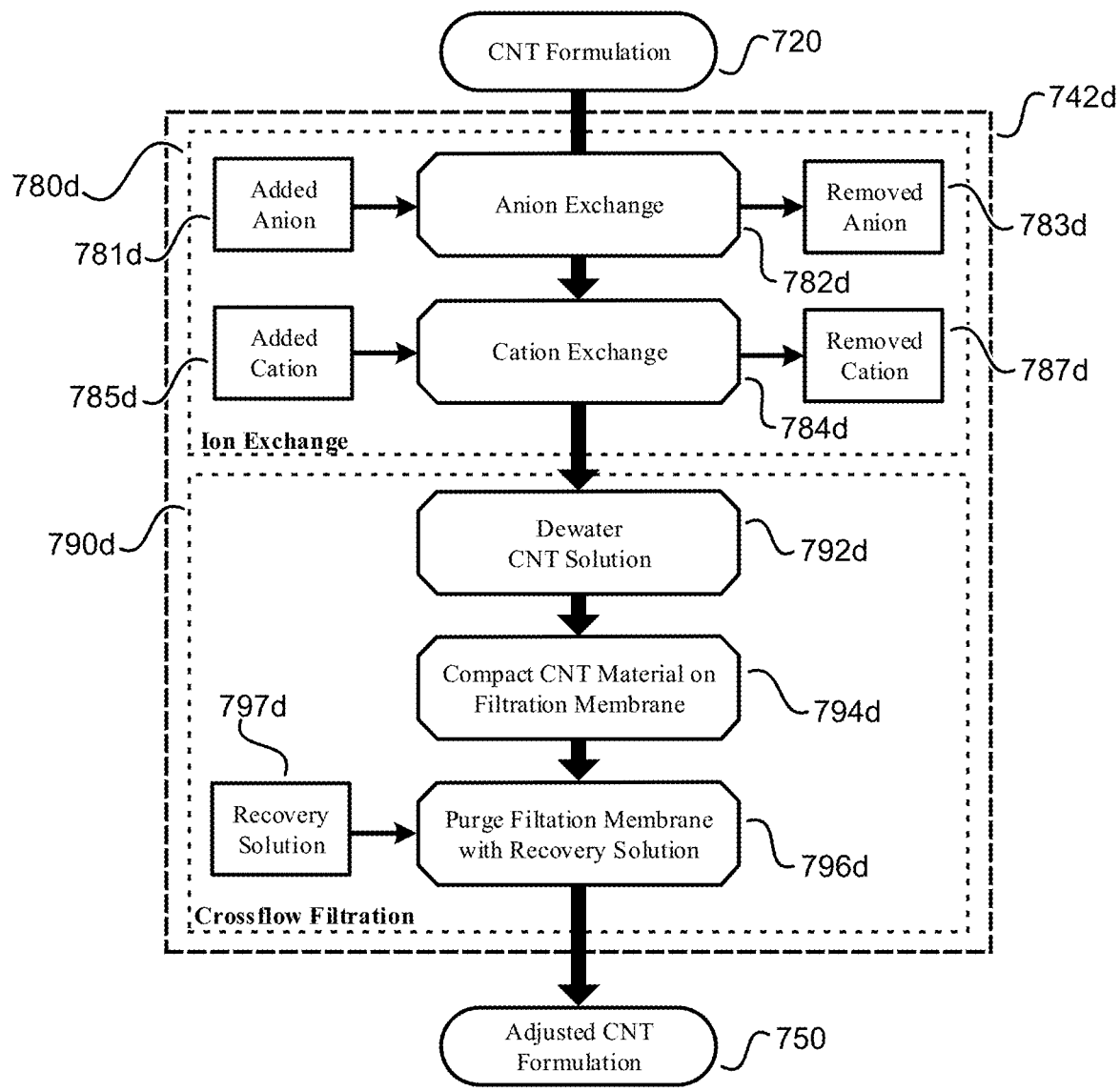
FIG. 7D is a flow chart depicting a third exemplary Ionic Species Adjustment Process according to the methods of the present disclosure, which is imagined to be designed to first exchange an undesired first type of ionic species within a CNT Formulation with a desired second type of ionic species and then lower the concentration level of that second type of ionic species within the formulation to a desired target level.

FIG. 7D is a flow chart 704 depicting a third exemplary Ionic Species Adjustment Process 742d according to the methods of the present disclosure, which is imagined to be designed to first exchange an undesired first type of ionic species within CNT Formulation 720 with a desired second type of ionic species (using Ion Exchange sub-process 780d), and then lower the concentration level of that second type of ionic species within the formulation to a desired target level (using Crossflow Filtration sub-process 790d). Third exemplary Ionic Species Adjustment Process 742d is intended to be an expanded and more detailed version of process step 742 in FIG. 7A (as are first and second exemplary Ionic Species Adjustment Processes 742b within FIG. 7B and 742c within FIG. 7C, respectively), which takes CNT Formulation 720 and adjusts the ionic species concentration level within that formulation to realize Adjusted CNT Formulation 750, as described above with respect to FIG. 7A.

Third exemplary Ionic Species Adjustment Process 742d is comprised of two sub-processes: an Ion Exchange sub-process 780d and a Crossflow Filtration sub-process 790d. Ion Exchange sub-process 780d is first used to replace a first ionic species present within CNT Formulation 720 with a second ionic species. Crossflow Filtration sub-process 790d is then used, in a subsequent sub-process step to reduce the concentration level of the second ionic species within the CNT formulation. Within the present example, this first ionic species is imagined to be present with CNT Formulation 720 subsequent to CNT Processing 715 and Purification 717 steps of FIG. 7A and to be undesired within Adjusted CNT Formulation 750, while the second ionic species is imagine to be the desired ionic species, with a target concentration value determined in process step 735 of FIG. 7A. In this way, the concentration level of an undesired ionic species is significantly lowered (or, in certain applications, made essentially zero) within CNT Formulation 720 and a desired ionic species is introduced into CNT Formulation 720 and adjusted to the preselected target level (as determined in process step 735 in FIG. 7A).

It should be noted that within FIG. 7D, Ion Exchange sub-process 780d and Crossflow Filtration sub-process 790d are depicted, for ease of explanation, as each being performed only a single time. However, as described above within the discussion of FIG. 7A, the methods of the present disclosure are not limited in this regard. Indeed, in some applications Ion Exchange sub-process 780d could be performed multiple times prior to the start of Crossflow Filtration sub-process 790d. Similarly, Crossflow Filtration sub-process 790d could also be, within certain applications, performed multiple times subsequent to the conclusion of one or more Ion Exchange sub-process 780d iterations.

As depicted in FIG. 7D, Ion Exchange sub-process 780d is comprised of a plurality of sub-process steps. Within certain applications, Ion Exchange sub-process 780b comprises a series of individual ion exchange steps, each of which flow CNT Formulation 720 through a resin column containing a specific type of ion exchange resin. These ion exchange steps can target the removal of a specific ion (for example, but not limited to, $FE^{2+}$ or $CA^{2+}$) or a broad category of ions (for example, but not limited to, all anions or all cations). In certain applications, a mixed bed ion exchange can also be used to remove both anions and cations within a single process step.

As Ion Exchange sub-process 780d within third exemplary Ionic Species Adjustment process 742d is imagined to be focused on replacing a first undesired specific ionic species with a second desired specific ionic species within CNT Formulation 720, it is imagined that Anion Exchange sub-process step 782d uses a resin column charged with the desired anion 781d of the second ionic species to first exchange the undesired anion components 783d within CNT Formulation 720 in a first operation. Subsequently, Cation Exchange sub-process step 784d then uses a resin column charged with the desired cation 785d of the second ionic species to exchange the undesired cation components 787d within CNT Formulation 720. As described above, Ion Exchange sub-process 780d can be performed a single time, as is depicted in FIG. 7D, or repeated once or more to further exchange more of the desired ionic species material with the undesired ionic species material within CNT Formulation 720. Further, while FIG. 7D depicts Anion Exchange sub-process step 782d being performed prior to Cation Exchange sub-process step 784d, the methods of the present disclosure are not limited in this regard. Indeed, as described above, in certain applications Cation Exchange sub-process step 784d could be performed prior to Anion Exchange sub-process step 782d. Further, in certain applications both the cation exchange and anion exchange sub-process steps could be performed together using a mixed bed ion exchange process.

Looking now to Crossflow Filtration sub-process 790d, the ionic species concentration level of CNT Formulation 720 is reduced subsequent to the ionic species exchange operation performed by Ion Exchange sub-process 780d. Crossflow Filtration sub-process 790d is comprised of a plurality of sub-process steps. CNT Formulation 720 is first dewatered in sub-process step 792d such that the CNT material within the formulation is compacted onto a filtration membrane in process step 794d. In this way, a significant volume of the desired ionic species material present within CNT Formulation 720 can be separated from the CNT material, as the ionic species material passes through the filter membrane while the CNT material is compacted onto the filter membrane. In a next sub-process step 796d, the filtration membrane is purged with Recovery Solution 797d. As Crossflow Filtration sub-process 790d is intended to reduce the concentration level of ionic species within CNT Formulation 720, Recovery Solution 797d is selected to be a low-salt containing material, such as, but not limited to, deionized water. In this way, the compacted CNT material is recovered back into a formulation with a significantly lower ionic species concentration as was present within the formulation at the conclusion of Ion Exchange sub-process 780d. As described above, Crossflow Filtration sub-process 790d can be performed a single time, as is depicted in FIG. 7D, or repeated once or more to further reduce the ionic species concentration level present in CNT Formulation 720.

In this way, a significant volume (or, in some cases, substantially all) of an undesired ionic species present in CNT Formulation 720 can be removed and a desired ionic species added at a selected concentration level using a combination of an Ion Exchange sub-process 780d and a Crossflow Filtration sub-process 790d, resulting in Adjusted CNT Formulation 750, which, within this particular ionic species adjustment process example 704, has a concentration level of desired ionic species set at a desired target level (as determined by process step 735 in FIG. 7A).

It should be noted that while third exemplary Ionic Species Adjustment Process 742d is depicted as first using an Ion Exchange sub-process 780d followed by a subsequent Crossflow Filtration sub-process 790d, the methods of the present disclosure are not limited in this regard. Indeed, in certain applications an ionic species adjustment process targeted at exchanging one type ionic species for another within a CNT formulation could include only Ion Exchange sub-process step 780d (performed once or multiple times). Within such applications, Ion Exchange sub-process step 780d could be set up, for example, such that the concentration level of the second ionic species within CNT Formulation 720 is already at the target level (as determined by process step 735 in FIG. 7A) at the conclusion of the sub-process, and no further concentration level adjustment required.

FIGS. 7B, 7C, and 7D are provided within the present disclosure and have been described in detail above in order to illustrate three different exemplary ionic species concentration adjustment processes (702, 703, and 704, respectively) suitable for use within the nanotube fabric formation method detailed within FIG. 7A. Specifically, these three exemplary adjustment processes (702, 703, 704) are intended as non-limiting examples of process step 742 within FIG. 7A. It should be noted that a nanotube fabric formation process according to the method detailed in FIG. 7A could include one or more of these exemplary ionic species adjustment processes or variations of these exemplary ionic species adjustment processes as best befits the needs of a particular application. It is preferred, therefore, that the present disclosure not be limited to the specific examples presented herein.

Figure 8:
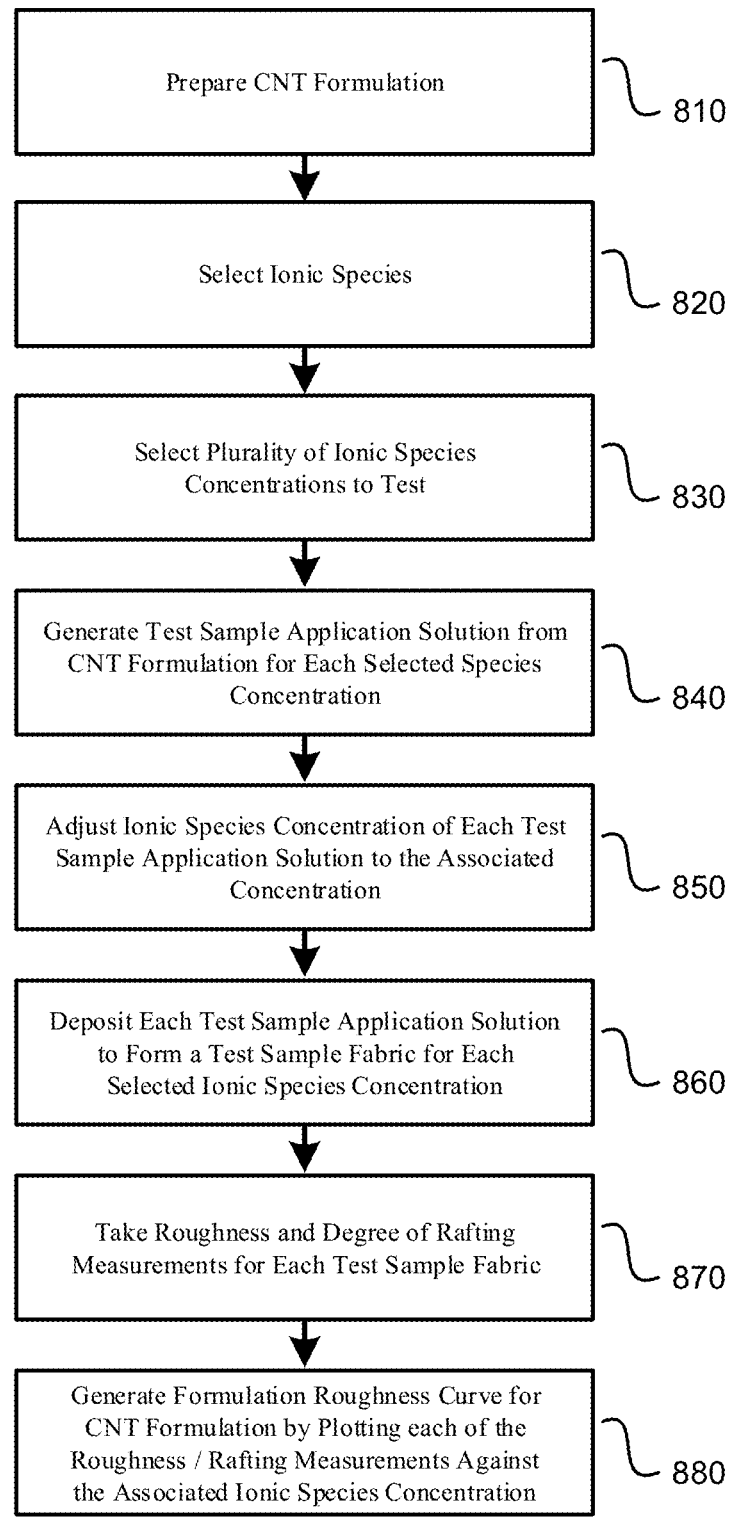
FIG. 8 is a flow chart detailing a method according to the present disclosure for generating a nanotube formulation roughness curve for a particular nanotube formulation with a selected ionic species.

FIG. 8 is a flow chart detailing a method according to the present disclosure for generating a nanotube formulation roughness curve for a particular nanotube formulation with a selected ionic species (as is required, for example, within process step 735 of FIG. 7A). In first method step 710, a CNT Formulation is prepared with the properties required (e.g., nanotube type, nanotube density, functionalization parameters, etc.) for a given application, according to the methods described in detail above (for example, CNT Formulation 720 within FIG. 7A). In a next method step 820, the type of ionic species to be used to control either or both the surface roughness of a nanotube fabric or the degree of rafting within a nanotube fabric formed with this CNT formulation is selected. As described above (for example, with respect to the discussion of FIG. 5 above), a plurality of ionic species are well suited for controlling or otherwise selecting surface roughness and/or degree of rafting within a nanotube fabric according to the methods of the present disclosure. As will be described below, the method of FIG. 8 characterizes this CNT formulation with respect to the selected ionic species to realize a CNT formulation roughness curve (for example, 730 in FIG. 7A) for the particular CNT formulation and ionic species that can be used to select a concentration level of the ionic species within the CNT formulation to realize a nanotube fabric with desired surface roughness and degree of rafting properties.

Within next method step 830, a plurality of test ionic species concentration levels are selected to test. As described within the discussion of FIG. 6, these test concentration levels will be used to generate data points to form the nanotube formulation roughness curve. The test concentration levels should be selected to provide a range of surface roughness values and degrees of rafting within nanotube fabrics formed from CNT formulations using the test ionic species concentration values. Within the exemplary nanotube formulation roughness curves of FIGS. 10A-10D, four test ionic species concentration levels were used to generate four data points to define the curves (e.g., 610 in FIG. 6). However, the methods of the present disclosure are not limited in this regard. Indeed, any number of data points can be used to produce a nanotube formulation roughness curve, including, but not limited to, 2, 3, 4, 5, 10, 15, 20, 50, or 100. This is to say, the number of data points generated and used to create a nanotube formulation roughness curve is only limited by the specific needs of an application.

Within next method step 840, the CNT Formulation prepared in method step 810 is used to produce a plurality of identical test samples for each of the test ionic species concentration levels selected in method step 830. In next method step 850, the concentration level of the selected ionic species (selected in method step 820) within each of the CNT Formulation test samples is adjusted—using, for example, the methods described in detail within FIGS. 7A-7D above—to one of the ionic species concentration test levels selected in method step 830. In this way, a plurality of CNT formulations is created, with each CNT formulation exhibiting a different ionic species concentration level according to plurality of test ionic species concentration levels selected in method step 830.

In next method step 860, each of the adjusted CNT formulation samples is deposited (by, for example, a spin coating operation) to form a test sample nanotube fabric for each of the plurality of test ionic species concentration levels selected in method step 830. Methods for forming nanotube fabrics from CNT formulations have been described in detail above and are also disclosed in more detail within the incorporated references. In next method step 870, each of the test sample nanotube fabrics is analyzed to quantify both the surface roughness of the fabric (measured as the RMS roughness within examples 1-14) and degree of rafting (measured as the standard deviation of the positional orientation of nanotube elements within examples 1-14). Within next method step 880, these measured values (each set associated with one of the plurality of ionic species concentration levels selected in method step 830) are used to generate a nanotube formulation roughness curve, as described within the discussion of FIG. 6 above. As discussed in detail above, according to the methods of the present disclosure, this nanotube formulation roughness curve can then be used to define a utilizable range corresponding to a desired set of parameters (with respect to surface roughness and degree of rafting) within a nanotube fabric, and this utilizable range then used to aid in the selection of a target ionic species concentration level to be used within a nanotube fabric formation process (e.g., FIG. 7A).

Within method step 870 of FIG. 8, the surface roughness of a plurality of test nanotube fabrics is quantified. Within examples 1-14 of the present disclosure (discussed in detail below), an image analysis tool (Gwyddion version 2.50) was used to analyze AFM images of the sample nanotube fabrics generated. Gwyddion is a modular program (available online at the time of the writing of this disclosure) for SPM (scanning probe microscopy) data visualization and analysis and is primarily intended for the analysis of height fields obtained by scanning probe microscopy techniques. Within examples 1-14, the AFM images were collected using a Veeco Instruments, Inc. D3100 AFM using a Nanosensors™ PointProbe® Plus Non-Contact/Tapping Mode—High Resonance Frequency (PPP-NHC) probe with a scan size of 2.5 um with 512 points per line in tapping mode. The directionality measurements within examples 1-14 were performed using similar visual analysis tools on SEM images of sample nanotube fabrics. For these directionality measurements, an FEI XL30 TMP scanning electron microscope was used to collect images at 10 kV with a spot size of 3 and a working distance of 5 mm.

It should be noted that a plurality of analysis tools and techniques are presently available for analyzing and quantifying the roughness or smoothness of a material layer at a nanoscopic level (that is, on the order of a nanometer) as well as for analyzing the directionality of high aspect ratio nanoscopic elements within a material layer. Such tools and techniques are well known to those skilled in the art. It is preferred, therefore, that the methods of the present disclosure not be limited to the particular analysis and quantification methods/tools used within the examples of the present disclosure with respect to method step 870 of FIG. 8, as these methods and tools are intended purely as non-limiting examples.

FIG. 9 is a table 900 summarizing the data and results presented in examples 1-14, with each row listing the parameters used for and results taken from each example, as indicated in the first column ("Example #"). Within each of examples 1-14, a sample nanotube fabric was formed using the method detailed in FIG. 7A in order to provide data points for at least one of four nanotube fabric roughness curve (FIGS. 10A-10D) according to the method of FIG. 8. The particular CNT formulation, type of ionic species, and the ionic species concentration level used within each example is listed within the second, third, and fourth columns of table 900, respectively. Further, for the resulting nanotube fabric of each example, the RMS surface roughness and the standard deviation of the positional orientation of the nanotube elements within the fabric (indicative of the degree of rafting within the fabric) are listed in the fifth and sixth columns of table 900, respectively. Finally, the relevant figures documenting the test data produced within each example are listed in the seventh column of table 900.

Figure 10A:
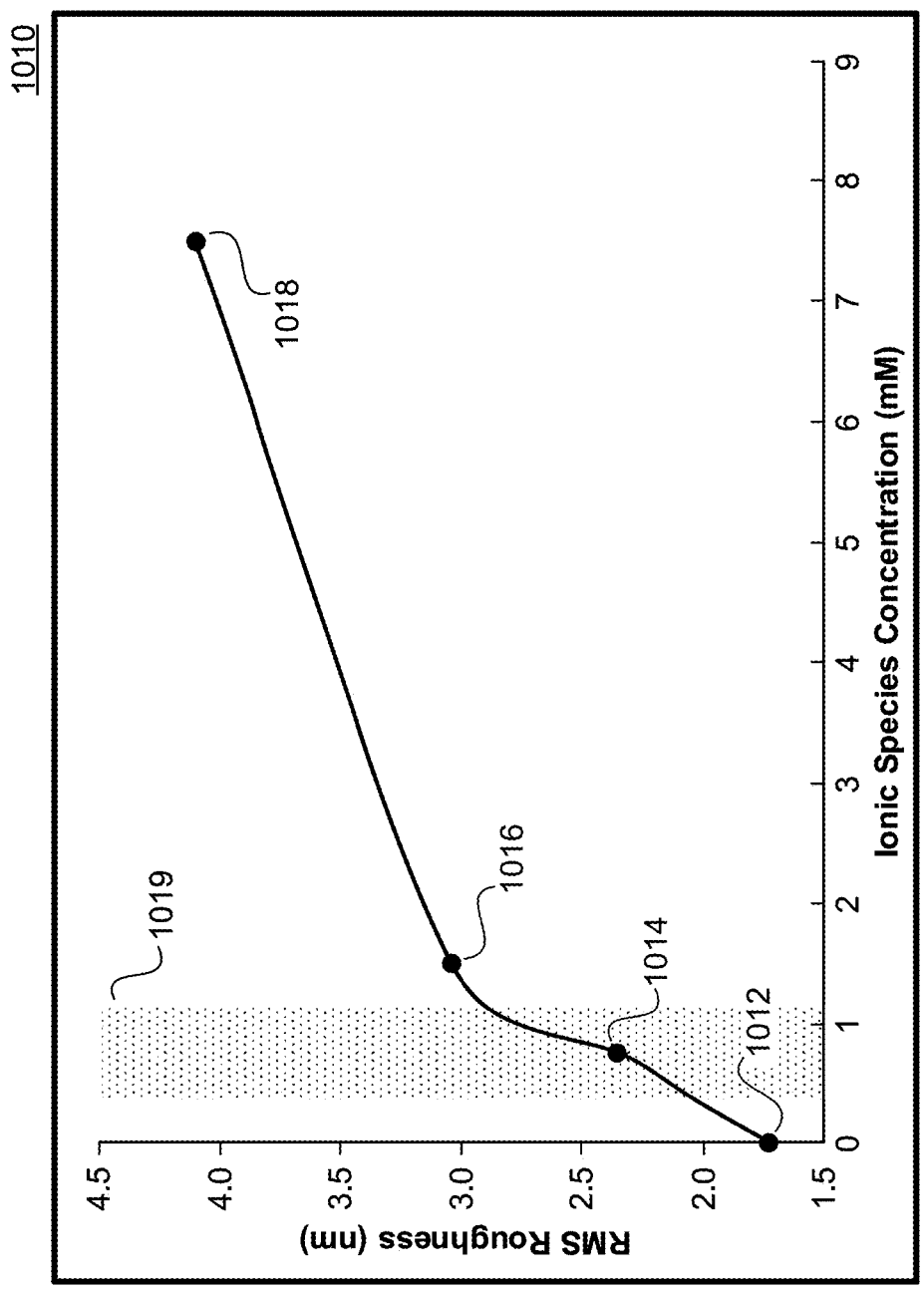
FIG. 10A is a nanotube formulation roughness curve according to the methods of the present disclosure corresponding to nanotube formulation "X" (as defined within the present disclosure) used with ammonium nitrate ($NH_4NO_3$) as an ionic species.
Figure 10C:
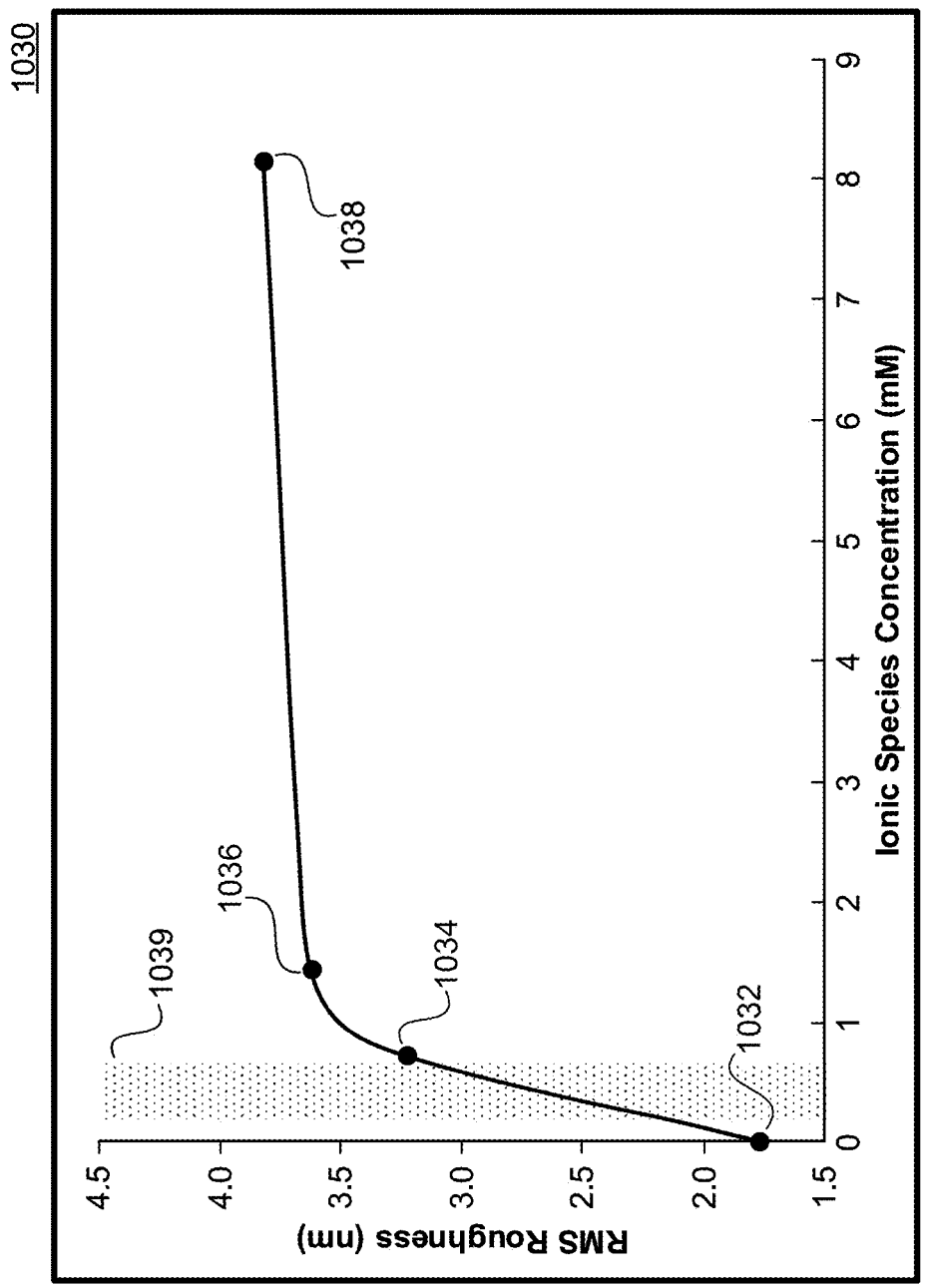
FIG. 10C is a nanotube formulation roughness curve according to the methods of the present disclosure corresponding to nanotube formulation "Y" (as defined within the present disclosure) used with ammonium nitrate ($NH_4NO_3$) as an ionic species.
Figure 10D:
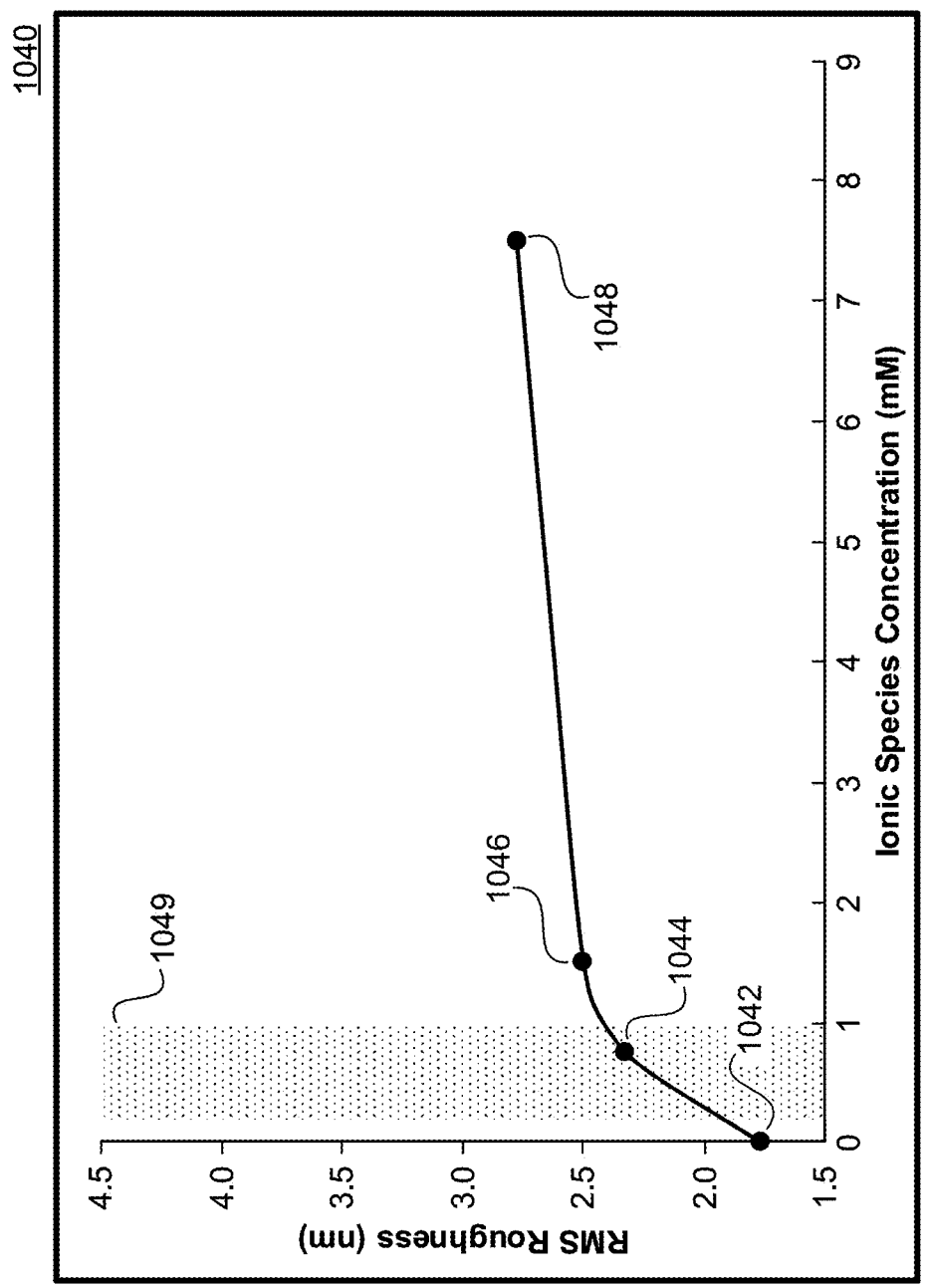
FIG. 10D is a nanotube formulation roughness curve according to the methods of the present disclosure corresponding to nanotube formulation "Y" (as defined within the present disclosure) used with tetramethyl ammonium formate (TMA Fm) as an ionic species.

As summarized in table 900, within examples 1-14, two nanotube formulations were used ("X" and "Y"), each with two types of ionic species (ammonium nitrate and tetramethyl ammonium formate) to form a plurality of sample nanotube fabrics which were used to realize four different nanotube fabric roughness curves (FIGS. 10A-10D). As will be discussed below, FIG. 10A is a nanotube fabric roughness curve 1010 which corresponds to nanotube formulation "X" for concentrations of ammonium nitrate ($NH_4NO_3$). FIG. 10B is a nanotube fabric roughness curve 1020 which corresponds to nanotube formulation "X" for concentrations of tetramethyl ammonium formate (TMA Fm). FIG. 10C is a nanotube fabric roughness curve 1030 which corresponds to nanotube formulation "Y" for concentrations of ammonium nitrate ($NH_4NO_3$). FIG. 10D is a nanotube fabric roughness curve 1040 which corresponds to nanotube formulation "Y" for concentrations of tetramethyl ammonium formate (TMA Fm).

The nanotube elements used within nanotube formulation "X" (used in examples 1-7) were predominately multi-walled carbon nanotubes, which had a significant plurality of kinks and bends and exhibited a median length of 132 nm and a 95th percentile length of 260 nm. The nanotube elements used within nanotube formulation "Y" (used in examples 8-14) were predominately singled walled carbon nanotubes, which were relatively straight (that is, have few bends of kinks) and exhibited a median length of 187 nm and a 95th percentile length of 494 nm. Examples of nanotube elements used within nanotube formulation "X" are shown in the TEM images of FIGS. 4C and 4D and discussed above within the discussion of those figures. Examples of nanotube elements used within nanotube formulation "Y" are shown in the TEM images of FIGS. 4E and 4F and discussed above within the discussion of those figures.

Both nanotube formulation "X" and nanotube formulation "Y" were first realized through the following method. Fifty grams of raw (that is, unfunctionalized) carbon nanotubes (CNTs) of the selected type (as discussed above) were refluxed in microelectronics grade nitric acid. Supplies of raw nanotubes (such as were used in the examples of the present disclosure and depicted in FIGS. 4A-4E) may be purchased commercially from a number of vendors (e.g., Thomas Swan, Nano-C, and Zeon Corporation). The concentration of the nitric acid, the reflux time, and temperature were optimized based on the starting CNT material. For example, CNTs were refluxed in concentrated nitric acid (40%) at 120° C. for 4-14 hours. After the nitric acid reflux step, the CNT suspension in acid was diluted in 0.35 to 3% nitric acid solution (8-16 L) and taken through several passes of cross-flow filtration (CFF). First few passes of CFF (hereinafter called CFF1) may remove the acid and soluble metal salts in the suspension. The pH of the suspension during the CFF1 steps was maintained at 1+/−0.3 by recovering the material in 0.35-3% nitric acid after each step. Typically, five to eleven CFF1 steps were performed. After the CFF1 steps, the retentate was collected in DI water and the pH of the nanotube:DI water suspension was increased to 8+/−0.2 with ammonium hydroxide (concentration 29%) and sonicated. This liquid was taken through another set of CFF passes (hereinafter referred as CFF2). CFF2 may remove the amorphous carbon impurities in the solution. After the CFF2 process, the retentate was collected in DI water and the pH of the nanotube:DI water liquid was adjusted to pH 8+/−0.2 and the solution was sonicated for 120 minutes in a chilled sonicator bath (4-5° C.).

At this step of the process a desired concentration or optical density of the CNT formulation can be achieved by controlling the volume of the DI water used to recover the retentate from the CFF2 membrane. For example if the optical density of the CNT formulation before the last CFF2 step is 2 and the volume is 2 L, then a recovery volume of 1 L can lead to an optical density close to 4 assuming there is negligible loss in optical density through the permeate at this point. Similarly, if the optical density of the CNT formulation before the last CFF2 step is 2 and the volume is 16 L, then a recovery volume of 1 L can lead to a CNT formulation of optical density 32. The concentration of the CNT formulation (optical density) that can be practically achieved is dependent on, but is not limited to, the starting CNT charge used in the reaction, the reaction conditions, number of CFF steps, CFF membrane pore size, CFF membrane surface area, and pH.

Finally, the formulation was centrifuged two or three times at about 70000-100000 g for about 20-30 min each. In certain cases, the pH of the formulation was adjusted to 8+/−0.2 in between the centrifugation passes which may remove residual metal or carbon nanoparticles in the liquid by sedimentation. After the centrifugation step, the supernatant was collected and used as the final purified nanotube formulation. The concentration of the final nanotube application solution depends on the centrifugation conditions used. Typically for a spin coat application, CNT solutions with an optical density of 10-100 measured at 550 nm wavelength and a pH of 7+/−0.5 were used.

Further, within examples 2-8 and 9-24 and, a selected ionic species (ammonium nitrate for examples 2-4 and 9-11, and tetramethyl ammonium formate for examples 5-7 and 12-14) was introduced to the purified nanotube formulation, and the concentration level of the selected ionic species adjusted (as described within the discussion of FIGS. 7A-7D, above) to the selected test concentration level for each example. Within examples 1 and 8, the ionic species concentration was selected to be essentially zero. Within each example, the adjusted nanotube formulation was then spun coat over a silicon dioxide substrate to form a nanotube fabric layer, approximately 20 nm thick. Specifically, four spin coating operations were performed to form the nanotube fabric layers of examples 1-7, and three spin coating operation were performed to form the nanotube fabric layers of examples 8-14.

For all operations, the spin coating operations were as follows. A raw wafer was pre-baked on a 250° C. hot plate for five minutes. After cooling, the wafer was placed in spin-coat tool and underwent a pre-wet step where approximately 3 mL of de-ionized water was dispensed onto the wafer, and then spun for approximately 3 s and slung off at 280 rpm. After this pre-wet step, approximately 3 ml of the adjusted solution was dispensed onto the wafer while the wafer was rotated at 60 rpm. Following this solution dispensing step, the wafer then went through a series of steps with various spin speeds (35-180 rpm) to ensure the solution was spread evenly across the wafer during the spin coat process. Finally, the spin speed was increased up to 2000 rpm for ten seconds. The wafer was placed on a 250° C. hot plate for three and a half minutes between each spin coating operation. After a cool down cycle, the entire process was repeated such as to apply the desired number of coats of the application solution over the wafer.

FIG. 10A shows a nanotube formulation roughness curve 1010 according to the methods of the present disclosure corresponding to nanotube formulation "X" (as defined above) used with ammonium nitrate ($NH_4NO_3$) as an ionic species. The curve shown in nanotube formulation roughness curve 1010 is drawn through four data points: 1012 provided by example 1, 1014 provided by example 2, 1016 provided by example 3, and 1018 provided by example 4. As described above with respect to FIG. 6, a utilization range 1019 is drawn to indicate the range of ionic species concentrations (approximately 0.4 mM-1.1 mM) that will provide a nanotube fabric within the given parameters of an exemplary application used herein. For the nanotube formulation roughness curve 1010 of FIG. 10A, the parameters of this exemplary application are imagined to be a nanotube fabric with an RMS roughness of less than 2.8 nm and a standard deviation of orientation of approximately 20° or higher (representative of a substantially low degree of rafting).

FIG. 10B shows a nanotube formulation roughness curve 1020 according to the methods of the present disclosure corresponding to nanotube formulation "X" (as defined above) used with tetramethyl ammonium formate (TMA Fm) as an ionic species. The curve shown in nanotube formulation roughness curve 1020 is drawn through four data points: 1022 provided by example 1, 1024 provided by example 5, 1026 provided by example 6, and 1028 provided by example 5. As described above with respect to FIG. 6, a utilization range 1029 is drawn to indicate the range of ionic species concentrations (approximately 0.4 mM-1.5 mM) that will provide a nanotube fabric within the given parameters of an exemplary application used herein. For the nanotube formulation roughness curve 1020 of FIG. 10B, the parameters of this exemplary application are imagined to be a nanotube fabric with an RMS roughness of less than 2.2 nm and a standard deviation of orientation of approximately 27° or higher (representative of a substantially low degree of rafting).

FIG. 10C shows a nanotube formulation roughness curve 1030 according to the methods of the present disclosure corresponding to nanotube formulation "Y" (as defined above) used with ammonium nitrate ($NH_4NO_3$) as an ionic species. The curve shown in nanotube formulation roughness curve 1030 is drawn through four data points: 1032 provided by example 8, 1034 provided by example 9, 1036 provided by example 10, and 1038 provided by example 11. As described above with respect to FIG. 6, a utilization range 1039 is drawn to indicate the range of ionic species concentrations (approximately 0.1 mM-0.6 mM) that will provide a nanotube fabric within the given parameters of an exemplary application used herein. For the nanotube formulation roughness curve 1030 of FIG. 10C, the parameters of this exemplary application are imagined to be a nanotube fabric with an RMS roughness of less than 3.1 nm and a standard deviation of orientation of approximately 26° or higher (representative of a substantially low degree of rafting).

FIG. 10D shows a nanotube formulation roughness curve 1040 according to the methods of the present disclosure corresponding to nanotube formulation "Y" (as defined above) used with tetramethyl ammonium formate (TMA Fm) as an ionic species. The curve shown in nanotube formulation roughness curve 1040 is drawn through four data points: 1042 provided by example 8, 1044 provided by example 12, 1046 provided by example 13, and 1048 provided by example 14. As described above with respect to FIG. 6, a utilization range 1049 is drawn to indicate the range of ionic species concentrations (approximately 0.1 mM-1.0 mM) that will provide a nanotube fabric within the given parameters of an exemplary application used herein. For the nanotube formulation roughness curve 1040 of FIG. 10D, the parameters of this exemplary application are imagined to be a nanotube fabric with an RMS roughness of less than 2.4 nm and a standard deviation of orientation of approximately 27° or higher (representative of a substantially low degree of rafting).

Figure 11:
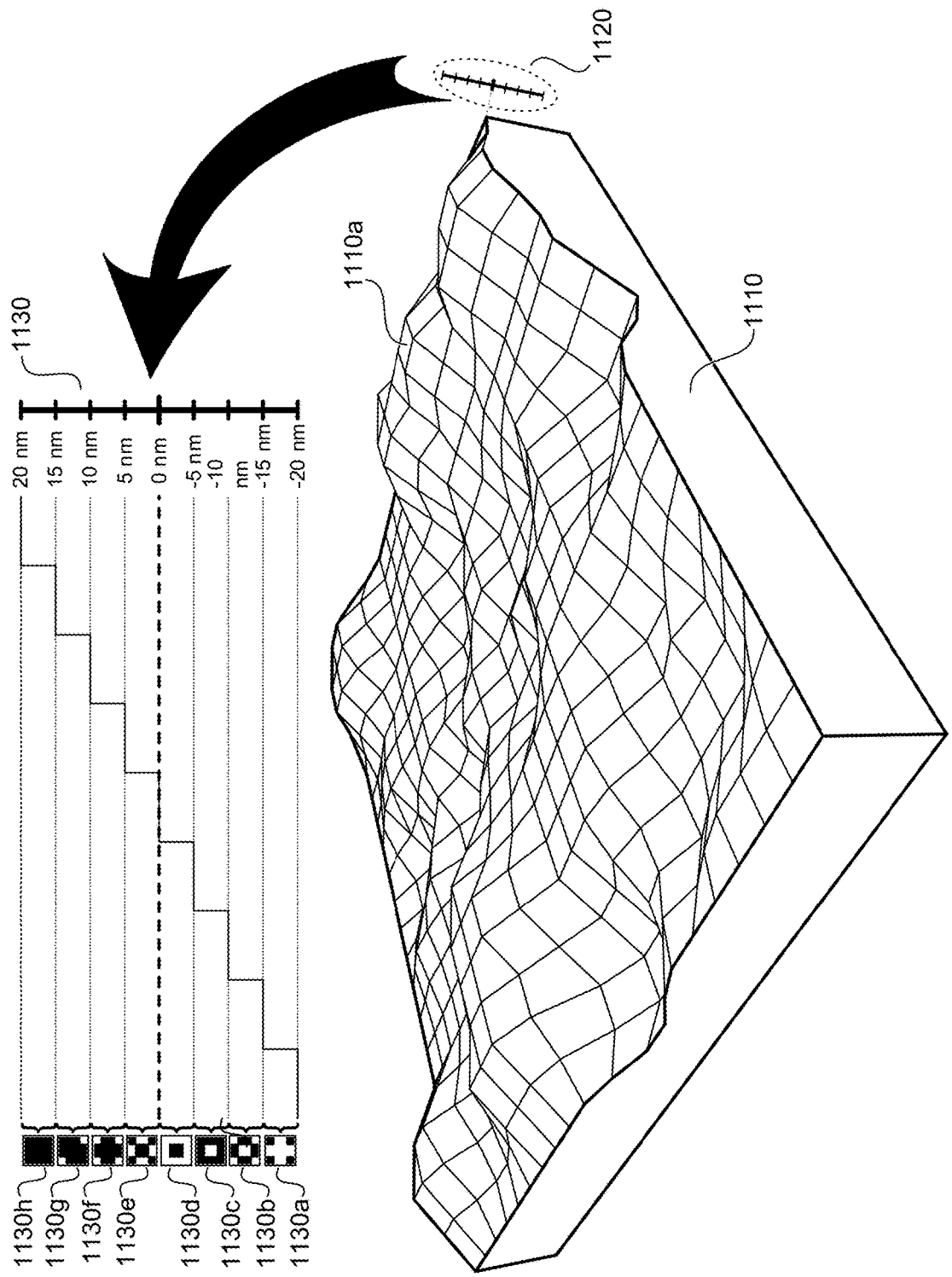
FIG. 11 is a diagram illustrating a material layer height mapping method used to illustrate the surface roughness of nanotube fabrics formed within examples 1-14.

FIG. 11 is a diagram illustrating a material layer height mapping method used to illustrate the surface roughness of nanotube fabrics formed within examples 1-14. This material layer height mapping method was used to produce FIGS. 12B, 13B, 14B, 15B, 16B, 17B, 18B, 19B, 20B, 21B, 22B, 23B, 24B, and 25B, which graphically illustrate a topographical view of AFM images taken of the nanotube fabrics in each of examples 1-14. As described above with respect to method step 870 of FIG. 8, an AFM image was produced for each of the nanotube fabrics formed in examples 1-14. These AFM images were then visually analyzed, as described above, to realize a 512×512 table of numerical height values for the nanotube fabric surface. The material layer height mapping method illustrated in FIG. 11 then reduced this 512×512 table of height values to a 128×128 table of height values by first organizing the values with the 512×512 table into 4 element (2×2) groups, averaging the four values within each group, then using that average value to represent the four original elements. Each of these averaged values was then quantized (as illustrated in FIG. 11) and assigned a 4×4 pixel tile 1130a-1130f. These 4×4 pixel tiles 1130a-1130f were then plotted to graphically represent the surface of each nanotube fabric (e.g., FIG. 12B).

Within FIG. 11, a contoured material layer 1110 is used represent the sample nanotube fabrics of examples 1-14. Measuring ruler 1120 is used to the indicate the height of the material surface 1110a falls above or below nominal surface plane (analogous to horizontal surface line 230 and horizontal surface line 330 in FIGS. 2B and 3B, discussed above). This ruler is then used to generate quantization tile map 1130. Within examples 1-14, a range of +/−20 nm above or below the nominal surface plane of the fabric was sufficient to include all of the values measured from the AFM images produced. As such, eight tiles 1120a-1130f were used to represent 5 nm ranges between −20 nm and 20 nm, as indicated in FIG. 11. In this way, a black line plot that was visually representative of the nanotube fabric surfaces could be realized in order to illustrate differing surface textures of nanotube fabrics within the present disclosure.

It should be noted that the height mapped topographical images of FIGS. 12B, 13B, 14B, 15B, 16B, 17B, 18B, 19B, 20B, 21B, 22B, 23B, 24B, and 25B are intended for visual illustration of comparative nanotube fabric surface textures within the present disclosure only. The RMS roughness measurements within examples 1-14 (summarized within the fifth column of table 900 in FIG. 9, and used to produce nanotube fabric roughness curves 1010, 1020, 1030, and 1040 in FIGS. 10A, 10B, 10C, and 10D, respectively) were all calculated from visual analysis of the 512×512 AFM images produced for each of the nanotube fabrics within those examples, as is explained in detail with respect above with respect to method step 870 of FIG. 8.

Example 1

Figure 12A:
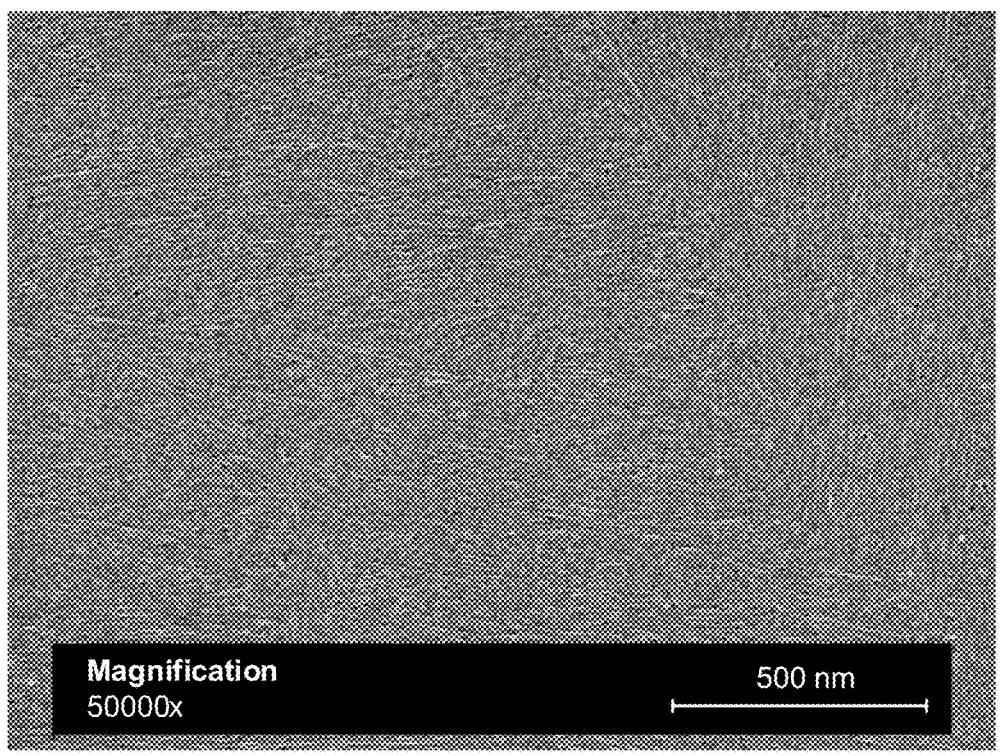
FIG. 12A is an SEM image illustrating the resulting nanotube fabric within example 1 of the present disclosure.
Figure 12B:
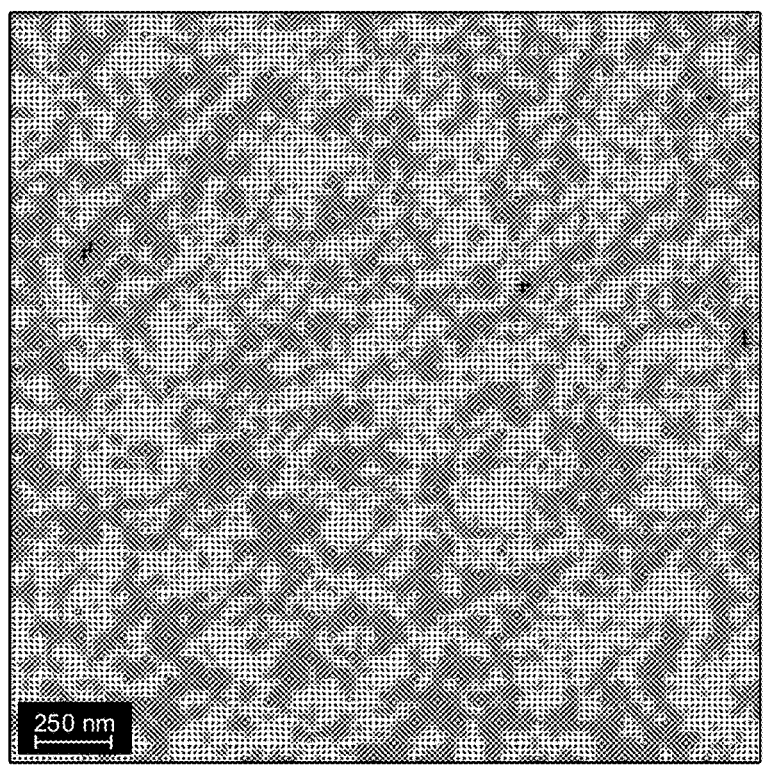
FIG. 12B is a topographical plot of the surface of the resulting nanotube fabric within example 1 of the present disclosure.
Figure 12C:
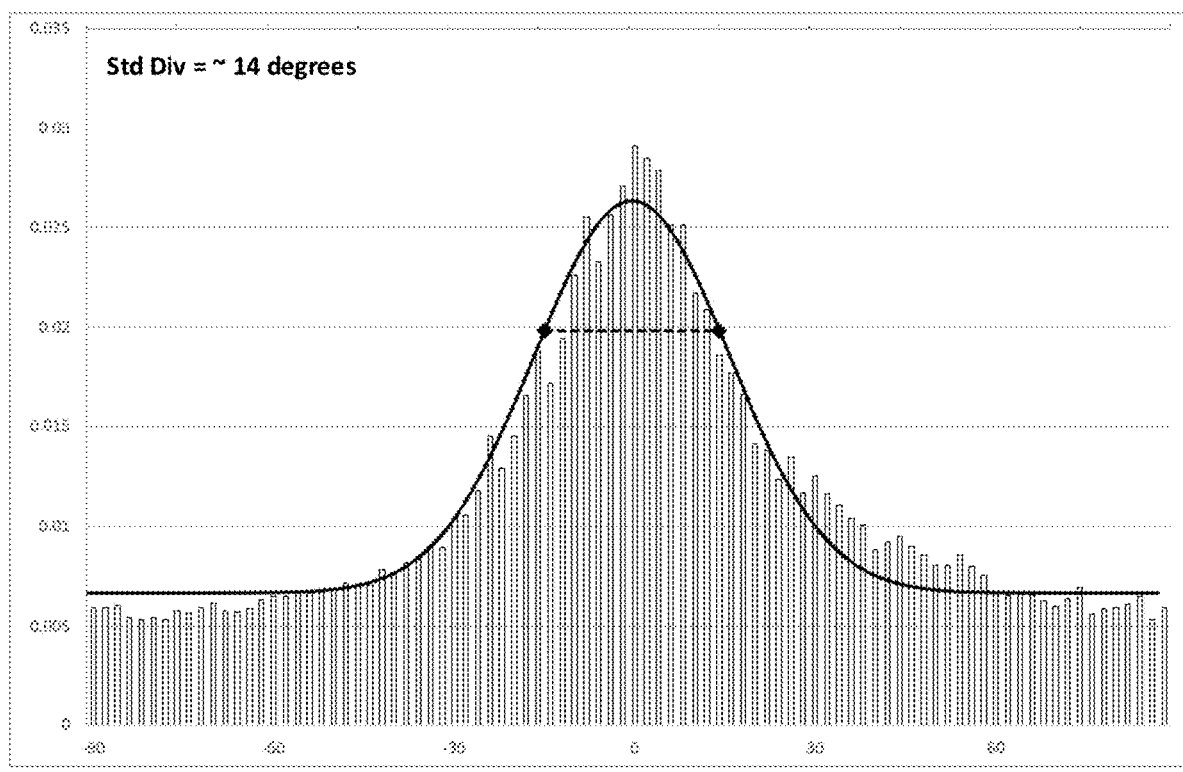
FIG. 12C is a normalized histogram plotting the positional orientation frequency of the nanotube elements within the resulting nanotube fabric within example 1 of the present disclosure.

FIGS. 12A-12C illustrate the surface roughness and degree of rafting within a nanotube fabric produced using the methods of the present disclosure (as described in detail above) in accordance with the parameters of example 1. The nanotube fabric of example 1 was formed by taking a sample of nanotube formulation "X" (formulated as described in detail above), adjusting the nanotube formulation to have an ionic species concentration level of substantially zero (as described in detail with respect to FIGS. 7A-7D above), then performing four spin coating operations of the adjusted nanotube formulation over a silicon wafer (again, as described in detail above) to form a nanotube fabric approximately 20 nm thick. FIG. 12A is an SEM image 1201 illustrating the resulting nanotube fabric, FIG. 12B is a topographical plot 1202 of the surface of the resulting nanotube fabric, and FIG. 12C is a normalized histogram 1203 plotting the positional orientation frequency of the nanotube elements as shown within SEM image 1201. As listed in FIG. 9, the nanotube fabric formed within example 1 has an RMS roughness of 1.72 nm and the standard deviation of the nanotube positional orientation within the fabric was approximately 14° (indicating moderate rafting within the fabric). The measurements from this fabric, formed from nanotube formulation "X" with essentially no ionic species present within the formulation, were used to provide data point 1012 in FIG. 10A and 1022 in FIG. 10B.

Example 2

Figure 13A:
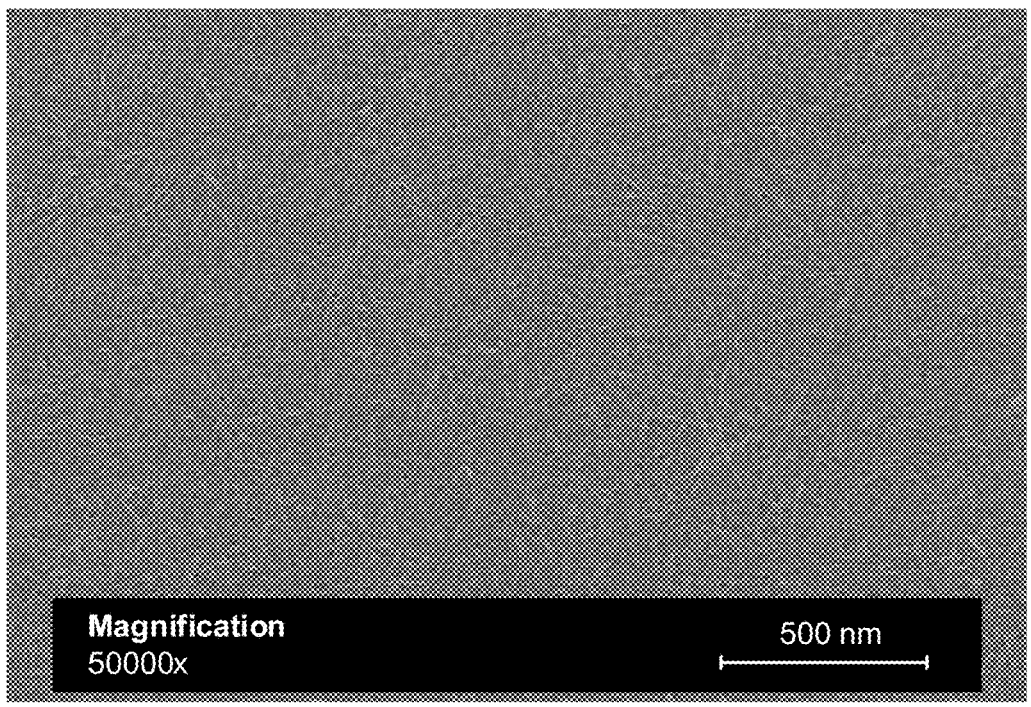
FIG. 13A is an SEM image illustrating the resulting nanotube fabric within example 12 of the present disclosure.
Figure 13B:
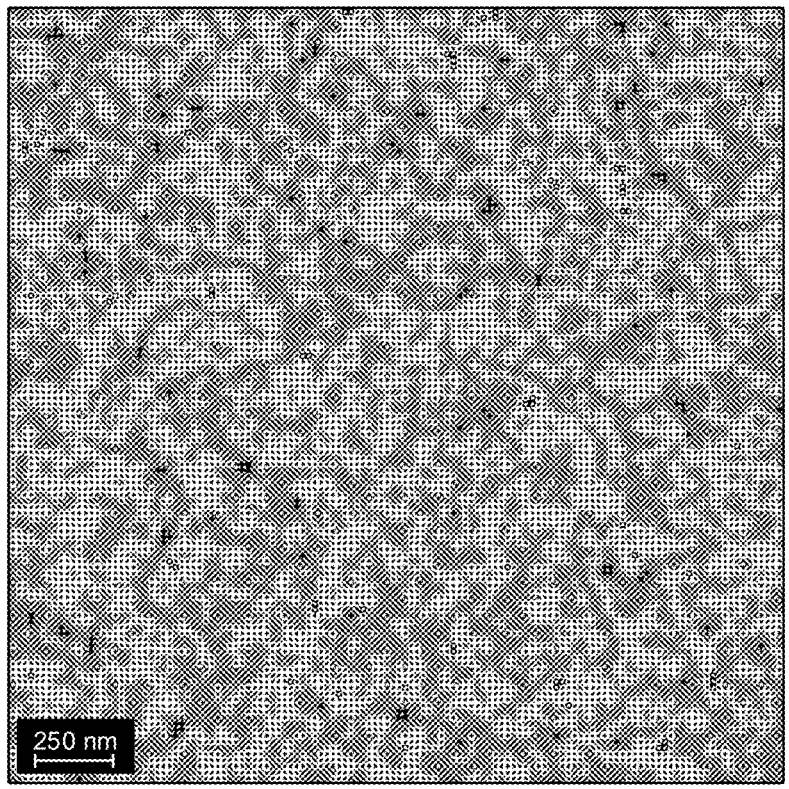
FIG. 13B is a topographical plot of the surface of the resulting nanotube fabric within example 2 of the present disclosure.
Figure 13C:
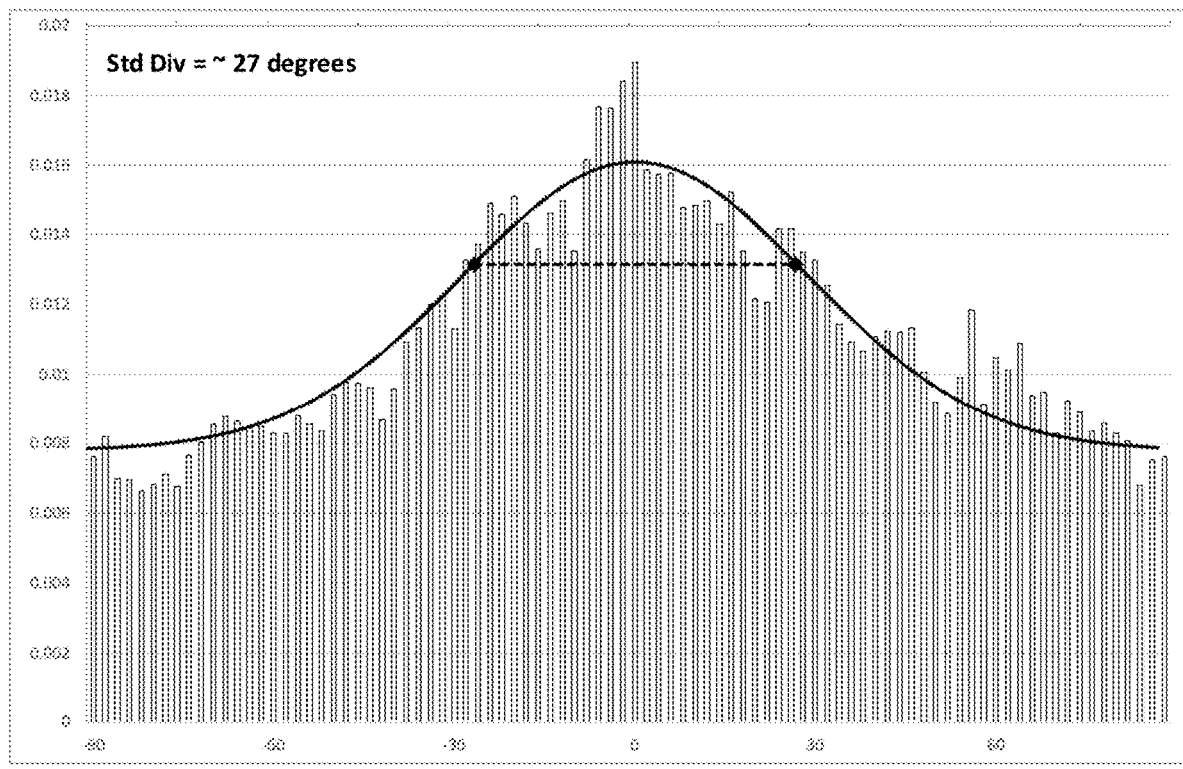
FIG. 13C is a normalized histogram plotting the positional orientation frequency of the nanotube elements within the resulting nanotube fabric within example 2 of the present disclosure.

FIGS. 13A-13C illustrate the surface roughness and degree of rafting within a nanotube fabric produced using the methods of the present disclosure (as described in detail above) in accordance with the parameters of example 2. The nanotube fabric of example 2 was formed by taking a sample of nanotube formulation "X" (formulated as described in detail above), adjusting the nanotube formulation to have an ammonium nitrate ($NH_4NO_3$) concentration level of approximately 0.75 mM (as described in detail with respect to FIGS. 7A-7D above), then performing four spin coating operations of the adjusted nanotube formulation over a silicon wafer (again, as described in detail above) to form a nanotube fabric approximately 20 nm thick. FIG. 13A is an SEM image 1301 illustrating the resulting nanotube fabric, FIG. 13B is a topographical plot 1302 of the surface of the resulting nanotube fabric, and FIG. 13C is a normalized histogram 1303 plotting the positional orientation frequency of the nanotube elements as shown within SEM image 1301. As listed in FIG. 9, the nanotube fabric formed within example 2 has an RMS roughness of 2.36 nm and the standard deviation of the nanotube positional orientation within the fabric was approximately 27° (indicating a moderately low degree of rafting within the fabric). The measurements from this fabric, formed from nanotube formulation "X" with an ammonium nitrate ($NH_4NO_3$) concentration level of approximately 0.75 mM, were used to provide data point 1014 in FIG. 10A.

Example 3

Figure 14A:
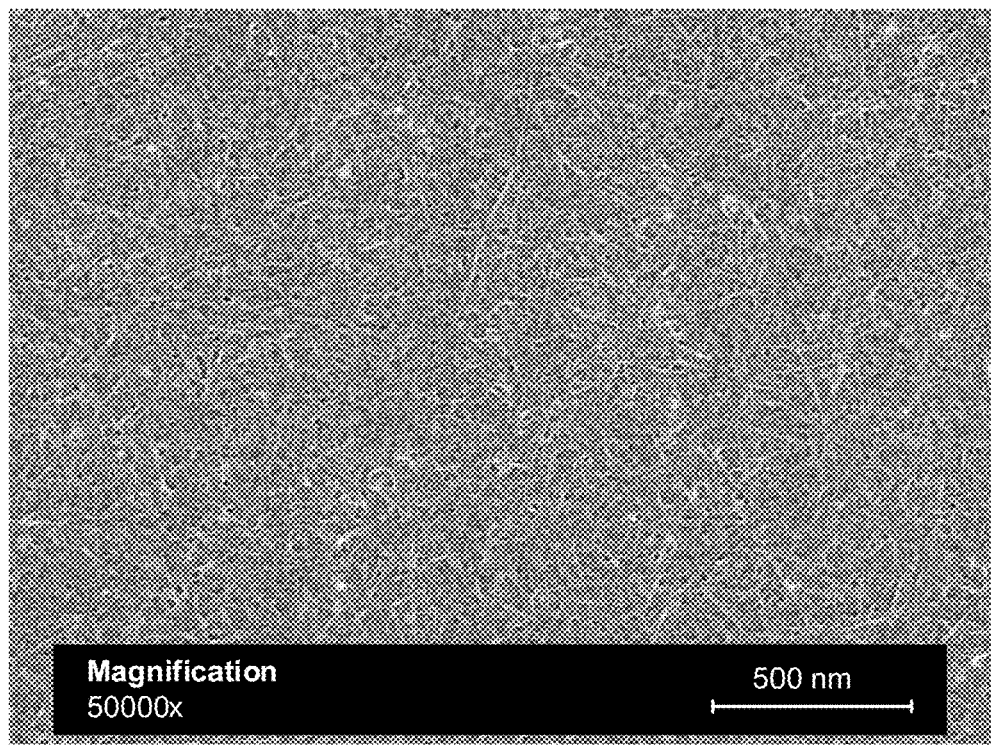
FIG. 14A is an SEM image illustrating the resulting nanotube fabric within example 3 of the present disclosure.
Figure 14B:
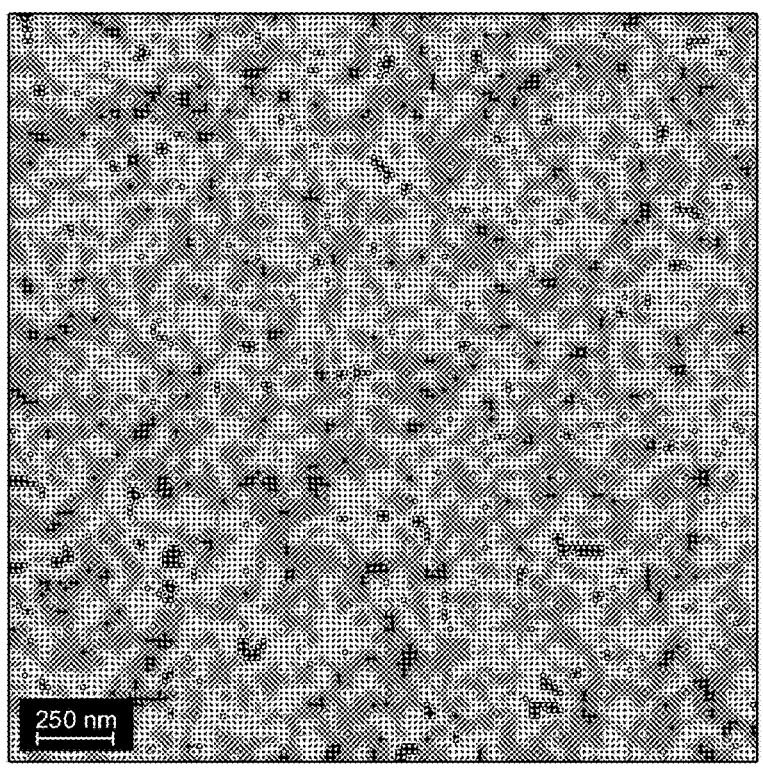
FIG. 14B is a topographical plot of the surface of the resulting nanotube fabric within example 3 of the present disclosure.
Figure 14C:
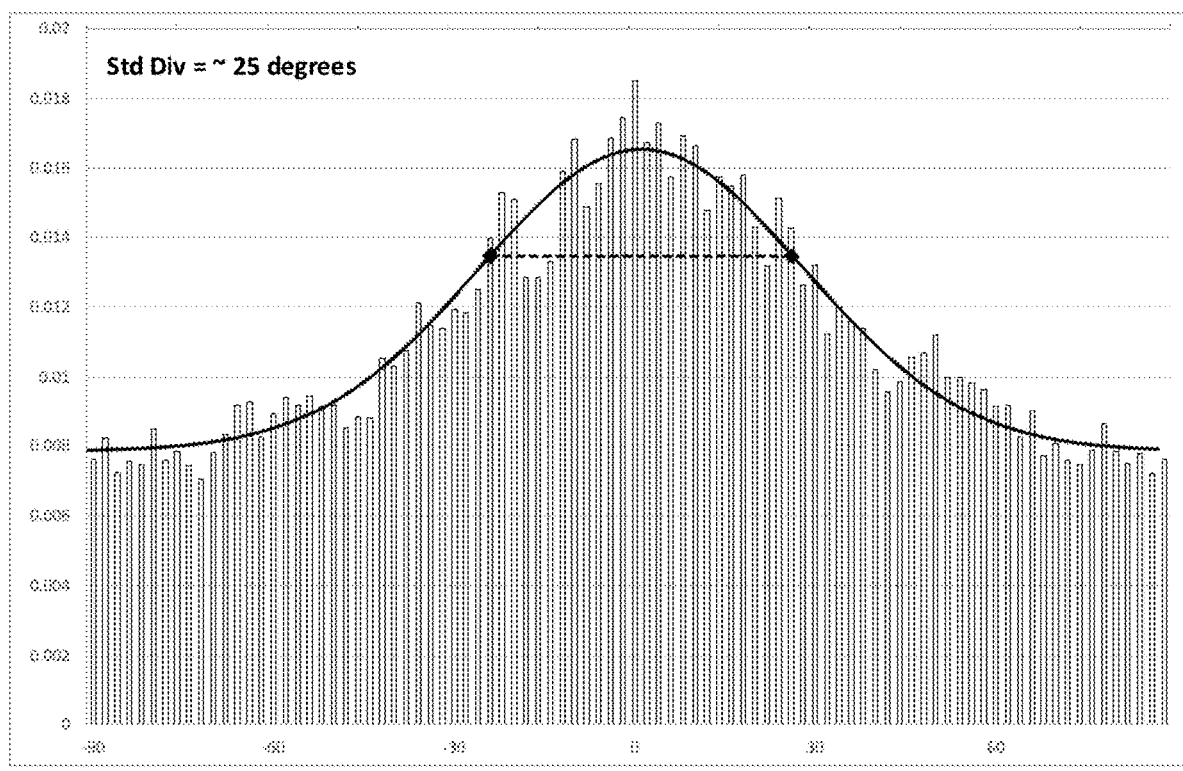
FIG. 14C is a normalized histogram plotting the positional orientation frequency of the nanotube elements within the resulting nanotube fabric within example 3 of the present disclosure.

FIGS. 14A-14C illustrate the surface roughness and degree of rafting within a nanotube fabric produced using the methods of the present disclosure (as described in detail above) in accordance with the parameters of example 3. The nanotube fabric of example 3 was formed by taking a sample of nanotube formulation "X" (formulated as described in detail above), adjusting the nanotube formulation to have an ammonium nitrate ($NH_4NO_3$) concentration level of approximately 1.50 mM (as described in detail with respect to FIGS. 7A-7D above), then performing four spin coating operations of the adjusted nanotube formulation over a silicon wafer (again, as described in detail above) to form a nanotube fabric approximately 20 nm thick. FIG. 14A is an SEM image 1401 illustrating the resulting nanotube fabric, FIG. 14B is a topographical plot 1402 of the surface of the resulting nanotube fabric, and FIG. 14C is a normalized histogram 1403 plotting the positional orientation frequency of the nanotube elements as shown within SEM image 1401. As listed in FIG. 9, the nanotube fabric formed within example 3 has an RMS roughness of 3.04 nm and the standard deviation of the nanotube positional orientation within the fabric was approximately 25° (indicating a moderately low degree of rafting within the fabric). The measurements from this fabric, formed from nanotube formulation "X" with an ammonium nitrate ($NH_4NO_3$) concentration level of approximately 1.50 mM, were used to provide data point 1016 in FIG. 10A.

Example 4

Figure 15A:
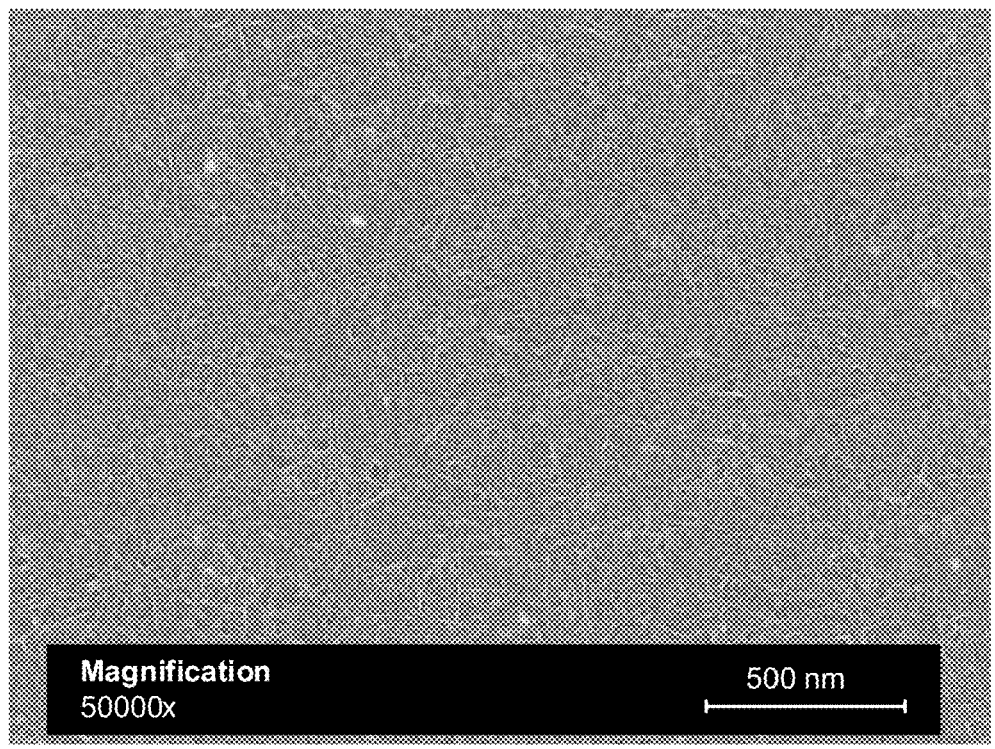
FIG. 15A is an SEM image illustrating the resulting nanotube fabric within example 4 of the present disclosure.
Figure 15B:
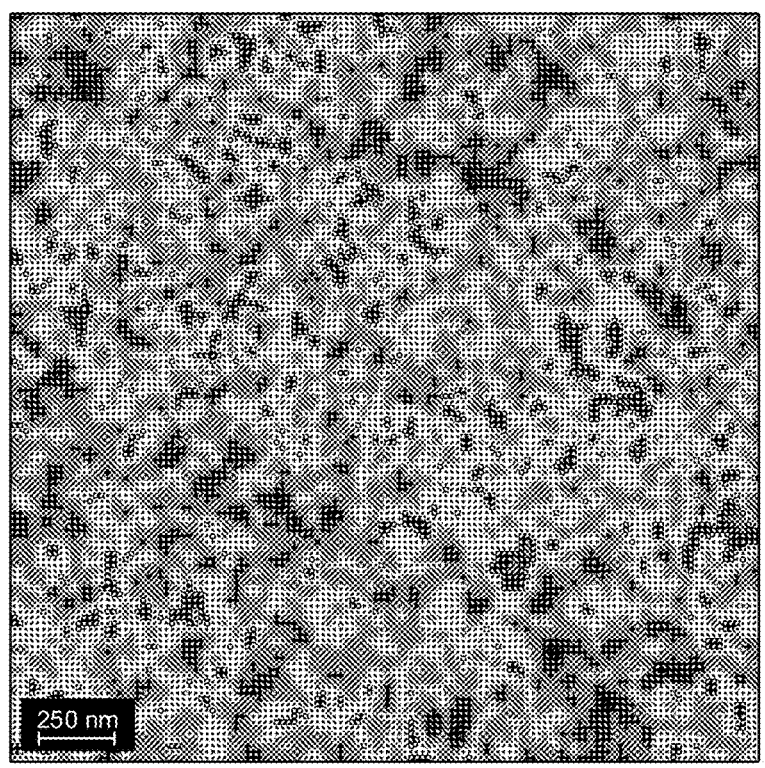
FIG. 15B is a topographical plot of the surface of the resulting nanotube fabric within example 4 of the present disclosure.
Figure 15C:
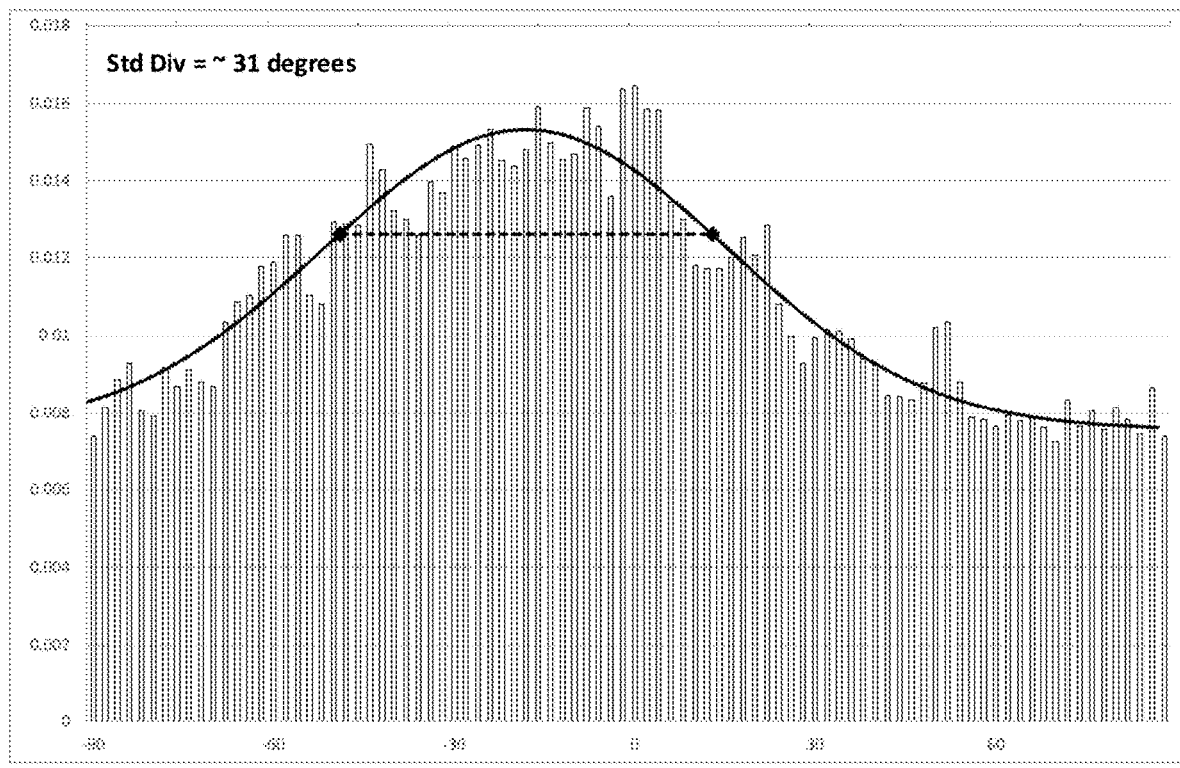
FIG. 15C is a normalized histogram plotting the positional orientation frequency of the nanotube elements within the resulting nanotube fabric within example 4 of the present disclosure.

FIGS. 15A-15C illustrate the surface roughness and degree of rafting within a nanotube fabric produced using the methods of the present disclosure (as described in detail above) in accordance with the parameters of example 4. The nanotube fabric of example 4 was formed by taking a sample of nanotube formulation "X" (formulated as described in detail above), adjusting the nanotube formulation to have an ammonium nitrate ($NH_4NO_3$) concentration level of approximately 7.50 mM (as described in detail with respect to FIGS. 7A-7D above), then performing four spin coating operations of the adjusted nanotube formulation over a silicon wafer (again, as described in detail above) to form a nanotube fabric approximately 20 nm thick. FIG. 15A is an SEM image 1501 illustrating the resulting nanotube fabric, FIG. 15B is a topographical plot 1502 of the surface of the resulting nanotube fabric, and FIG. 15C is a normalized histogram 1503 plotting the positional orientation frequency of the nanotube elements as shown within SEM image 1501. As listed in FIG. 9, the nanotube fabric formed within example 4 has an RMS roughness of 4.10 nm and the standard deviation of the nanotube positional orientation within the fabric was approximately 31° (indicating a low degree of rafting within the fabric). The measurements from this fabric, formed from nanotube formulation "X" with an ammonium nitrate ($NH_4NO_3$) concentration level of approximately 7.50 mM, were used to provide data point 1018 in FIG. 10A.

Example 5

Figure 16A:
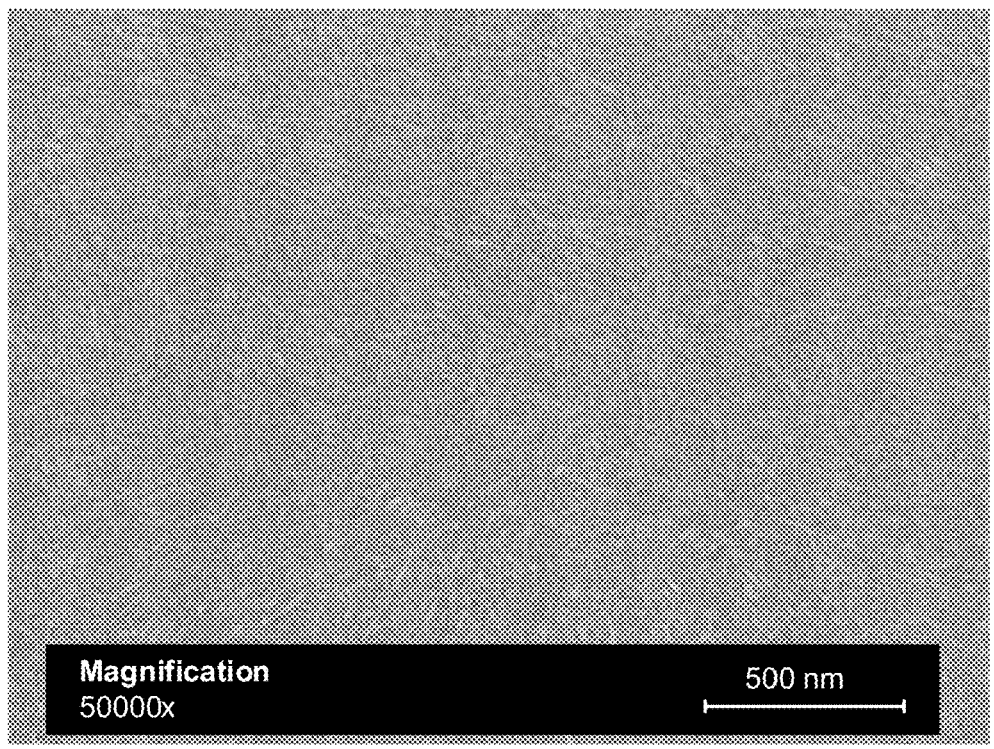
FIG. 16A is an SEM image illustrating the resulting nanotube fabric within example 5 of the present disclosure.
Figure 16B:
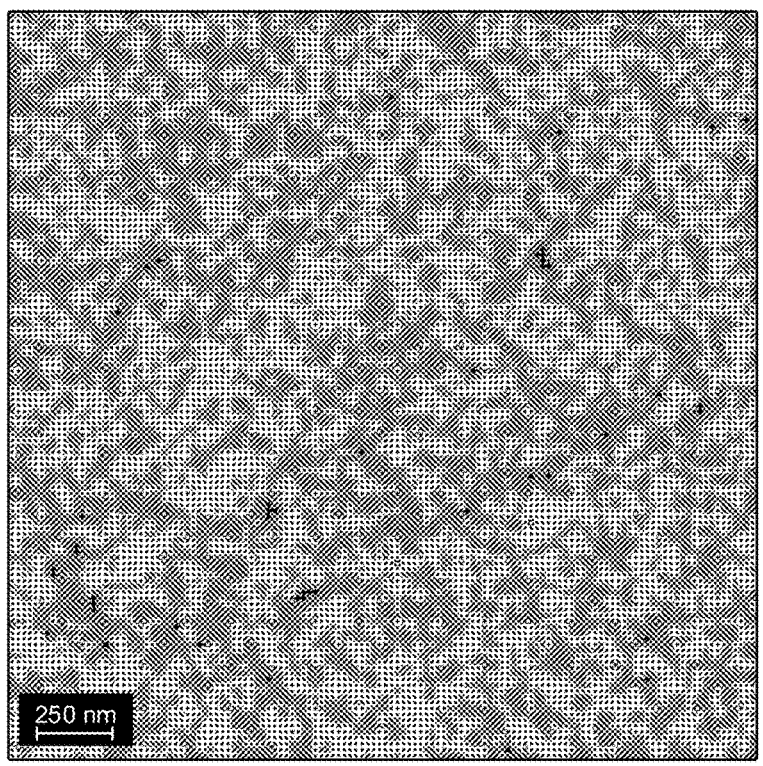
FIG. 16B is a topographical plot of the surface of the resulting nanotube fabric within example 5 of the present disclosure.
Figure 16C:
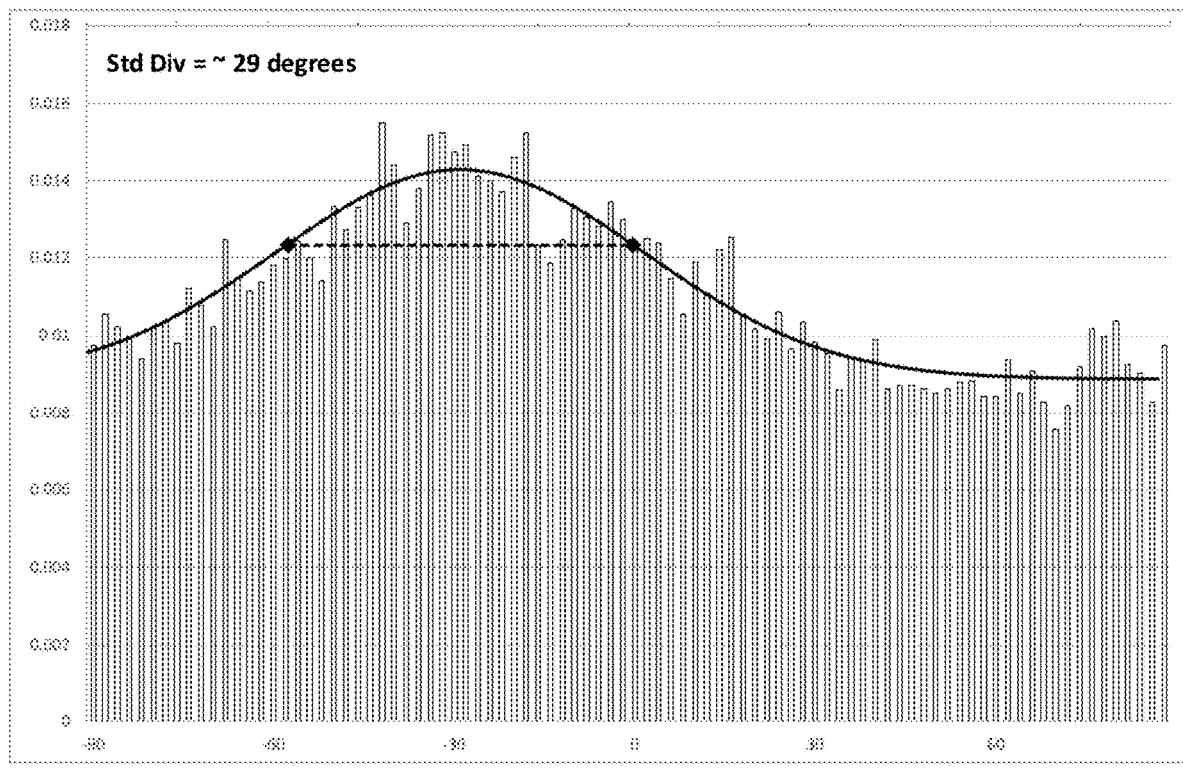
FIG. 16C is a normalized histogram plotting the positional orientation frequency of the nanotube elements within the resulting nanotube fabric within example 5 of the present disclosure.

FIGS. 16A-16C illustrate the surface roughness and degree of rafting within a nanotube fabric produced using the methods of the present disclosure (as described in detail above) in accordance with the parameters of example 5. The nanotube fabric of example 5 was formed by taking a sample of nanotube formulation "X" (formulated as described in detail above), adjusting the nanotube formulation to have a tetramethyl ammonium formate (TMA Fm) concentration level of approximately 0.75 mM (as described in detail with respect to FIGS. 7A-7D above), then performing four spin coating operations of the adjusted nanotube formulation over a silicon wafer (again, as described in detail above) to form a nanotube fabric approximately 20 nm thick. FIG. 16A is an SEM image 1601 illustrating the resulting nanotube fabric, FIG. 16B is a topographical plot 1602 of the surface of the resulting nanotube fabric, and FIG. 16C is a normalized histogram 1603 plotting the positional orientation frequency of the nanotube elements as shown within SEM image 1601. As listed in FIG. 9, the nanotube fabric formed within example 5 has an RMS roughness of 1.95 nm and the standard deviation of the nanotube positional orientation within the fabric was approximately 29° (indicating a moderately low degree of rafting within the fabric). The measurements from this fabric, formed from nanotube formulation "X" with a tetramethyl ammonium formate (TMA Fm) concentration level of approximately 0.75 mM, were used to provide data point 1024 in FIG. 10B.

Example 6

Figure 17A:
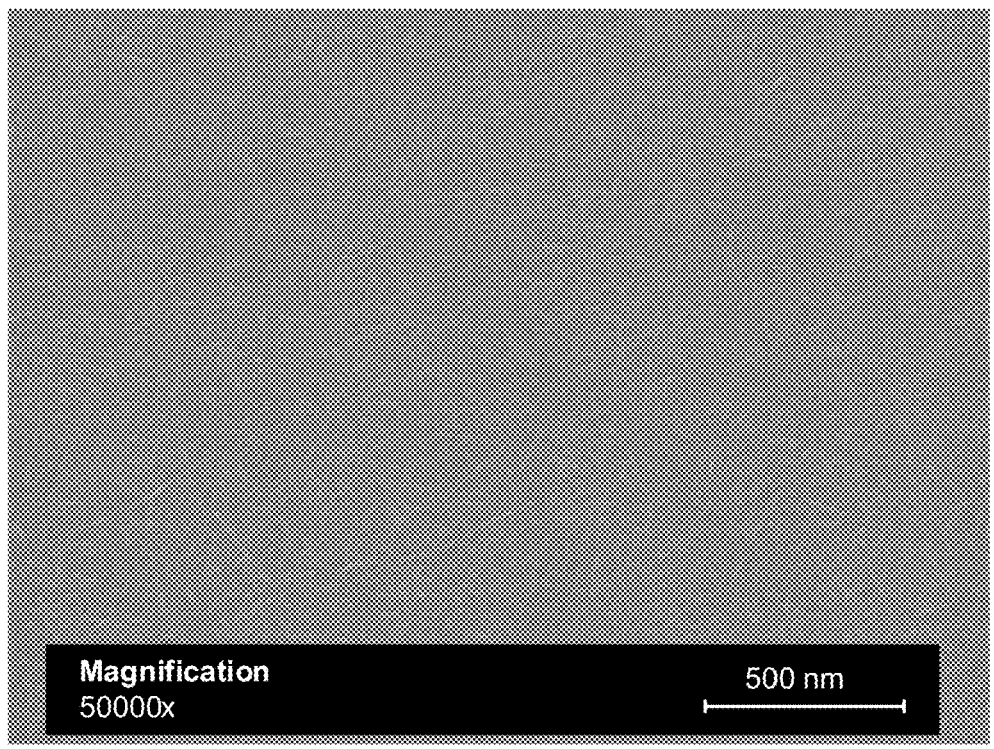
FIG. 17A is an SEM image illustrating the resulting nanotube fabric within example 6 of the present disclosure.
Figure 17B:
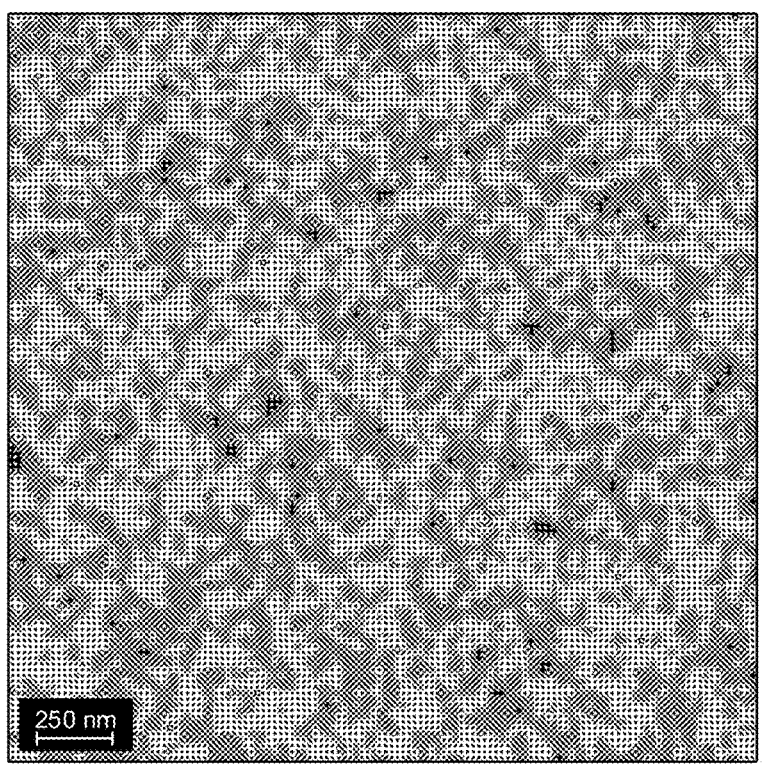
FIG. 17B is a topographical plot of the surface of the resulting nanotube fabric within example 6 of the present disclosure.
Figure 17C:
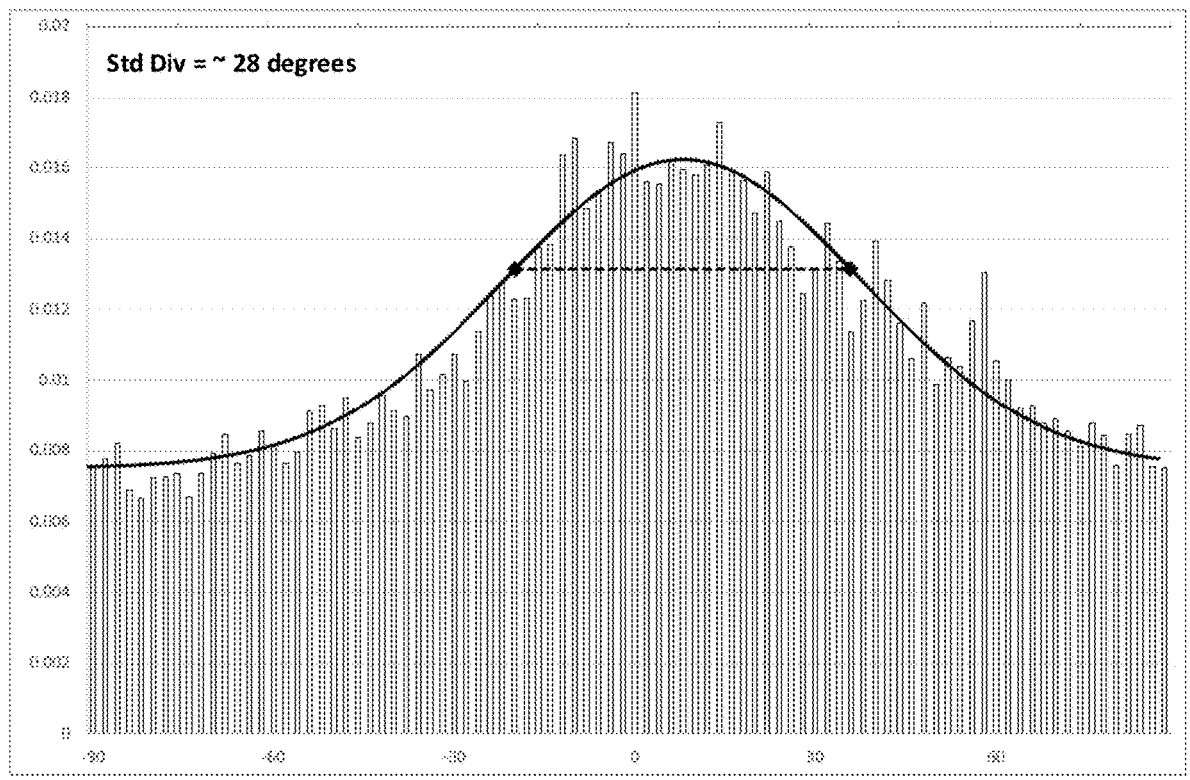
FIG. 17C is a normalized histogram plotting the positional orientation frequency of the nanotube elements within the resulting nanotube fabric within example 6 of the present disclosure.

FIGS. 17A-17C illustrate the surface roughness and degree of rafting within a nanotube fabric produced using the methods of the present disclosure (as described in detail above) in accordance with the parameters of example 6. The nanotube fabric of example 6 was formed by taking a sample of nanotube formulation "X" (formulated as described in detail above), adjusting the nanotube formulation to have a tetramethyl ammonium formate (TMA Fm) concentration level of approximately 1.50 mM (as described in detail with respect to FIGS. 7A-7D above), then performing four spin coating operations of the adjusted nanotube formulation over a silicon wafer (again, as described in detail above) to form a nanotube fabric approximately 20 nm thick. FIG. 17A is an SEM image 1701 illustrating the resulting nanotube fabric, FIG. 17B is a topographical plot 1702 of the surface of the resulting nanotube fabric, and FIG. 17C is a normalized histogram 1703 plotting the positional orientation frequency of the nanotube elements as shown within SEM image 1701. As listed in FIG. 9, the nanotube fabric formed within example 6 has an RMS roughness of 2.22 nm and the standard deviation of the nanotube positional orientation within the fabric was approximately 28° (indicating a moderately low degree of rafting within the fabric). The measurements from this fabric, formed from nanotube formulation "X" with a tetramethyl ammonium formate (TMA Fm) concentration level of approximately 1.50 mM, were used to provide data point 1026 in FIG. 10B.

Example 7

Figure 18A:
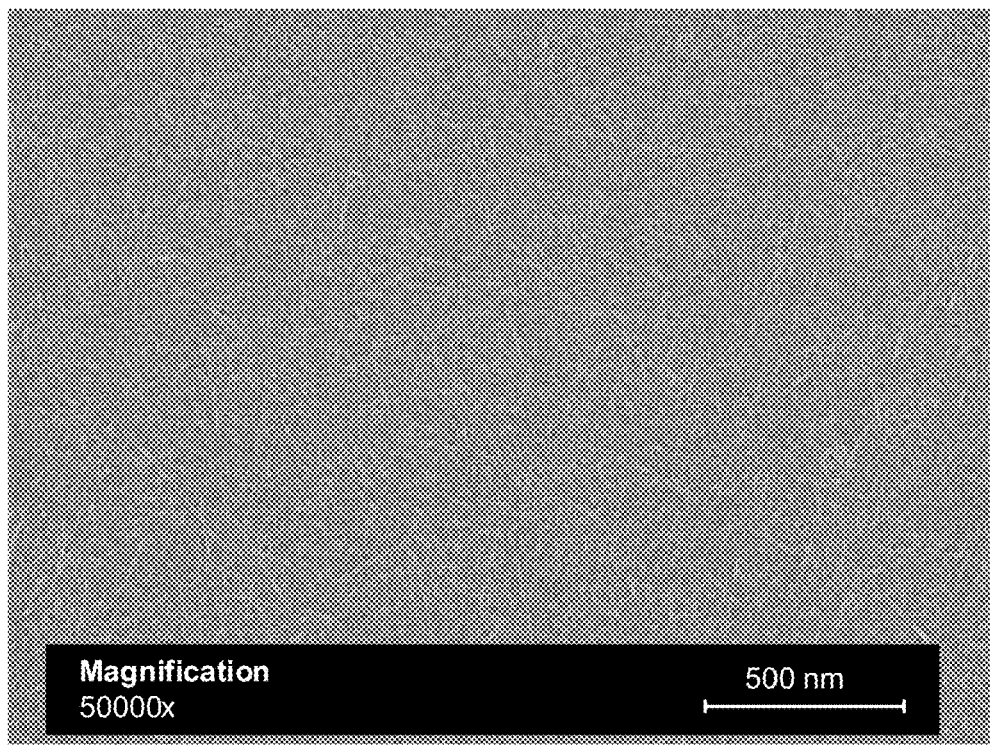
FIG. 18A is an SEM image illustrating the resulting nanotube fabric within example 7 of the present disclosure.
Figure 18B:
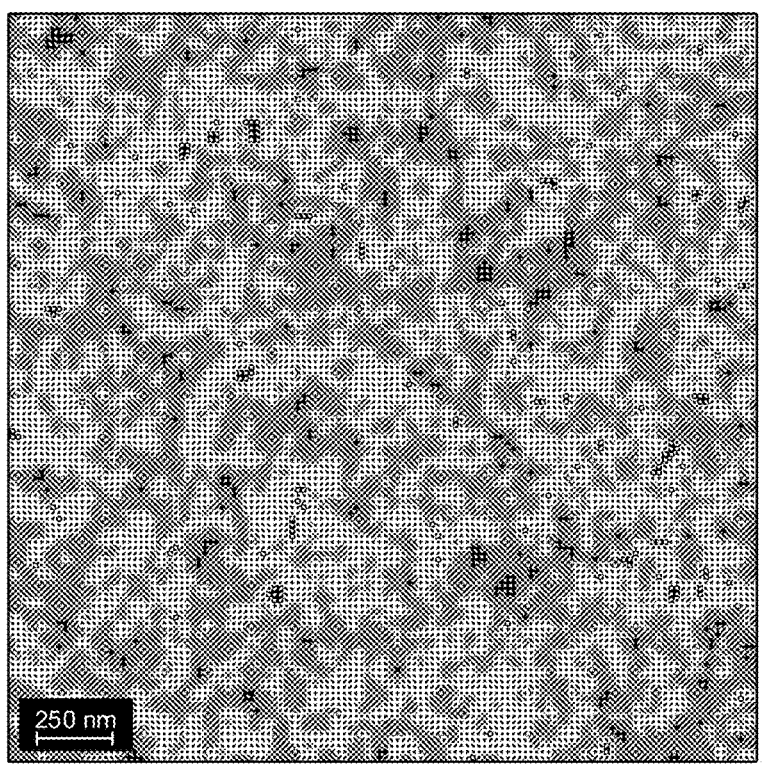
FIG. 18B is a topographical plot of the surface of the resulting nanotube fabric within example 7 of the present disclosure.
Figure 18C:
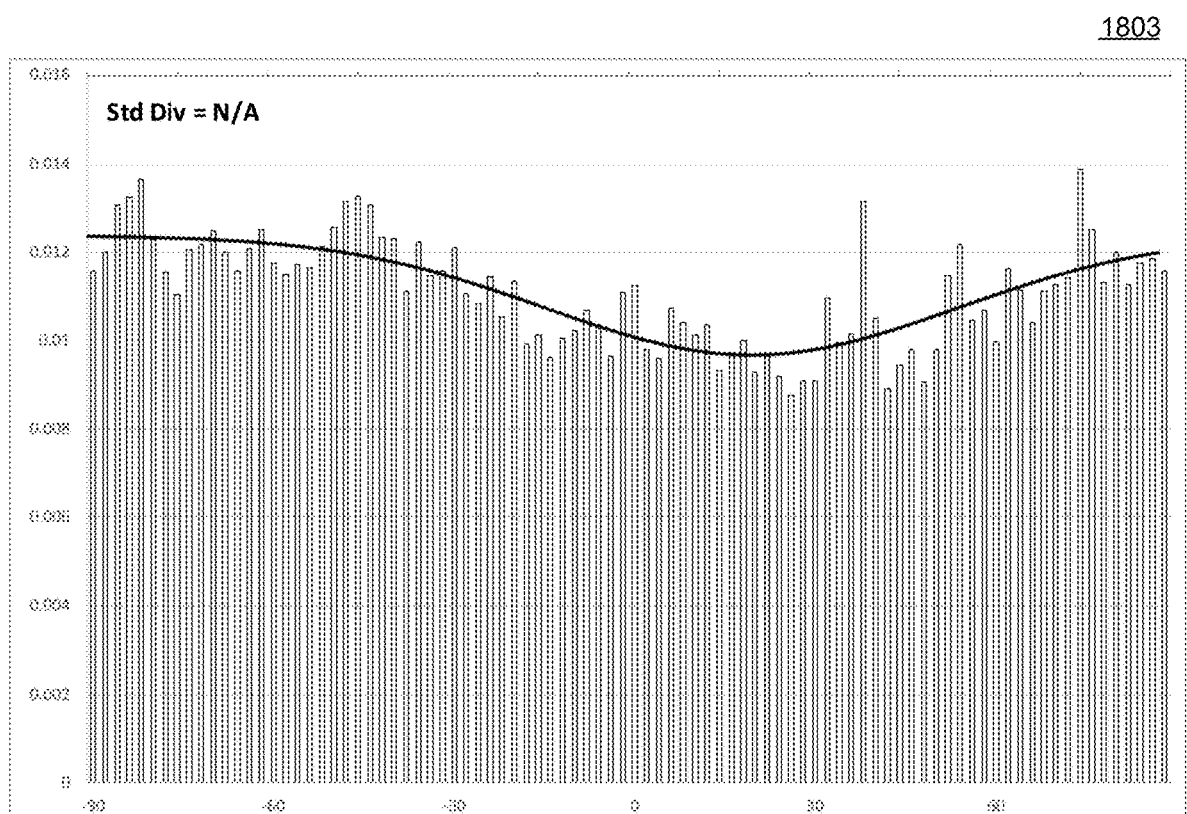
FIG. 18C is a normalized histogram plotting the positional orientation frequency of the nanotube elements within the resulting nanotube fabric within example 7 of the present disclosure.

FIGS. 18A-18C illustrate the surface roughness and degree of rafting within a nanotube fabric produced using the methods of the present disclosure (as described in detail above) in accordance with the parameters of example 7. The nanotube fabric of example 7 was formed by taking a sample of nanotube formulation "X" (formulated as described in detail above), adjusting the nanotube formulation to have a tetramethyl ammonium formate (TMA Fm) concentration level of approximately 7.50 mM (as described in detail with respect to FIGS. 7A-7D above), then performing four spin coating operations of the adjusted nanotube formulation over a silicon wafer (again, as described in detail above) to form a nanotube fabric approximately 20 nm thick. FIG. 18A is an SEM image 1801 illustrating the resulting nanotube fabric, FIG. 18B is a topographical plot 1802 of the surface of the resulting nanotube fabric, and FIG. 18C is a normalized histogram 1803 plotting the positional orientation frequency of the nanotube elements as shown within SEM image 1801. As listed in FIG. 9, the nanotube fabric formed within example 7 has an RMS roughness of 2.61 nm and the standard deviation of the nanotube positional orientation within the fabric was essentially undefined (indicating a essentially no rafting within the fabric). The measurements from this fabric, formed from nanotube formulation "X" with a tetramethyl ammonium formate (TMA Fm) concentration level of approximately 7.50 mM, were used to provide data point 1028 in FIG. 10B.

Example 8

Figure 19A:
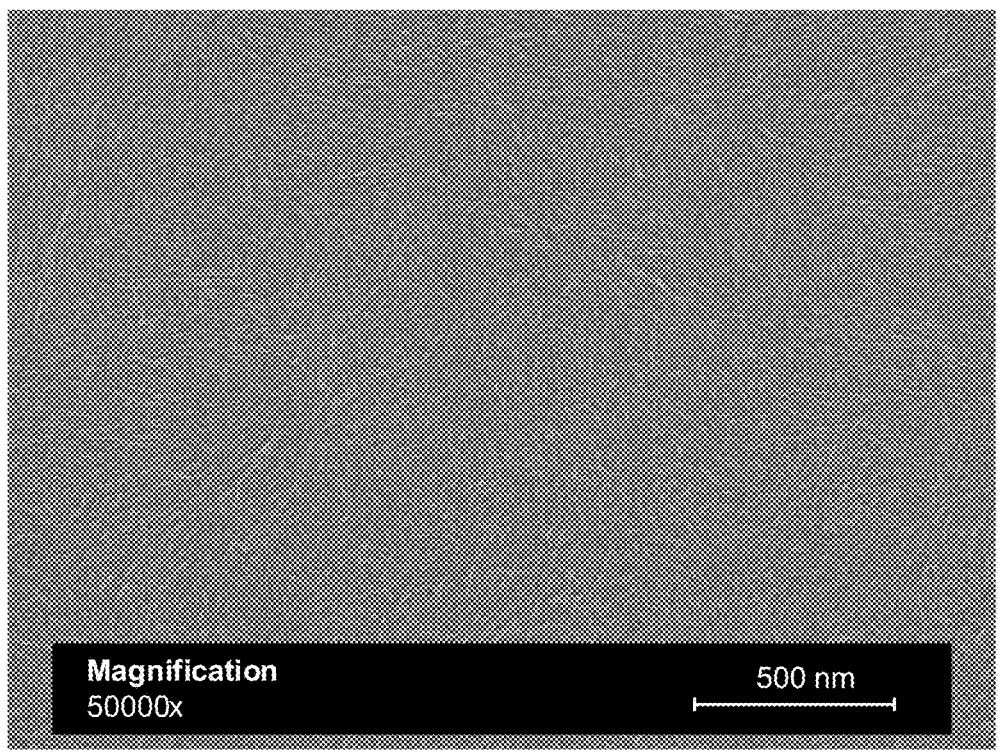
FIG. 19A is an SEM image illustrating the resulting nanotube fabric within example 8 of the present disclosure.
Figure 19B:
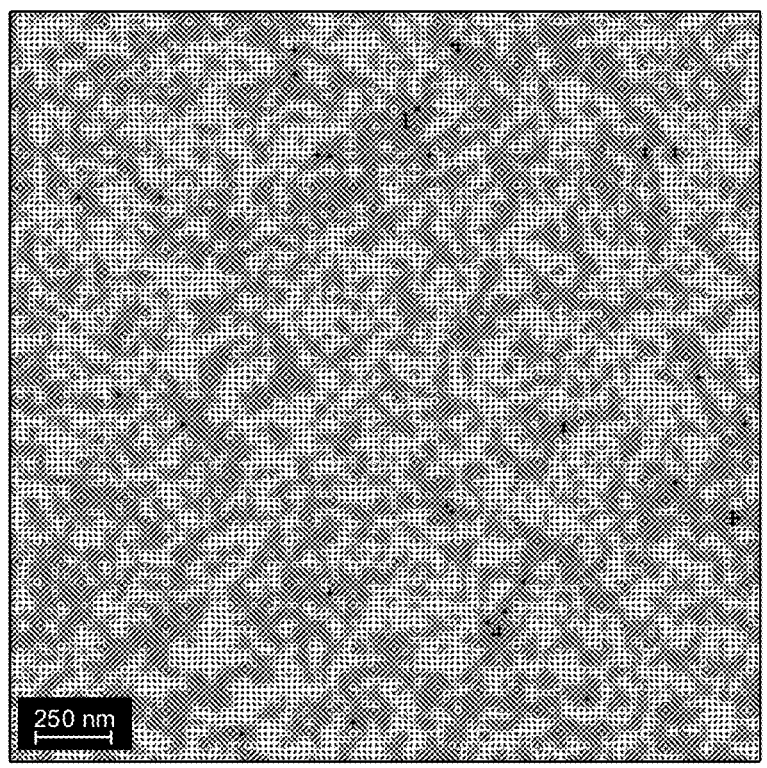
FIG. 19B is a topographical plot of the surface of the resulting nanotube fabric within example 8 of the present disclosure.
Figure 19C:
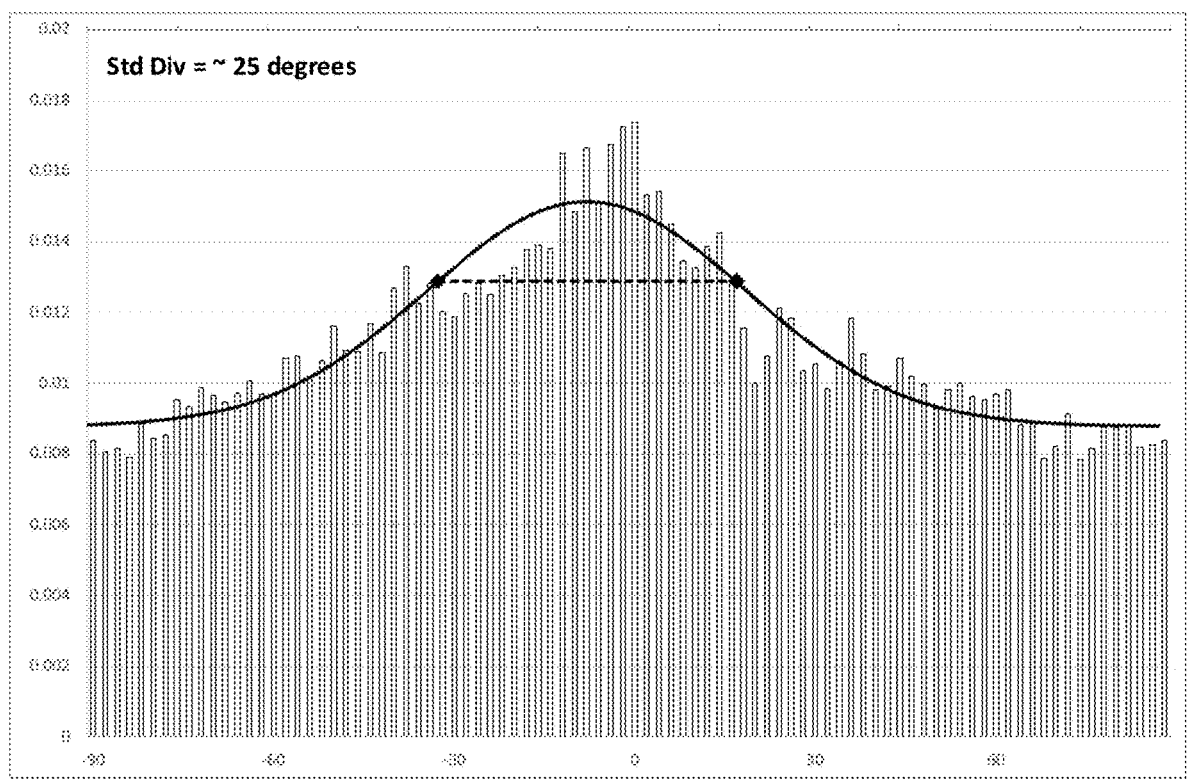
FIG. 19C is a normalized histogram plotting the positional orientation frequency of the nanotube elements within the resulting nanotube fabric within example 8 of the present disclosure.

FIGS. 19A-19C illustrate the surface roughness and degree of rafting within a nanotube fabric produced using the methods of the present disclosure (as described in detail above) in accordance with the parameters of example 8. The nanotube fabric of example 8 was formed by taking a sample of nanotube formulation "Y" (formulated as described in detail above), adjusting the nanotube formulation to have an ionic species concentration level of substantially zero (as described in detail with respect to FIGS. 7A-7D above), then performing three spin coating operations of the adjusted nanotube formulation over a silicon wafer (again, as described in detail above) to form a nanotube fabric approximately 20 nm thick. FIG. 19A is an SEM image 1901 illustrating the resulting nanotube fabric, FIG. 19B is a topographical plot 1902 of the surface of the resulting nanotube fabric, and FIG. 19C is a normalized histogram 1903 plotting the positional orientation frequency of the nanotube elements as shown within SEM image 1901. As listed in FIG. 9, the nanotube fabric formed within example 8 has an RMS roughness of 1.77 nm and the standard deviation of the nanotube positional orientation within the fabric was approximately 25° (indicating a moderate low degree of rafting within the fabric). The measurements from this fabric, formed from nanotube formulation "Y" with essentially no ionic species present within the formulation, were used to provide data point 1032 in FIG. 10C and 1042 in FIG. 10D.

Example 9

Figure 20A:
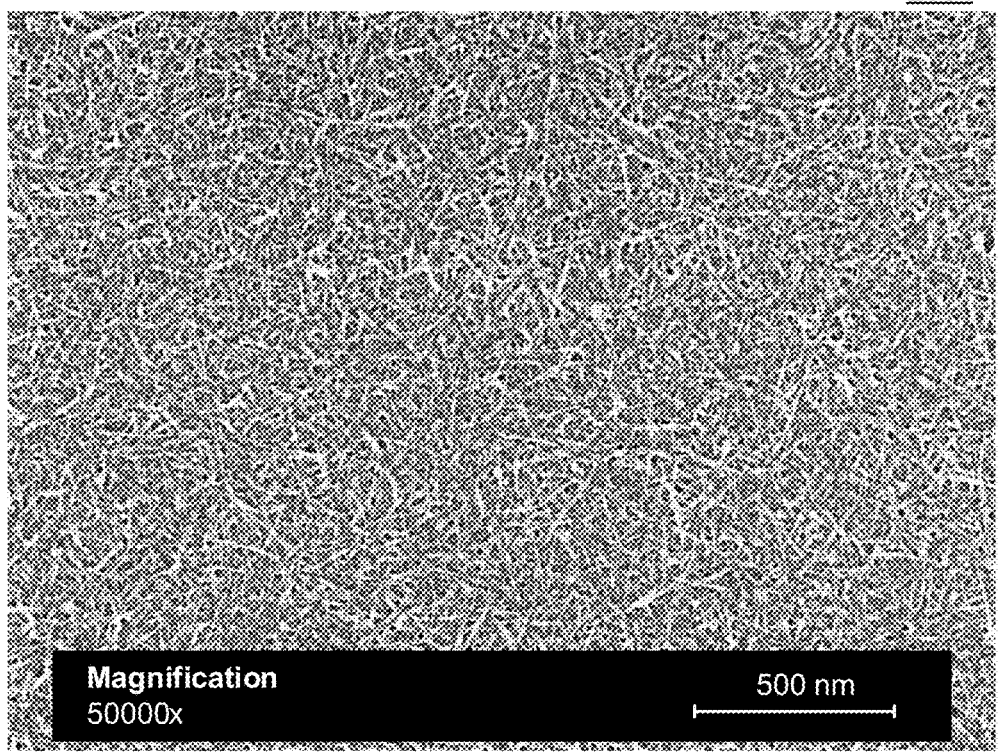
FIG. 20A is an SEM image illustrating the resulting nanotube fabric within example 9 of the present disclosure.
Figure 20B:
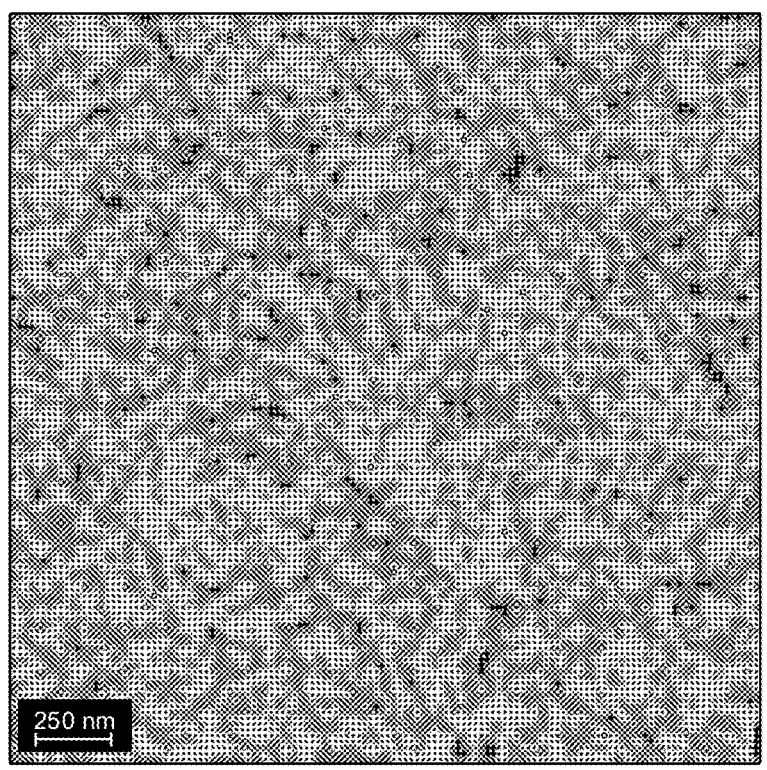
FIG. 20B is a topographical plot of the surface of the resulting nanotube fabric within example 9 of the present disclosure.
Figure 20C:
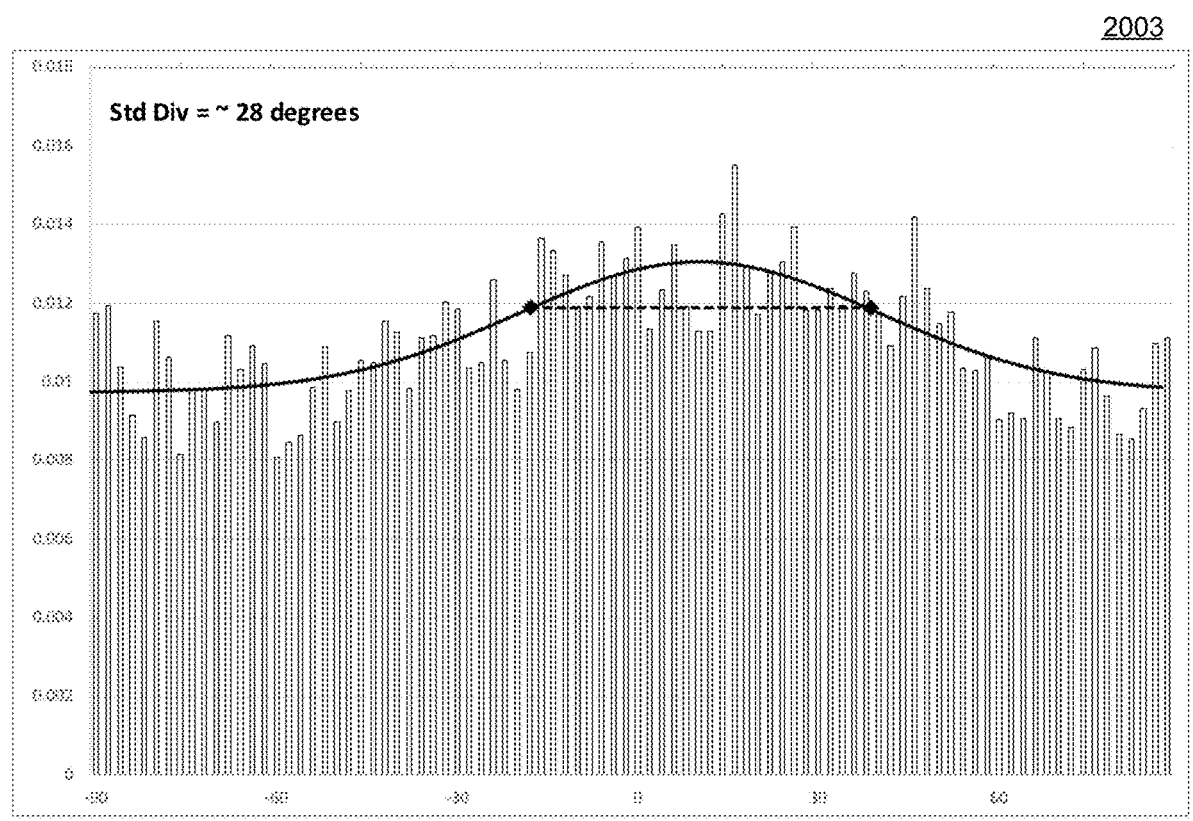
FIG. 20C is a normalized histogram plotting the positional orientation frequency of the nanotube elements within the resulting nanotube fabric within example 9 of the present disclosure.

FIGS. 20A-20C illustrate the surface roughness and degree of rafting within a nanotube fabric produced using the methods of the present disclosure (as described in detail above) in accordance with the parameters of example 9. The nanotube fabric of example 9 was formed by taking a sample of nanotube formulation "Y" (formulated as described in detail above), adjusting the nanotube formulation to have an ammonium nitrate ($NH_4NO_3$) concentration level of approximately 0.71 mM (as described in detail with respect to FIGS. 7A-7D above), then performing three spin coating operations of the adjusted nanotube formulation over a silicon wafer (again, as described in detail above) to form a nanotube fabric approximately 20 nm thick. FIG. 20A is an SEM image 2001 illustrating the resulting nanotube fabric, FIG. 20B is a topographical plot 2002 of the surface of the resulting nanotube fabric, and FIG. 20C is a normalized histogram 2003 plotting the positional orientation frequency of the nanotube elements as shown within SEM image 2001. As listed in FIG. 9, the nanotube fabric formed within example 9 has an RMS roughness of 3.22 nm and the standard deviation of the nanotube positional orientation within the fabric was approximately 28° (indicating a moderately low degree of rafting within the fabric). The measurements from this fabric, formed from nanotube formulation "Y" with an ammonium nitrate ($NH_4NO_3$) concentration level of approximately 0.71 mM, were used to provide data point 1034 in FIG. 10C.

Example 10

Figure 21A:
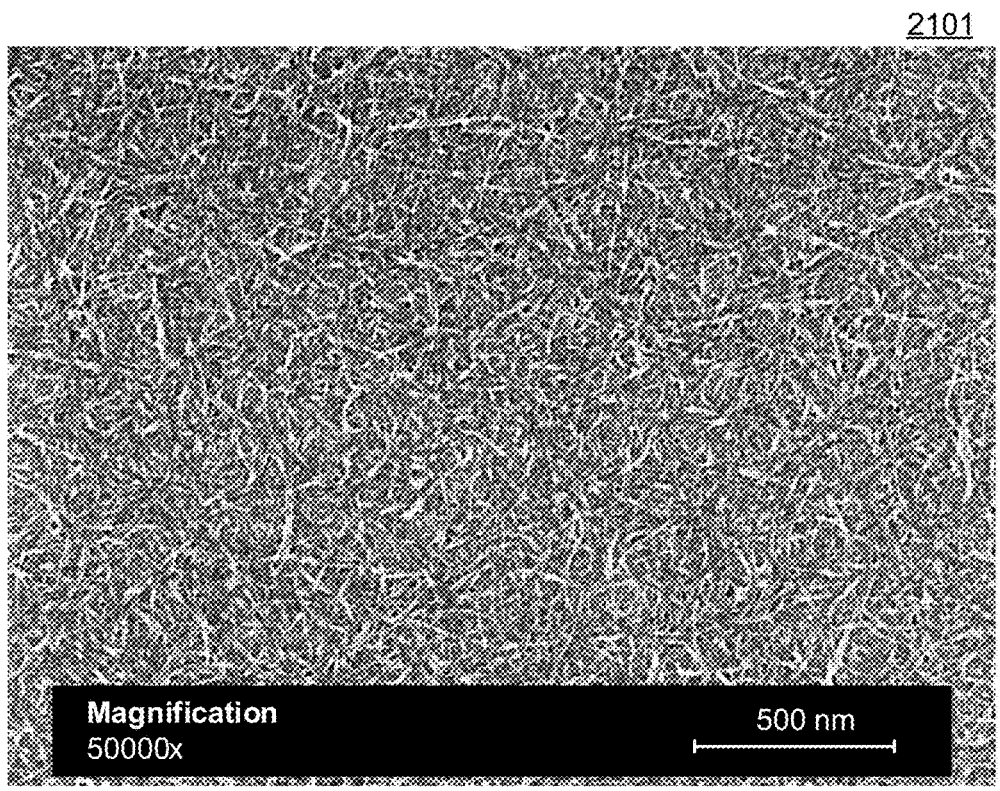
FIG. 21A is an SEM image illustrating the resulting nanotube fabric within example 10 of the present disclosure.
Figure 21B:
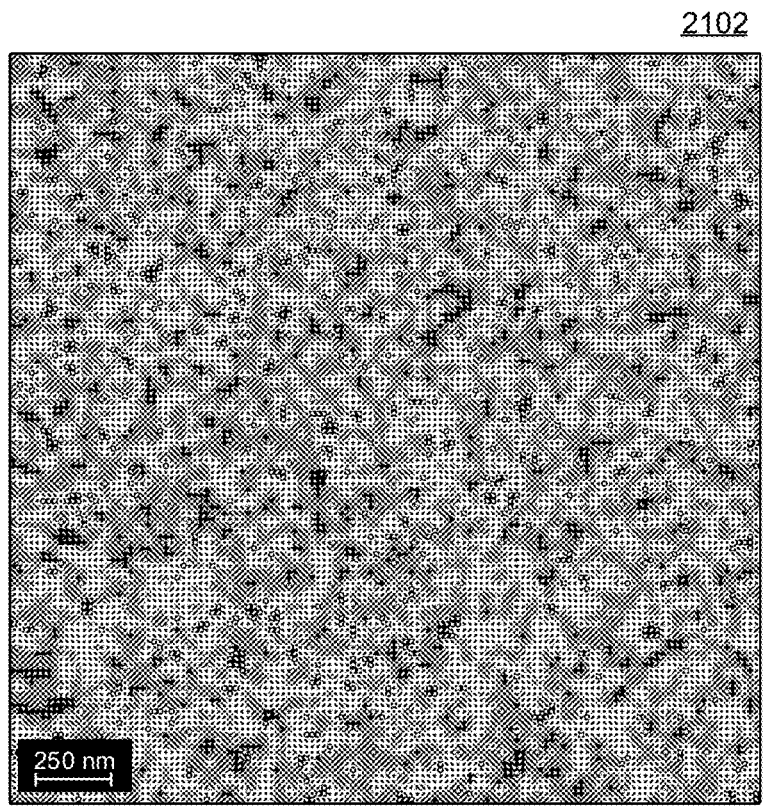
FIG. 21B is a topographical plot of the surface of the resulting nanotube fabric within example 10 of the present disclosure.
Figure 21C:
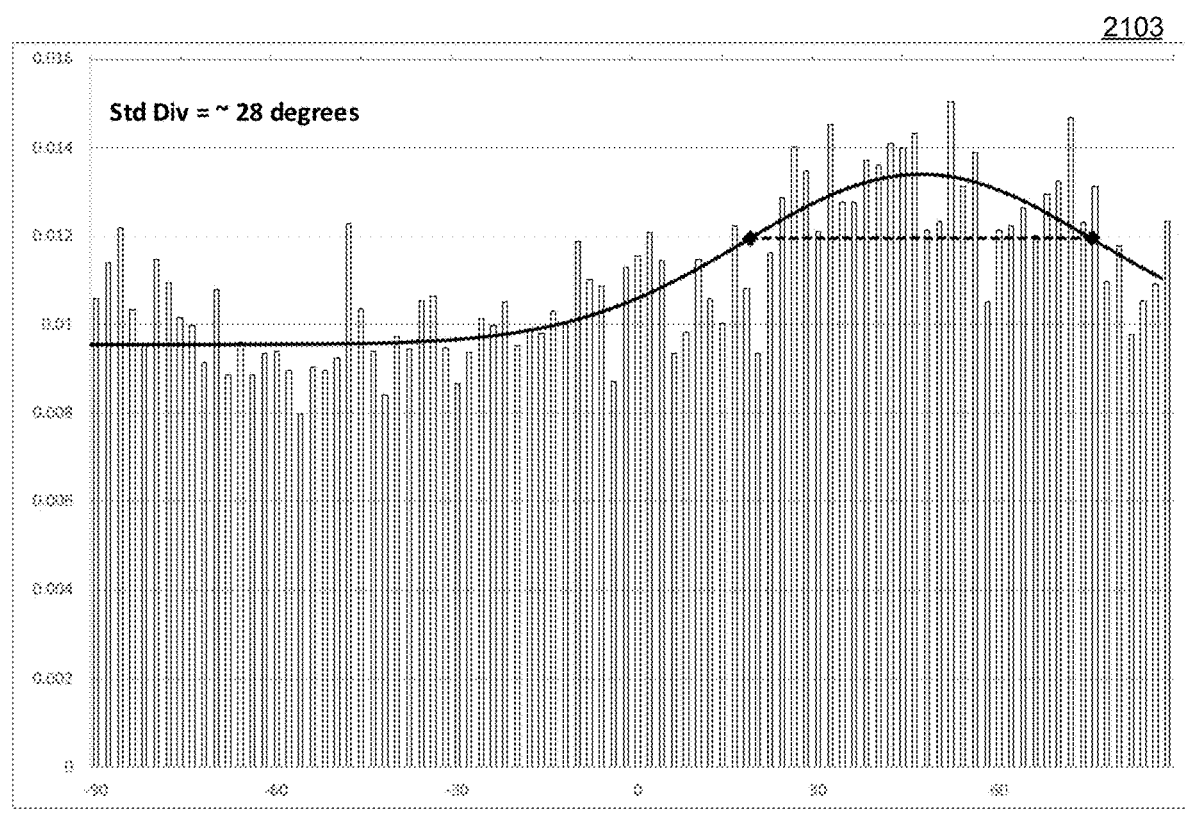
FIG. 21C is a normalized histogram plotting the positional orientation frequency of the nanotube elements within the resulting nanotube fabric within example 10 of the present disclosure.

FIGS. 21A-21C illustrate the surface roughness and degree of rafting within a nanotube fabric produced using the methods of the present disclosure (as described in detail above) in accordance with the parameters of example 10. The nanotube fabric of example 10 was formed by taking a sample of nanotube formulation "Y" (formulated as described in detail above), adjusting the nanotube formulation to have an ammonium nitrate ($NH_4NO_3$) concentration level of approximately 1.43 mM (as described in detail with respect to FIGS. 7A-7D above), then performing three spin coating operations of the adjusted nanotube formulation over a silicon wafer (again, as described in detail above) to form a nanotube fabric approximately 20 nm thick. FIG. 21A is an SEM image 2101 illustrating the resulting nanotube fabric, FIG. 21B is a topographical plot 2102 of the surface of the resulting nanotube fabric, and FIG. 21C is a normalized histogram 2103 plotting the positional orientation frequency of the nanotube elements as shown within SEM image 2101. As listed in FIG. 9, the nanotube fabric formed within example 10 has an RMS roughness of 3.62 nm and the standard deviation of the nanotube positional orientation within the fabric was approximately 28° (indicating a moderately low degree of rafting within the fabric). The measurements from this fabric, formed from nanotube formulation "Y" with an ammonium nitrate ($NH_4NO_3$) concentration level of approximately 1.43 mM, were used to provide data point 1036 in FIG. 10C.

Example 11

Figure 22A:
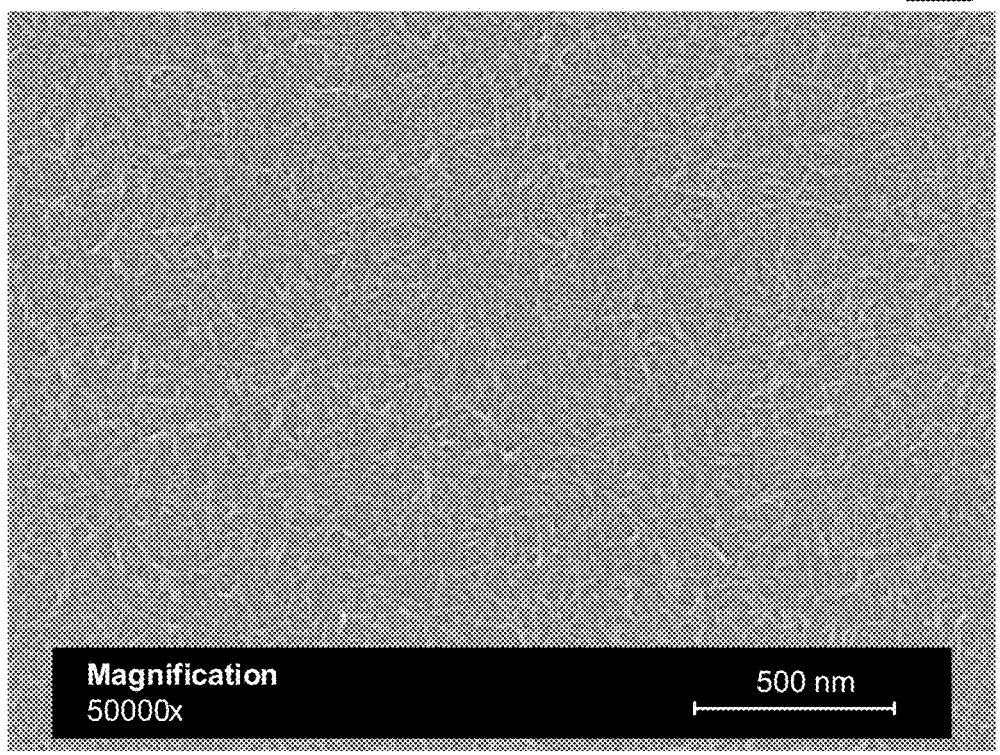
FIG. 22A is an SEM image illustrating the resulting nanotube fabric within example 11 of the present disclosure.
Figure 22B:
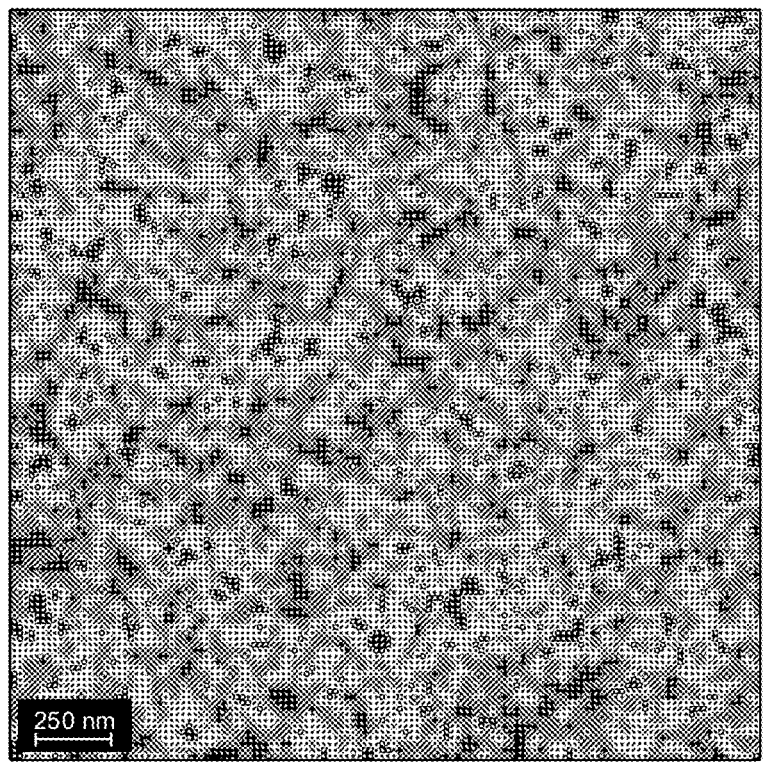
FIG. 22B is a topographical plot of the surface of the resulting nanotube fabric within example 11 of the present disclosure.
Figure 22C:
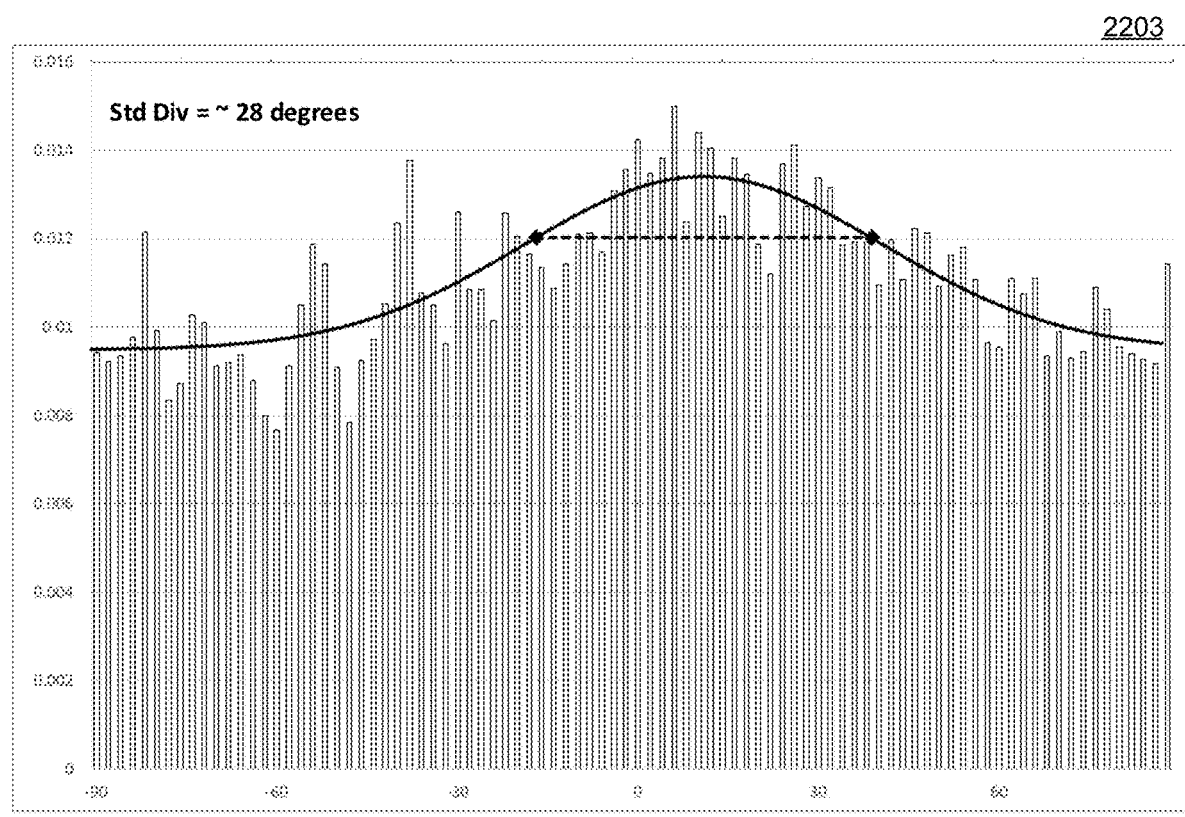
FIG. 22C is a normalized histogram plotting the positional orientation frequency of the nanotube elements within the resulting nanotube fabric within example 11 of the present disclosure.

FIGS. 22A-22C illustrate the surface roughness and degree of rafting within a nanotube fabric produced using the methods of the present disclosure (as described in detail above) in accordance with the parameters of example 11. The nanotube fabric of example 11 was formed by taking a sample of nanotube formulation "Y" (formulated as described in detail above), adjusting the nanotube formulation to have an ammonium nitrate ($NH_4NO_3$) concentration level of approximately 8.14 mM (as described in detail with respect to FIGS. 7A-7D above), then performing three spin coating operations of the adjusted nanotube formulation over a silicon wafer (again, as described in detail above) to form a nanotube fabric approximately 20 nm thick. FIG. 22A is an SEM image 2201 illustrating the resulting nanotube fabric, FIG. 22B is a topographical plot 2202 of the surface of the resulting nanotube fabric, and FIG. 22C is a normalized histogram 2203 plotting the positional orientation frequency of the nanotube elements as shown within SEM image 2201. As listed in FIG. 9, the nanotube fabric formed within example 11 has an RMS roughness of 3.82 nm and the standard deviation of the nanotube positional orientation within the fabric was approximately 28° (indicating a moderately low degree of rafting within the fabric). The measurements from this fabric, formed from nanotube formulation "Y" with an ammonium nitrate ($NH_4NO_3$) concentration level of approximately 8.14 mM, were used to provide data point 1038 in FIG. 10C.

Example 12

Figure 23A:
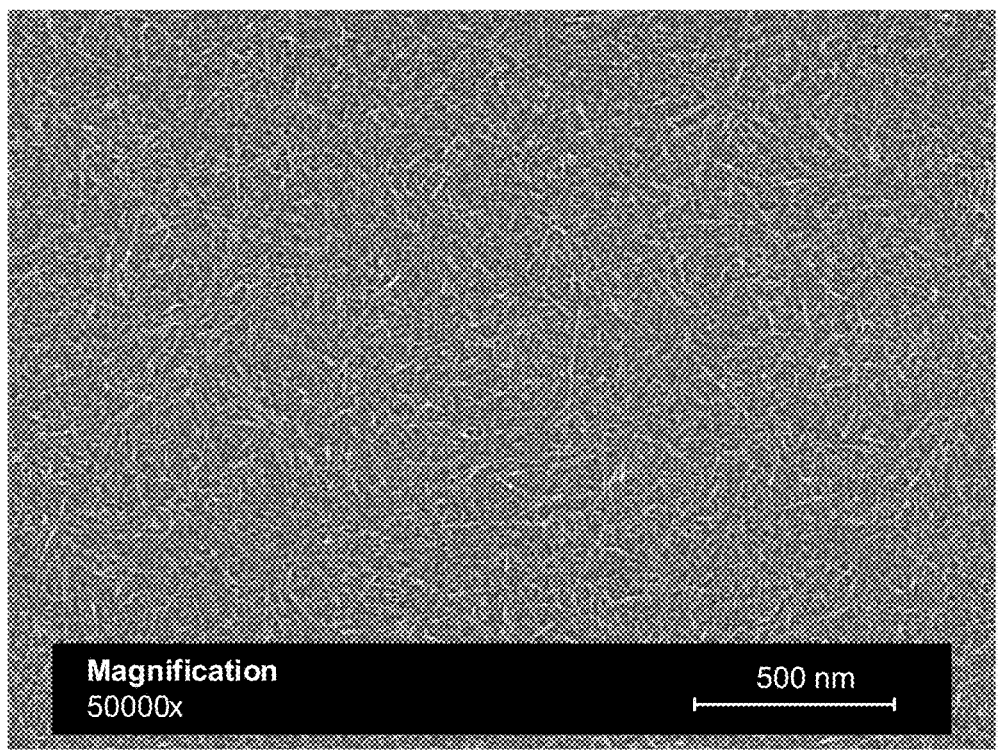
FIG. 23A is an SEM image illustrating the resulting nanotube fabric within example 12 of the present disclosure.
Figure 23B:
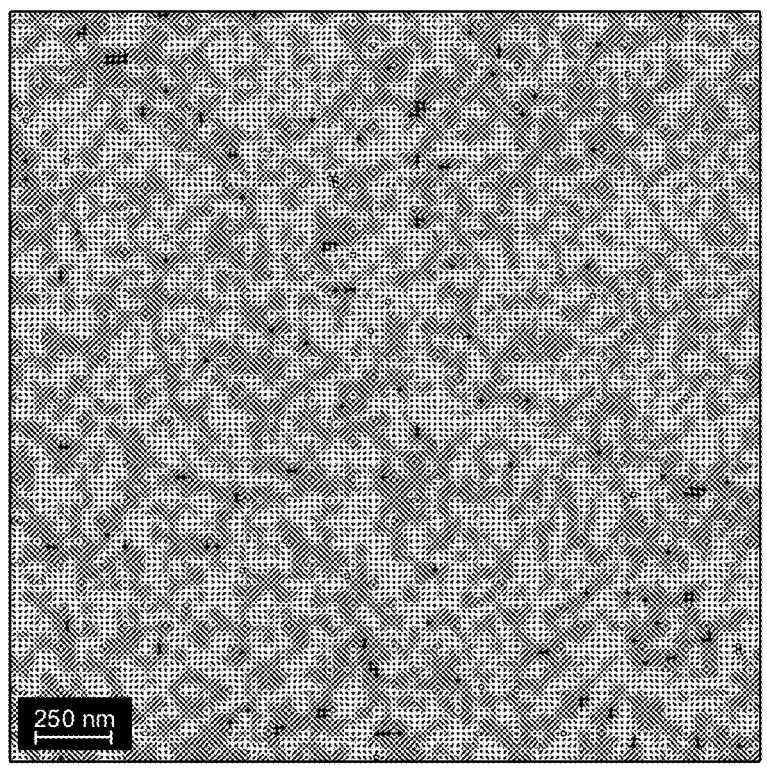
FIG. 23B is a topographical plot of the surface of the resulting nanotube fabric within example 12 of the present disclosure.
Figure 23C:
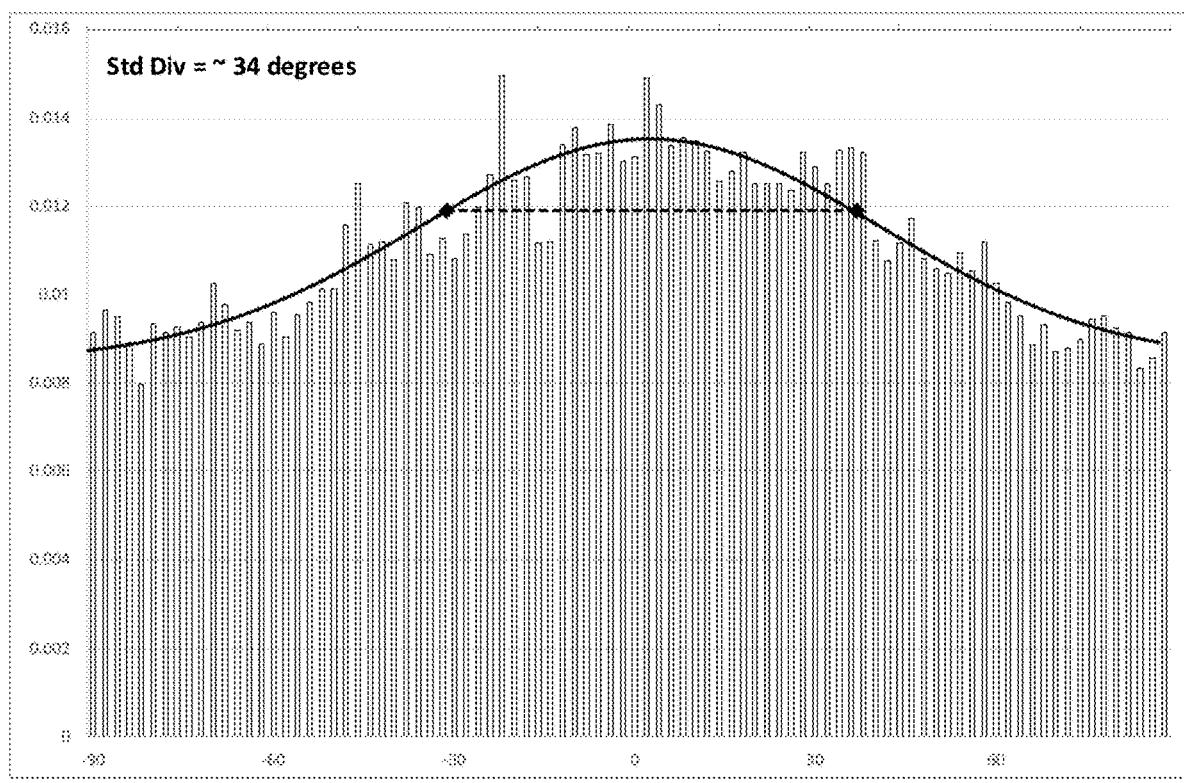
FIG. 23C is a normalized histogram plotting the positional orientation frequency of the nanotube elements within the resulting nanotube fabric within example 12 of the present disclosure.

FIGS. 23A-23C illustrate the surface roughness and degree of rafting within a nanotube fabric produced using the methods of the present disclosure (as described in detail above) in accordance with the parameters of example 12. The nanotube fabric of example 12 was formed by taking a sample of nanotube formulation "Y" (formulated as described in detail above), adjusting the nanotube formulation to have a tetramethyl ammonium formate (TMA Fm) concentration level of approximately 0.75 mM (as described in detail with respect to FIGS. 7A-7D above), then performing three spin coating operations of the adjusted nanotube formulation over a silicon wafer (again, as described in detail above) to form a nanotube fabric approximately 20 nm thick. FIG. 23A is an SEM image 2301 illustrating the resulting nanotube fabric, FIG. 23B is a topographical plot 2302 of the surface of the resulting nanotube fabric, and FIG. 23C is a normalized histogram 2303 plotting the positional orientation frequency of the nanotube elements as shown within SEM image 2301. As listed in FIG. 9, the nanotube fabric formed within example 12 has an RMS roughness of 2.33 nm and the standard deviation of the nanotube positional orientation within the fabric was approximately 34° (indicating a low degree of rafting within the fabric). The measurements from this fabric, formed from nanotube formulation "Y" with a tetramethyl ammonium formate (TMA Fm) concentration level of approximately 0.75 mM, were used to provide data point 1044 in FIG. 10D.

Example 13

Figure 24A:
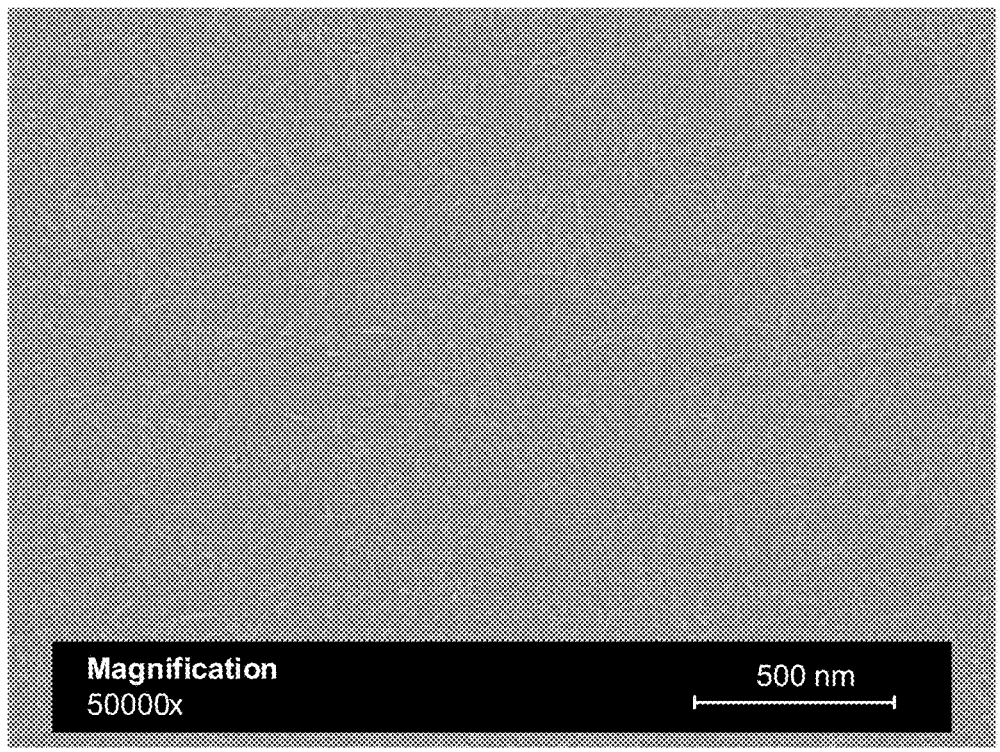
FIG. 24A is an SEM image illustrating the resulting nanotube fabric within example 13 of the present disclosure.
Figure 24B:
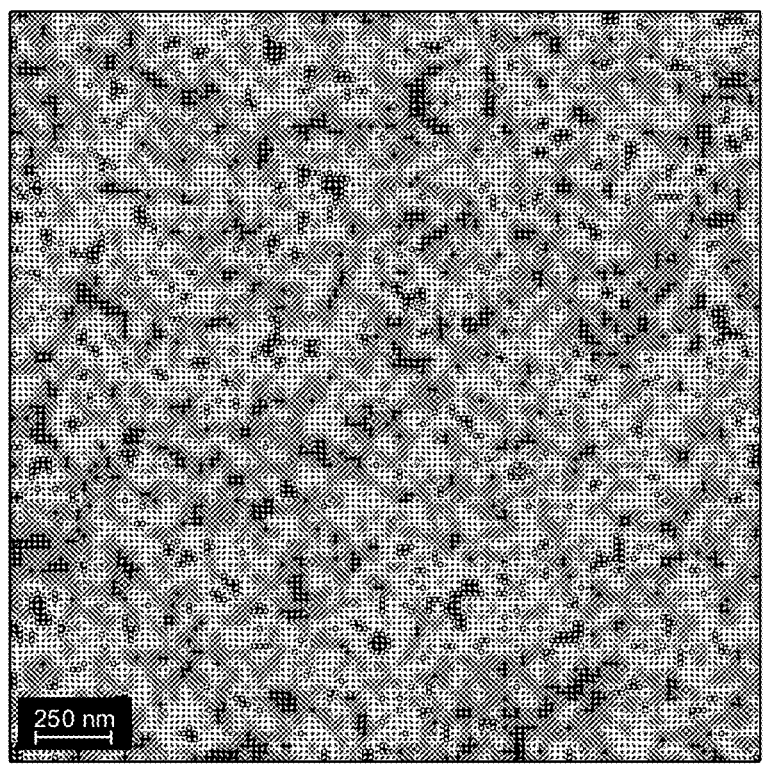
FIG. 24B is a topographical plot of the surface of the resulting nanotube fabric within example 13 of the present disclosure.
Figure 24C:
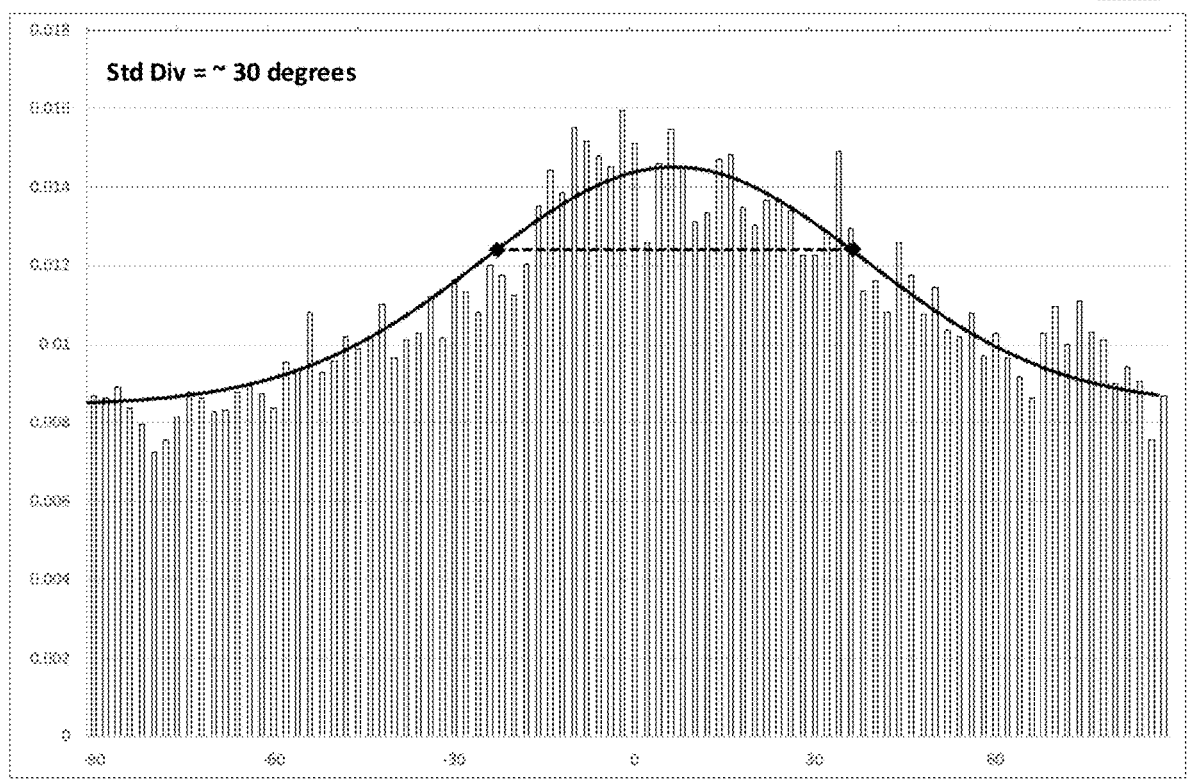
FIG. 24C is a normalized histogram plotting the positional orientation frequency of the nanotube elements within the resulting nanotube fabric within example 13 of the present disclosure.

FIGS. 24A-24C illustrate the surface roughness and degree of rafting within a nanotube fabric produced using the methods of the present disclosure (as described in detail above) in accordance with the parameters of example 13. The nanotube fabric of example 13 was formed by taking a sample of nanotube formulation "Y" (formulated as described in detail above), adjusting the nanotube formulation to have a tetramethyl ammonium formate (TMA Fm) concentration level of approximately 1.50 mM (as described in detail with respect to FIGS. 7A-7D above), then performing three spin coating operations of the adjusted nanotube formulation over a silicon wafer (again, as described in detail above) to form a nanotube fabric approximately 20 nm thick. FIG. 24A is an SEM image 2401 illustrating the resulting nanotube fabric, FIG. 24B is a topographical plot 2402 of the surface of the resulting nanotube fabric, and FIG. 24C is a normalized histogram 2403 plotting the positional orientation frequency of the nanotube elements as shown within SEM image 2401. As listed in FIG. 9, the nanotube fabric formed within example 13 has an RMS roughness of 2.50 nm and the standard deviation of the nanotube positional orientation within the fabric was approximately 30° (indicating a low degree of rafting within the fabric). The measurements from this fabric, formed from nanotube formulation "Y" with a tetramethyl ammonium formate (TMA Fm) concentration level of approximately 1.50 mM, were used to provide data point 1046 in FIG. 10D.

Example 14

Figure 25A:
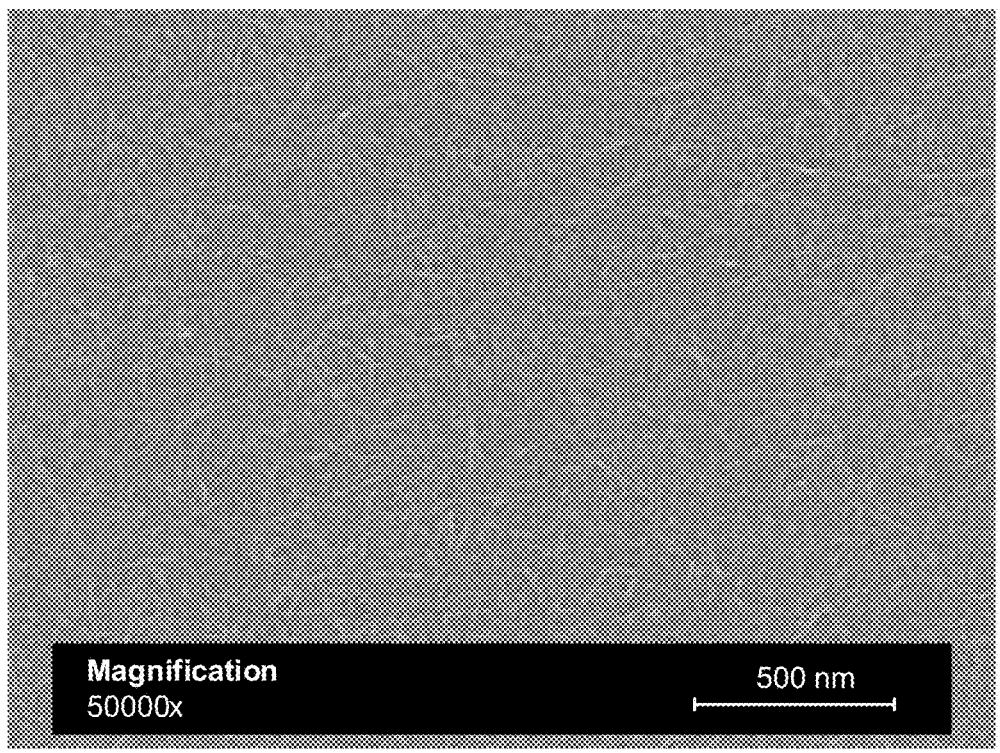
FIG. 25A is an SEM image illustrating the resulting nanotube fabric within example 14 of the present disclosure.
Figure 25B:
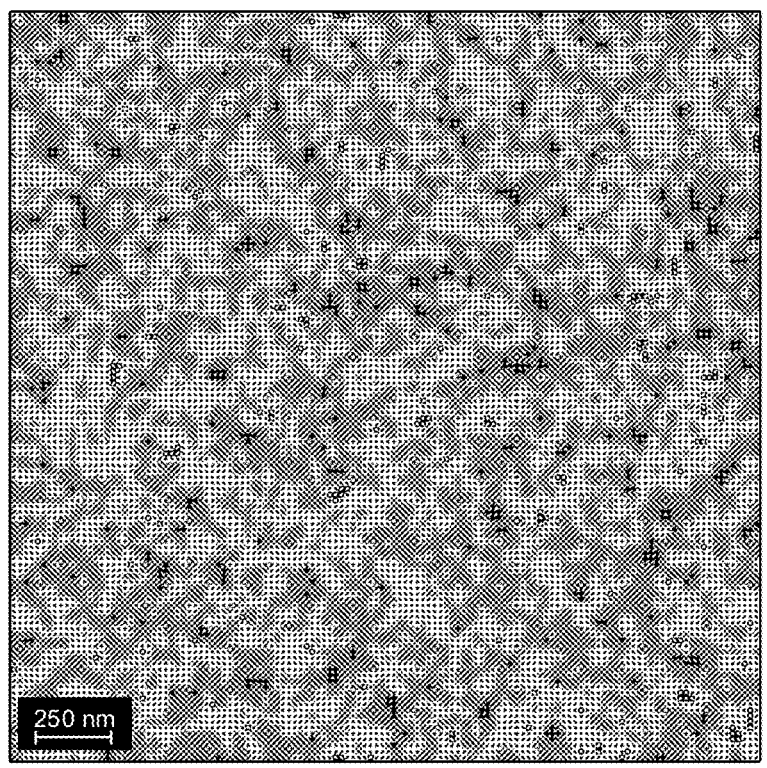
FIG. 25B is a topographical plot of the surface of the resulting nanotube fabric within example 14 of the present disclosure.
Figure 25C:
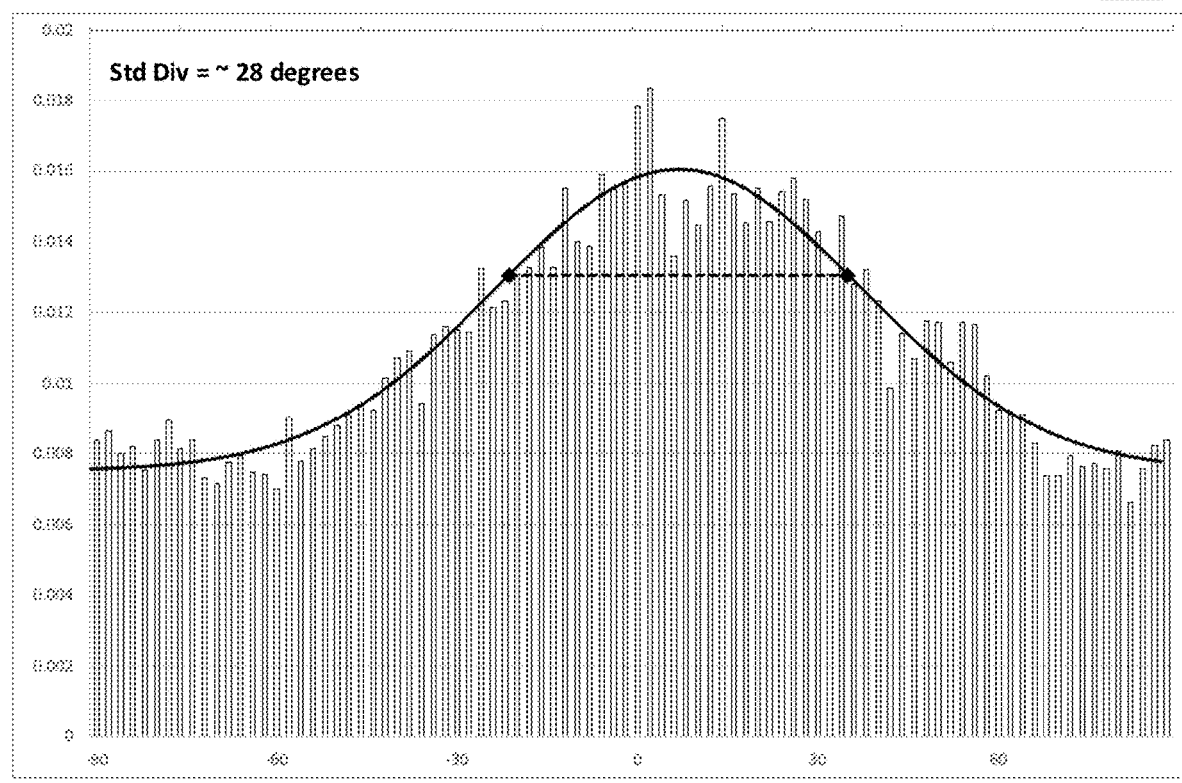
FIG. 25C is a normalized histogram plotting the positional orientation frequency of the nanotube elements within the resulting nanotube fabric within example 14 of the present disclosure.

FIGS. 25A-25C illustrate the surface roughness and degree of rafting within a nanotube fabric produced using the methods of the present disclosure (as described in detail above) in accordance with the parameters of example 14. The nanotube fabric of example 14 was formed by taking a sample of nanotube formulation "Y" (formulated as described in detail above), adjusting the nanotube formulation to have a tetramethyl ammonium formate (TMA Fm) concentration level of approximately 7.50 mM (as described in detail with respect to FIGS. 7A-7D above), then performing three spin coating operations of the adjusted nanotube formulation over a silicon wafer (again, as described in detail above) to form a nanotube fabric approximately 20 nm thick. FIG. 25A is an SEM image 2501 illustrating the resulting nanotube fabric, FIG. 25B is a topographical plot 2502 of the surface of the resulting nanotube fabric, and FIG. 25C is a normalized histogram 2503 plotting the positional orientation frequency of the nanotube elements as shown within SEM image 2501. As listed in FIG. 9, the nanotube fabric formed within example 14 has an RMS roughness of 2.78 nm and the standard deviation of the nanotube positional orientation within the fabric was approximately 28° (indicating a moderately low degree of rafting within the fabric). The measurements from this fabric, formed from nanotube formulation "Y" with a tetramethyl ammonium formate (TMA Fm) concentration level of approximately 7.50 mM, were used to provide data point 1048 in FIG. 10D.

Although the present invention has been described in relation to particular embodiments thereof, many other variations and modifications and other uses will become apparent to those skilled in the art. It is preferred, therefore, that the present invention not be limited by the specific disclosure herein, but rather be defined by the appended claims; and that these claims will encompass modifications of and improvements to what has been described.

The invention claimed is:

1. A method for characterizing a nanotube formulation, comprising:
    preparing a nanotube formulation, said nanotube formulation having at least one preselected parameter;
    selecting at least one ionic species and a plurality of test concentration levels for said at least one selected ionic species;
    generating a plurality of nanotube application solutions from said nanotube formulation, said plurality of nanotube application solutions including said at least one preselected parameter;
    adjusting said plurality of nanotube application solutions to form a plurality of adjusted nanotube application solutions, wherein each of said plurality of adjusted nanotube application solutions includes said selected ionic species at one of said test concentrations levels;
    depositing said plurality of adjusted nanotube application solutions to form a plurality of nanotube fabrics, each of said nanotube fabrics associated with one of said plurality of test concentration levels;
    measuring at least one of the surface roughness and the degree of rafting within each of said plurality of nanotube fabrics to realize at least one test measurement for each of said test concentration levels; and
    using said test measurements and said test concentration levels to realize a nanotube formulation roughness curve.

2. The method of claim 1 further comprising defining a utilization range of concentration levels for said at least one selected ionic species.

3. The method of claim 2 wherein said utilization range corresponds to desired characteristics within a nanotube fabric formed said nanotube formulation.

4. The method of claim 3 wherein said desired characteristics include at least one of surface roughness and degree of rafting.

5. The method of claim 4 wherein said desired characteristics include a surface roughness less than a preselected threshold value.

6. The method of claim 4 wherein said desired characteristics include a degree of rafting less than a preselected threshold value.

7. The method of claim 1 wherein said at least one preselected parameter includes at least one of nanotube length, nanotube length distribution, degree of nanotube straightness, nanotube wall type, nanotube chirality, and nanotube functionalization.

8. The method of claim 7 wherein said nanotube wall type is one of singled walled, double-walled, multi-walled, or a preselected mixture thereof.

9. The method of claim 1 wherein said nanotube formulation includes carbon nanotubes.

10. The method of claim 1 wherein said at least one ionic species is selected from the list consisting of ammonium salts, nitrate salts, ammonium nitrate salts, ammonium formate, ammonium acetate, ammonium carbonate, ammonium bicarbonate, ionic organic species, ionic polymers, and inorganic salts.

11. The method of claim 1 where said at least one ionic species includes a cation component selected from the list consisting of ammonium, tetraalkylammoniums, acids of primary aliphatic amines, acids of secondary aliphatic amines, acids of tertiary aliphatic amines, acids of cyclic amines, cyclic aromatic quaternary amines, and phosphorus-based ions.

12. The method of claim 1 where said at least one ionic species includes a anion component selected from the list consisting of soluble organic acid bases, simple soluble aliphatic carboxylic acids, complex organic acids, nitrate, and phosphate.

13. The method of claim 1 wherein said nanotube formulation is a purified nanotube application solution comprising a volume of nanotubes suspended within a liquid medium.

14. The method of claim 13 wherein said liquid medium is one of an aqueous solution, a sulfuric acid solution, and a nitric acid solution.

15. The method of claim 13 wherein said nanotube formulation is purified using at least one of a cross-flow filtration (CFF) process, a vacuum filtration process, sonication, a depth filter process, centrifugation, treatments of certain chemicals, and combinations thereof.

16. The method of claim 1 wherein said plurality of adjusted nanotube application solutions are deposited via a spin coating operations.

17. The method of claim 1 wherein the number of test concentration levels is one of 2, 3, 4, 5, 10, 15, 20, 50, and 100.

18. A method for controlling a surface roughness of a nanotube fabric, comprising:
    determining at least one of an acceptable surface roughness threshold and an acceptable degree of rafting threshold of said nanotube fabric;
    preparing a nanotube formulation;
    performing the method according to claim 1 to obtain a nanotube formulation roughness curve;
    adjusting the ionic species concentration level of said nanotube formulation by using said nanotube formulation roughness curve for at least one of a surface roughness and a degree of rafting of said nanotube fabric to be less than said at least one of the acceptable roughness threshold and the acceptable degree of rafting threshold of said nanotube fabric; and
    generating a nanotube application solution from said adjusted nanotube formulation.

19. A method for producing a nanotube fabric having at least one of preselected surface roughness and a preselected degree of rafting, comprising
    preparing a nanotube formulation;
    performing the method according to claim 1 to obtain a nanotube formulation roughness curve;
    adjusting the ionic species concentration level of said nanotube formulation by using said nanotube formulation roughness curve to realize said at least one of the preselected surface roughness and the preselected degree of rafting;
    generating a nanotube application solution from said adjusted nanotube formulation; and
    depositing said nanotube solution to form a nanotube fabric.

20. The method of claim 1 wherein the measuring includes measuring the surface roughness, and the nanotube formulation roughness curve is realized with respect to the surface roughness within a range of 1.5 nm or more and 4.5 nm or less.

* * * * *